(12) United States Patent
Shimomura et al.

(10) Patent No.: US 10,043,913 B2
(45) Date of Patent: Aug. 7, 2018

(54) SEMICONDUCTOR FILM, SEMICONDUCTOR DEVICE, DISPLAY DEVICE, MODULE, AND ELECTRONIC DEVICE

(71) Applicant: Semiconductor Energy Laboratory Co., Ltd., Atsugi-shi, Kanagawa-ken (JP)

(72) Inventors: Akihisa Shimomura, Kanagawa (JP); Yuhei Sato, Kanagawa (JP); Yasumasa Yamane, Kanagawa (JP); Shunpei Yamazaki, Tokyo (JP); Kenichi Okazaki, Tochigi (JP); Chiho Kawanabe, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 465 days.

(21) Appl. No.: 14/660,000

(22) Filed: Mar. 17, 2015

(65) Prior Publication Data

US 2015/0318359 A1    Nov. 5, 2015

(30) Foreign Application Priority Data

Apr. 30, 2014  (JP) .............................. 2014-093494
Sep. 9, 2014  (JP) .............................. 2014-183288
(Continued)

(51) Int. Cl.
*H01B 1/08*    (2006.01)
*H01L 27/00*    (2006.01)
(Continued)

(52) U.S. Cl.
CPC ........... *H01L 29/7869* (2013.01); *H01B 1/08* (2013.01); *H01L 27/1225* (2013.01)

(58) Field of Classification Search
CPC .......... H01B 1/00; H01B 1/08; H01L 27/1225; H01L 29/7869
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Ide et al "Structural relaxation in amorphous oxide semiconductor, a—In—Ga—Zn—O", Journal of Applied Physics III, 073513 (2012).*
(Continued)

*Primary Examiner* — Mark Kopec
(74) *Attorney, Agent, or Firm* — Fish & Richardson P.C.

(57) ABSTRACT

A semiconductor device with favorable electrical characteristics is provided. In an oxide semiconductor film, a plurality of electron diffraction patterns are observed in such a manner that a surface over which the oxide semiconductor film is formed is irradiated with an electron beam having a probe diameter whose half-width is 1 nm while the position of the film and the position of the electron beam are relatively moved. The electron diffraction patterns include 50 or more electron diffraction patterns observed in different areas. The sum of the percentage of first electron diffraction patterns and the percentage of second electron diffraction patterns accounts for 100%. The first electron diffraction patterns account for 50% or more. The first electron diffraction pattern includes observation points that are not symmetry or observation points disposed in a circular pattern.

(Continued)

The second electron diffraction pattern includes observation points corresponding to the vertices of a hexagon.

16 Claims, 68 Drawing Sheets

(30) Foreign Application Priority Data

Oct. 7, 2014 (JP) .................................. 2014-206218
Feb. 23, 2015 (JP) .................................. 2015-033086

(51) Int. Cl.
*H01L 29/00* (2006.01)
*H01L 29/786* (2006.01)
*H01L 27/12* (2006.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,202,365 B2 * | 6/2012 | Umeda | C30B 1/02 117/7 |
| 8,241,949 B2 | 8/2012 | Miyanaga | |
| 8,377,744 B2 | 2/2013 | Yamazaki et al. | |
| 8,410,002 B2 | 4/2013 | Yamazaki et al. | |
| 8,633,480 B2 | 1/2014 | Yamazaki et al. | |
| 8,941,114 B2 | 1/2015 | Yamazaki et al. | |
| 9,559,174 B2 * | 1/2017 | Shimomura | H01L 29/24 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0008638 A1 | 1/2009 | Kang et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0189153 A1 | 7/2009 | Iwasaki et al. | |
| 2009/0278122 A1 | 11/2009 | Hosono et al. | |
| 2009/0280600 A1 | 11/2009 | Hosono et al. | |
| 2010/0051949 A1 | 3/2010 | Yamazaki et al. | |
| 2010/0065840 A1 | 3/2010 | Yamazaki et al. | |
| 2010/0065844 A1 | 3/2010 | Tokunaga | |
| 2010/0072467 A1 | 3/2010 | Yamazaki et al. | |
| 2010/0092800 A1 | 4/2010 | Itagaki et al. | |
| 2010/0102312 A1 | 4/2010 | Yamazaki et al. | |
| 2010/0109002 A1 | 5/2010 | Itagaki et al. | |
| 2011/0062433 A1 | 3/2011 | Yamazaki | |
| 2011/0109351 A1 | 5/2011 | Yamazaki et al. | |
| 2011/0175081 A1 | 7/2011 | Goyal et al. | |
| 2014/0070211 A1 | 3/2014 | Iwasaki et al. | |
| 2014/0124776 A1 | 5/2014 | Takahashi et al. | |
| 2014/0183527 A1 | 7/2014 | Yamazaki et al. | |
| 2014/0284596 A1 | 9/2014 | Yamazaki et al. | |
| 2014/0284597 A1 | 9/2014 | Shimomura et al. | |
| 2014/0339560 A1 | 11/2014 | Yamazaki et al. | |
| 2014/0374743 A1 | 12/2014 | Yamazaki | |
| 2015/0001533 A1 | 1/2015 | Kuwabara et al. | |
| 2015/0243738 A1 | 8/2015 | Shimomura et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| JP | 2000-150900 A | 5/2000 |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Yamzaki.T et al., "Structural Analysis of InGaZnO I : Influence of TEM Sample Preparation and Observation", Extended Abstracts of the 61th JSAP Spring Meeting, Mar. 17, 2014, pp. 21-066.

Funaki.M et al., "Structural analysis of InGaZnO II :Crystal Structure Analysis in Nano Region", Extended Abstract of the 61th JSAP Spring Meeting, Mar. 17, 2014, pp. 21-067.

Funaki.M et al., "Structural analysis of InGaZnO III:Crystal Structure Analysis of CAAC-InGaZnO Thin Film", Extended Abstract of the 61th JSAP Spring Meeting, Mar. 17, 2014, pp. 21-068.

Akutsu.K et al., "Structural analysis of InGaZnO IV:Nanocrystalline structure evaluation using digital image analysis", Extended Abstract of the 61th JSAP Spring Meeting, Mar. 17, 2014, pp. 21-069.

Yano.M et al., "Investigation of Electron Beam Induced Effects on Nano Crystalline Oxide Semiconductor Deposited by Sputtering (1)", Extended Abstract of the 61th JSAP Spring Meeting, Mar. 17, 2014, pp. 21-070.

Dairiki.K et al., "Investigation of Electron Beam Induced Effects on Nano Crystalline Oxide Semiconductor Deposited by Sputtering (2)", Extended Abstract of the 61th JSAP Spring Meeting, Mar. 17, 2014, pp. 21-071.

Yamazaki.S, "CAAC-OS (Oxide Semiconductor) and Its Applications", Extended Abstract of the 61th JSAP Spring Meeting, Mar. 17, 2014, pp. SS-05.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, Or Al; B: Mg, Mn, Fe, Ni, Cu,Or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemisty, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of The Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probe using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a $Zn4s$ conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceeding of the 16th International Display Workshops, 2009, pp. 689-692.
Son.K et al., "42.4L: Late-News Paper: 4 Inch QVGA AMOLED Driven by the Threshold Voltage Controlled Amorphous GiZo ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IgZo Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02: Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Masaki Nakamura et al.; "The Phase Relations in the $In_2O_3$—$Ga_2ZnO_4$—ZnO System at 1350° C."; Journal of Solid State Chemistry, vol. 93, No. 2; pp. 298-315; Aug. 1, 1991.

(56) References Cited

OTHER PUBLICATIONS

M. Nespolo et al.; "Synthesis, Crystal Structure and Charge Distribution of InGaZnO4. X-ray Diffraction Study of 20kb Single Crystal and 50kb Twin by Reticular Merohedry"; Cryst. Res. Technol (Crystal Research and Technology), vol. 35, No. 2; pp. 151-165; Feb. 1, 2000.

* cited by examiner

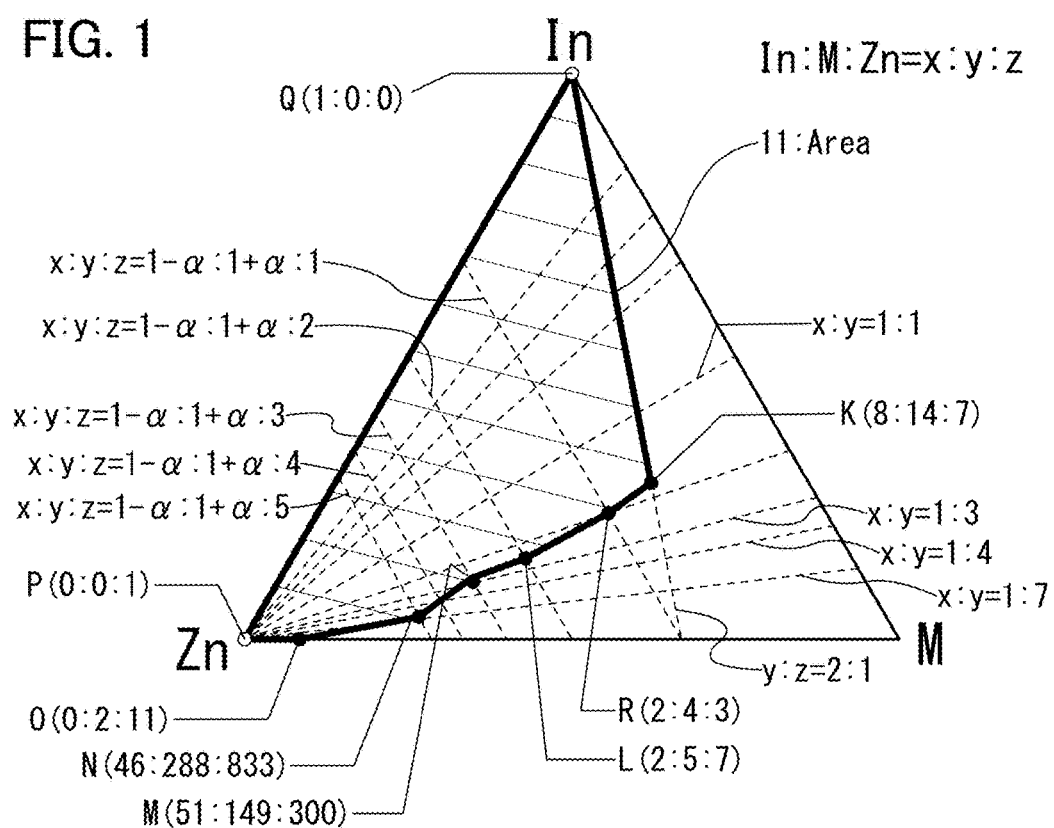

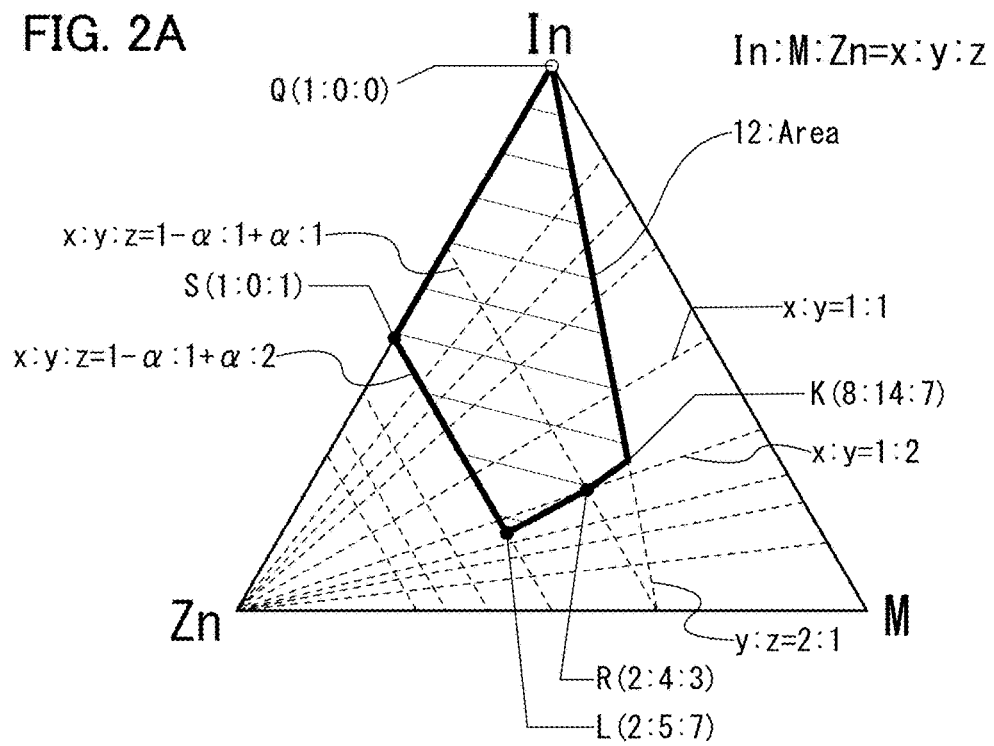
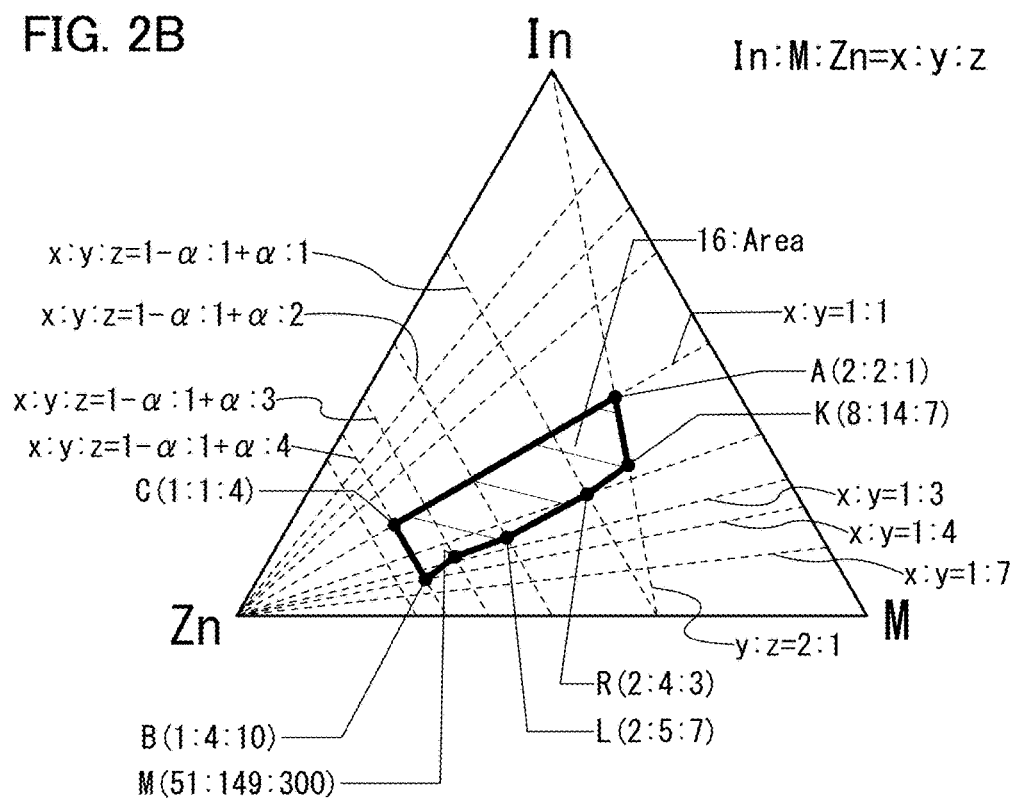

Yγ : γZ = z : y = 1 : 2

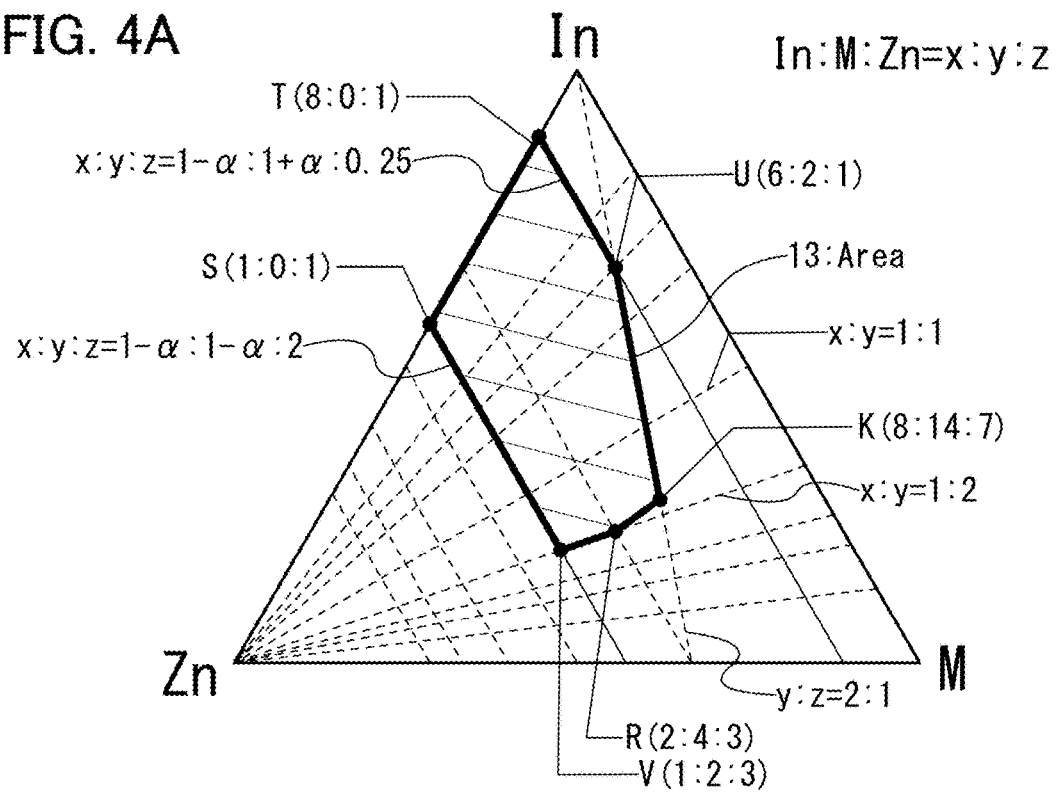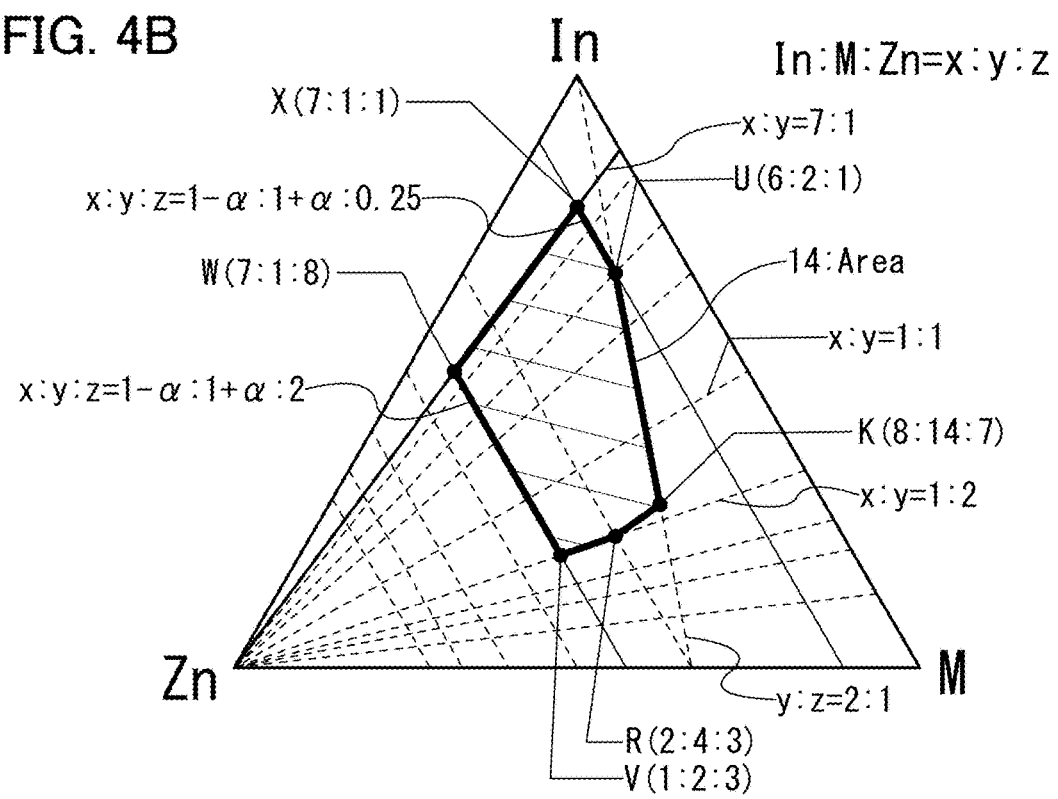

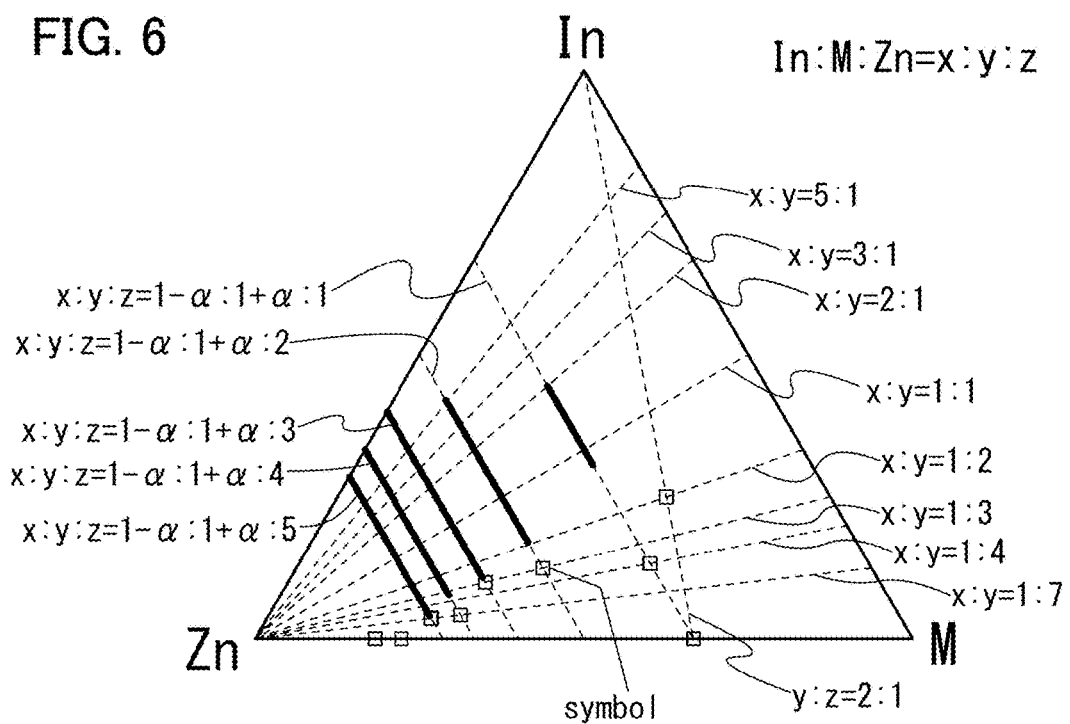

nc-OS

CAAC-OS nc-OS with a thickness of approximately 50 nm nc-OS with a thickness of approximately 5 nm InGaZnO₄

FIG. 17A
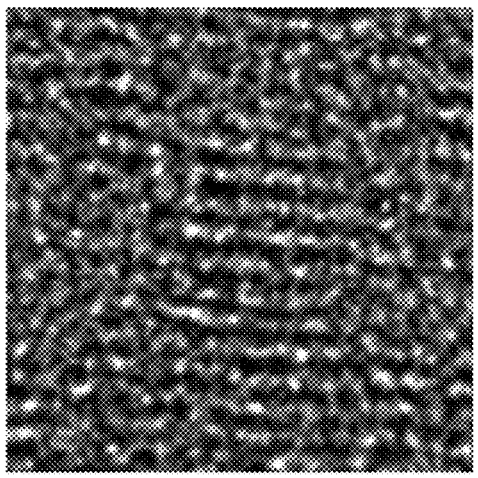 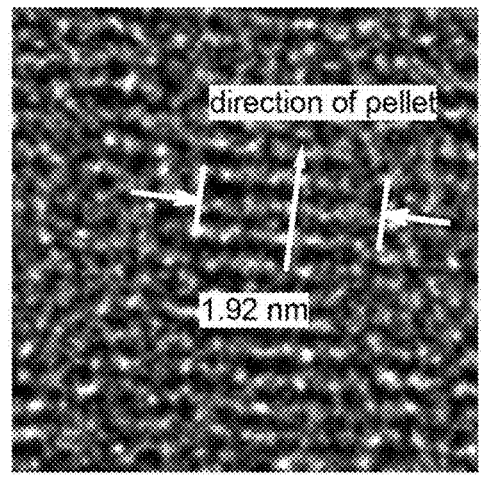
CAAC-OS
FIG. 17B
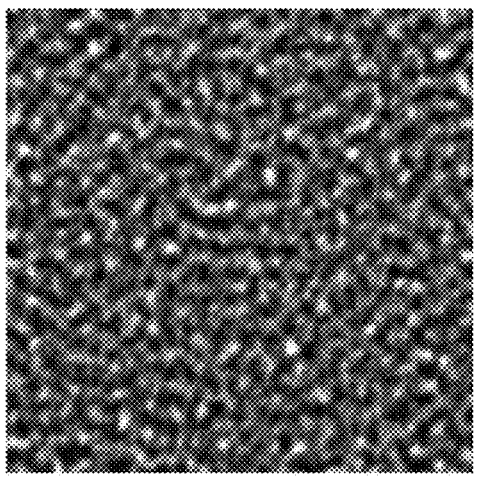 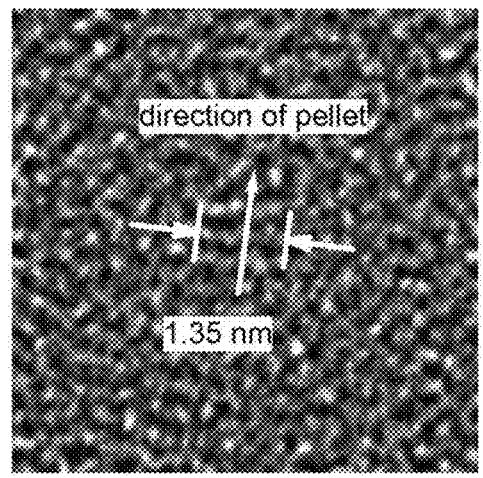
nc-OS nc-OS(DC)

10 nm

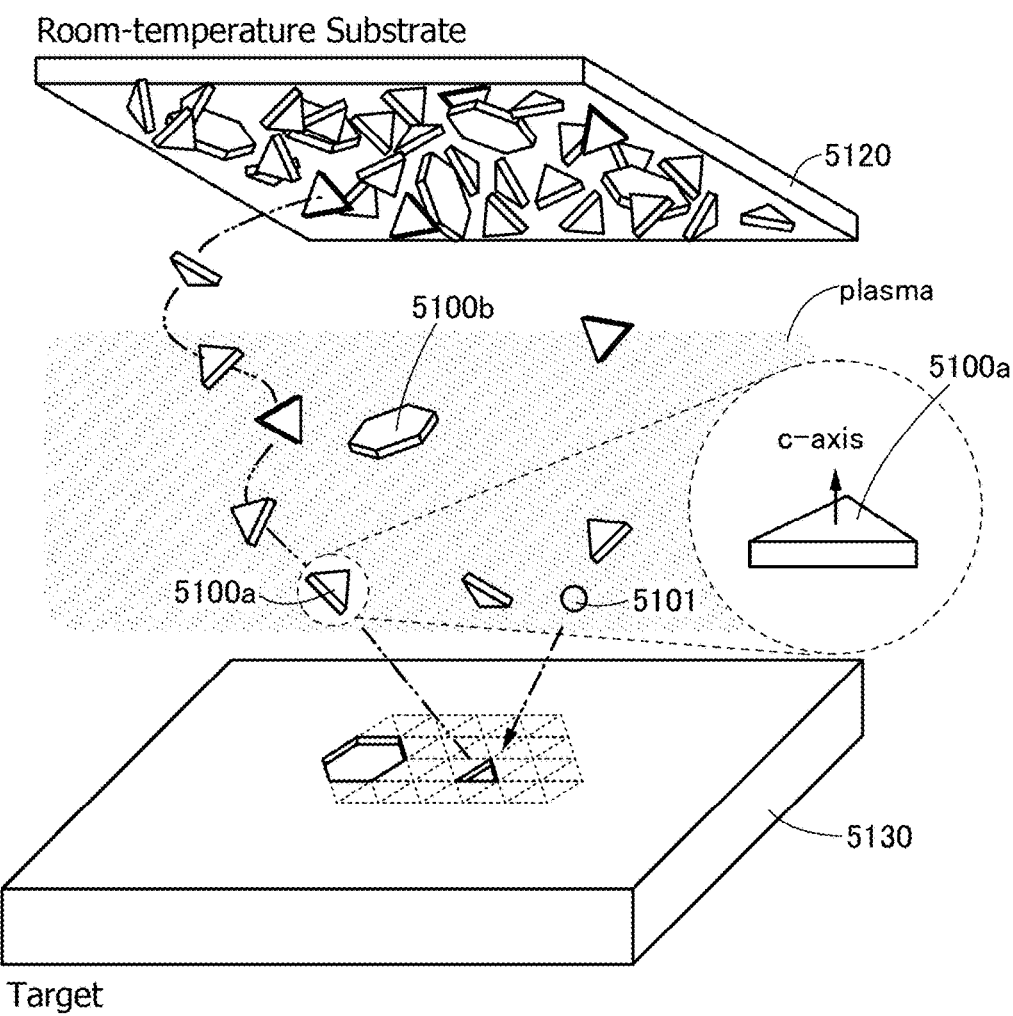

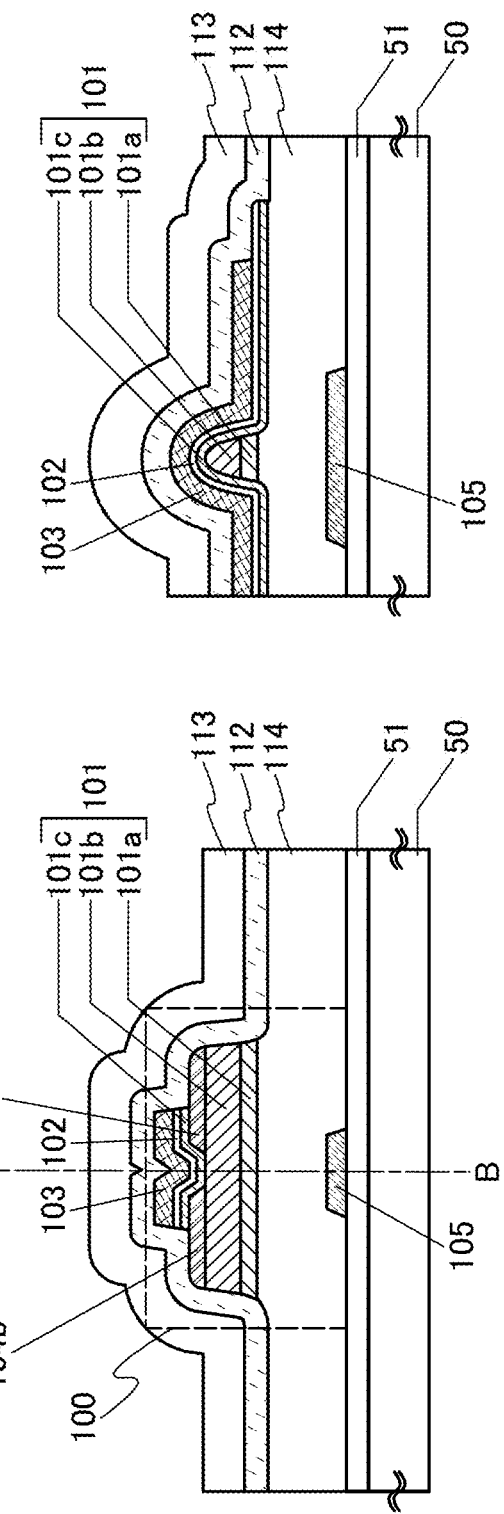
FIG. 30A / FIG. 30B

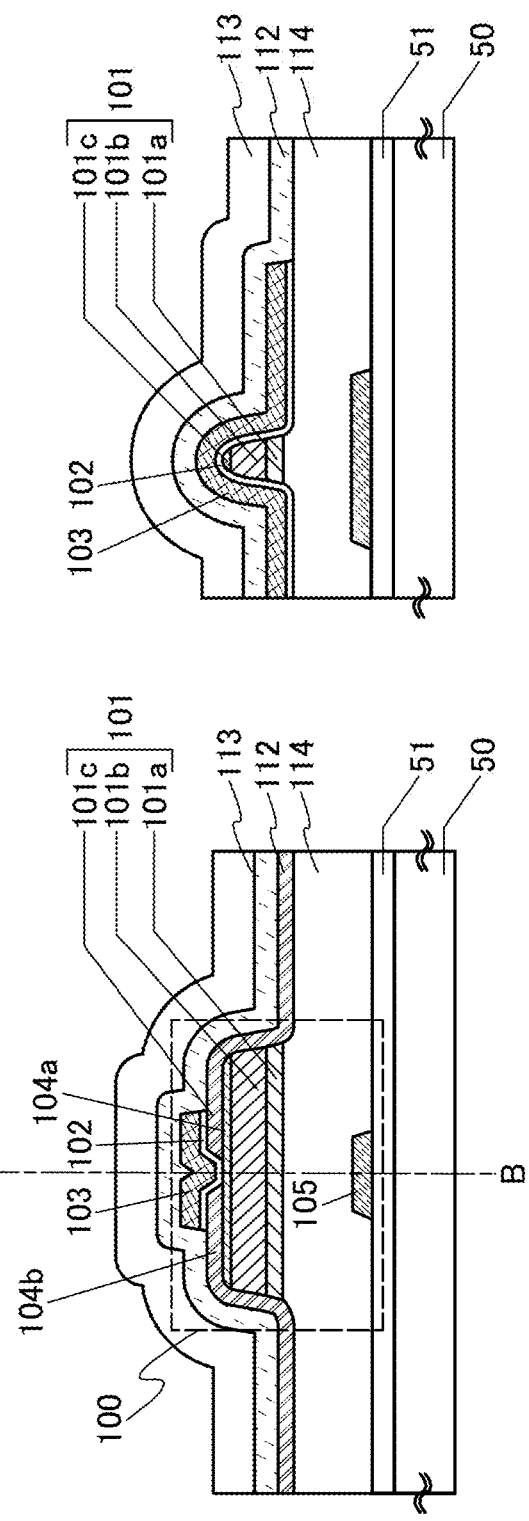

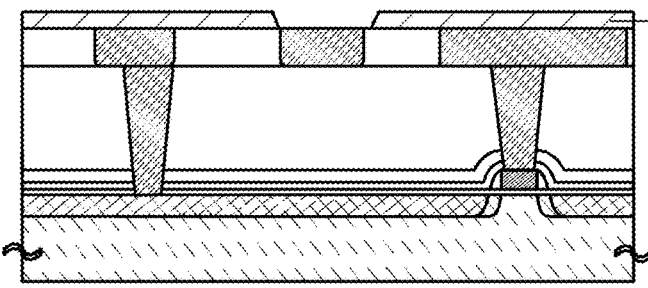
FIG. 40A
FIG. 40B
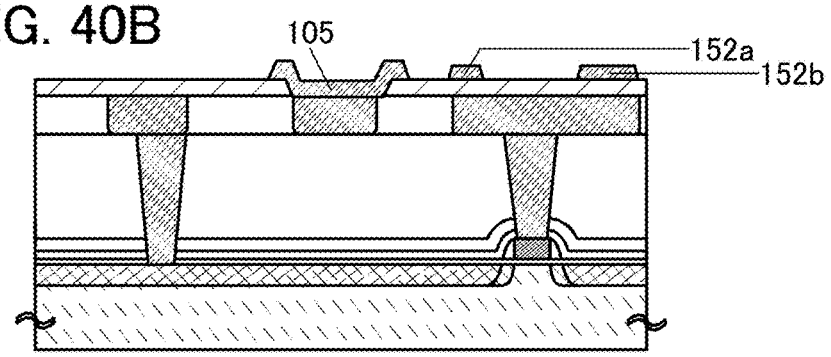
FIG. 40C
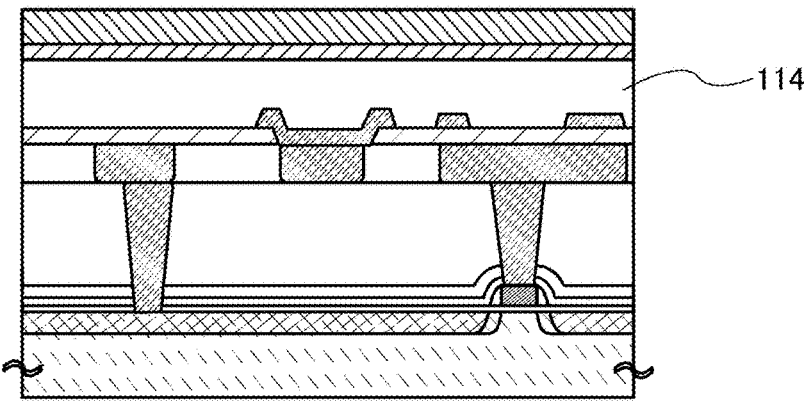
FIG. 40D
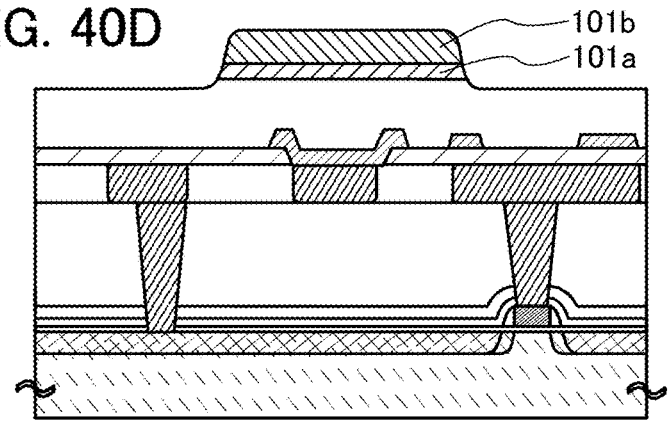

10 nm

SEMICONDUCTOR FILM, SEMICONDUCTOR DEVICE, DISPLAY DEVICE, MODULE, AND ELECTRONIC DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A transistor and a semiconductor circuit are embodiments of semiconductor devices. An arithmetic device, a memory device, an imaging device, an electro-optical device, a power generation device (e.g., a thin film solar cell and an organic thin film solar cell), and an electronic device each may include a semiconductor device.

2. Description of the Related Art

Interesting properties of oxide containing indium and zinc have been widely researched (Non-Patent Document 1 and Non-Patent Document 2). Non-Patent Document 1 discloses that a homologous series represented by $In_{1-x}Ga_{1+x}O_3(ZnO)_m$ ($-1 \leq x \leq 1$, and m is a natural number) exists. Furthermore, Non-Patent Document 1 discloses a solid solution range of a homologous series. For example, in the case where powders of $In_2O_3$, $Ga_2O_3$, and $ZnO$ are mixed and sintered at 1350° C., in a solid solution range of a homologous series when m is 1, x is within a range from −0.33 to 0.08, and in a solid solution range of a homologous series when m is 2, x is within a range from −0.68 to 0.32.

A compound represented by $AB_2O_4$ (A and B are metal) is known as a compound having a spinel crystal structure. In addition, Non-Patent Document 1 discloses an example of $In_xZn_yGa_zO_w$, and when x, y, and z are set so that a composition in the neighborhood of $ZnGa_2O_4$ is obtained, i.e., x, y, and z are close to 0, 1, and 2, respectively, a spinel crystal structure is formed or is likely to be mixed.

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have attracted attention as alternative materials.

For example, a technique for formation of a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with a high density has risen with increased performance and reductions in the size and weight of electronic devices.

REFERENCE

Patent Document

[Patent Document 1] Japanese Published Patent Application No. 2007-123861
[Patent Document 2] Japanese Published Patent Application No. 2007-096055
[Non-Patent Document 1] M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315.
[Non-Patent Document 2] M. Nespolo, A. Sato, T. Osawa, and H. Ohashi, "Synthesis, Crystal Structure and Charge Distribution of $InGaZnO_4$. X-ray Diffraction Study of 20 kb Single Crystal and 50 kb Twin by Reticular Merohedry", Cryst. Res. Technol., 2000, Vol. 35, pp. 151-165.

SUMMARY OF THE INVENTION

An object of one embodiment of the present invention is to provide a semiconductor device with favorable electrical characteristics.

Another object is to provide a highly reliable semiconductor device.

Another object is to provide a favorable transistor with small variation in characteristics. Another object is to provide a semiconductor device including a memory element with favorable retention characteristics. Another object is to provide a semiconductor device that is suitable for miniaturization. Another object is to provide a semiconductor device having a reduced circuit area. Another object is to provide a semiconductor device with a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an oxide semiconductor film containing indium, an element M, and zinc. The element M is at least one of aluminum, gallium, yttrium, and tin. An atomic ratio of indium to the element M and zinc satisfies In:M:Zn=x:y:z. In an equilibrium diagram with vertices of indium, the element M, and zinc, x:y:z is an atomic ratio within a range of an area surrounded by line segments that connect first coordinates (x:y:z=8:14:7), second coordinates (x:y:z=2:4:3), third coordinates (x:y:z=2:5:7), fourth coordinates (x:y:z=51:149:300), fifth coordinates (x:y:z=46:288:833), sixth coordinates (x:y:z=0:2:11), seventh coordinates (x:y:z=0:0:1), eighth coordinates (x:y:z=1:0:0), and the first coordinates in this order. The range includes the first coordinates to the sixth coordinates and does not include the seventh coordinates and the eighth coordinates. A plurality of electron diffraction patterns are observed in such a manner that a surface over which the oxide semiconductor film is formed is irradiated with an electron beam having a probe diameter whose half-width is 1 nm while a position of the oxide semiconductor film and a position of the electron beam are relatively moved. The plurality of electron diffraction patterns include 50 or more electron diffraction patterns observed in different areas. The sum of the percentage of first electron diffraction patterns and the percentage of second electron diffraction patterns accounts for 100%. The first electron diffraction pattern includes observation points that are not symmetry or a plurality of observation points disposed in a circular pattern.

The second electron diffraction pattern includes observation points corresponding to vertices of a hexagon.

Another embodiment of the present invention is an oxide semiconductor film in which a plurality of electron diffraction patterns are observed in such a manner that a surface over which the oxide semiconductor film is formed is irradiated with an electron beam having a probe diameter whose half-width is 1 nm while a position of the oxide semiconductor film and a position of the electron beam are relatively moved; the plurality of electron diffraction patterns include 50 or more electron diffraction patterns observed in different areas; the sum of the percentage of first electron diffraction patterns and the percentage of second electron diffraction diffractions accounts for 100%; the first electron diffraction patterns account for 50% or more; the first electron diffraction pattern includes observation points that are not symmetry or a plurality of observation points disposed in a circular pattern; and the second electron diffraction pattern includes observation points corresponding to vertices of a hexagon.

Another embodiment of the present invention is an oxide semiconductor film represented by an atomic ratio of In:M (Al, Ga, Y, or Sn):Zn=x:y:z. In an equilibrium diagram with vertices of coordinates x:y:z=1:0:0, coordinates x:y:z=0:1:0, and coordinates x:y:z=0:0:1, x:y:z is an atomic ratio within a range of an area surrounded by line segments that connect first coordinates (x:y:z=8:14:7), second coordinates (x:y:z=2:4:3), third coordinates (x:y:z=2:5:7), fourth coordinates (x:y:z=51:149:300), fifth coordinates (x:y:z=46:288:833), sixth coordinates (x:y:z=0:2:11), seventh coordinates (x:y:z=0:0:1), eighth coordinates (x:y:z=1:0:0), and the first coordinates in this order. A surface over which the oxide semiconductor film is formed is irradiated with an electron beam having a probe diameter whose half-width is 1 nm while a position of the oxide semiconductor film and a position of the electron beam are relatively moved, whereby 50 or more electron diffraction patterns are observed in different areas. The 50 or more electron diffraction patterns are at least any of an electron diffraction pattern including a plurality of spots disposed not symmetrically, an electron diffraction pattern including a plurality of spots disposed in a circular pattern, and an electron diffraction pattern including spots corresponding to the vertices of a hexagon. The range includes the first coordinates to the sixth coordinates and does not include the seventh coordinates and the eighth coordinates.

In any of the above structures, it is preferable that the oxide semiconductor film further contain indium, an element M, and zinc; the element M be at least one of aluminum, gallium, yttrium, and tin; an atomic ratio of indium to the element M and zinc satisfy In:M:Zn=x:y:z; in an equilibrium diagram with vertices of indium, the element M, and zinc, x:y:z be an atomic ratio within a range of an area surrounded by line segments that connect first coordinates (x:y:z=8:14:7), second coordinates (x:y:z=2:4:3), third coordinates (x:y:z=2:5:7), fourth coordinates (x:y:z=51:149:300), fifth coordinates (x:y:z=46:288:833), sixth coordinates (x:y:z=0:2:11), seventh coordinates (x:y:z=0:0:1), eighth coordinates (x:y:z=1:0:0), and the first coordinates in this order; and the range includes the first coordinates to the sixth coordinates and does not include the seventh coordinates and the eighth coordinates.

Another embodiment of the present invention is an oxide semiconductor film containing indium, an element M, and zinc. The oxide semiconductor film includes a plurality of crystal parts randomly arranged. An average size of the plurality of crystal parts in a longitudinal direction is greater than or equal to 1 nm and less than or equal to 3 nm.

Another embodiment of the present invention is an oxide semiconductor film containing indium, an element M, and zinc. The element M is at least one of aluminum, gallium, yttrium, and tin. An atomic ratio of indium to the element M and zinc satisfies In:M:Zn=x:y:z. In an equilibrium diagram with vertices of indium, the element M, and zinc, x:y:z is an atomic ratio within a range of an area surrounded by line segments that connect first coordinates (x:y:z=8:14:7), second coordinates (x:y:z=2:4:3), third coordinates (x:y:z=2:5:7), fourth coordinates (x:y:z=51:149:300), fifth coordinates (x:y:z=46:288:833), sixth coordinates (x:y:z=0:2:11), seventh coordinates (x:y:z=0:0:1), eighth coordinates (x:y:z=1:0:0), and the first coordinates in this order. The range includes the first coordinates to the sixth coordinates and does not include the seventh coordinates and the eighth coordinates. A density of the oxide semiconductor film is 90% or higher of a density of single crystal having the same atomic ratio as the oxide semiconductor film.

Another embodiment of the present invention is an oxide semiconductor film containing indium, an element M, and zinc. The element M is at least one of aluminum, gallium, yttrium, and tin. The oxide semiconductor film includes a plurality of crystal parts randomly arranged. The plurality of crystal parts have no alignment. An average size of the plurality of crystal parts in a longitudinal direction is greater than or equal to 1 nm and less than or equal to 3 nm. A density of the oxide semiconductor film is 90% or higher of a density of single crystal having the same atomic ratio as the oxide semiconductor film.

Another embodiment of the present invention is an oxide semiconductor film containing indium, gallium, and zinc. The oxide semiconductor film includes a plurality of crystal parts. The plurality of crystal parts have no alignment. An average size of the plurality of crystal parts in a longitudinal direction is greater than or equal to 1 nm and less than or equal to 3 nm. A density of the oxide semiconductor film is higher than or equal to $5.7 \text{ g/cm}^3$ and lower than or equal to $6.49 \text{ g/cm}^3$. In the above structure, a density of the oxide semiconductor film is 90% or higher of a density of single crystal having the same atomic ratio as the oxide semiconductor film.

Another embodiment of the present invention is an oxide semiconductor film containing indium, gallium, and zinc. The oxide semiconductor film includes a plurality of crystal parts. The plurality of crystal parts have no alignment. An average size A [nm] of the plurality of crystal parts in a longitudinal direction is greater than or equal to 1 nm and less than or equal to 3 nm. An average size B [nm] of the crystal parts in a longitudinal direction after the oxide semiconductor film is irradiated with electron beam energy of greater than or equal to $1 \times 10^7$ [$e^-/\text{nm}^2$] and less than $4 \times 10^8$ [$e^-/\text{nm}^2$] is greater than $A \times 0.7$ and less than $A \times 1.3$.

In any of the above structures, it is preferable that the oxide semiconductor film be formed by a sputtering method; a target used in the sputtering method contain indium, an element M, and zinc; an atomic ratio of indium to the element M and zinc contained in the target satisfy In:M:Zn=a:b:c; in an equilibrium diagram with vertices of the three elements of indium, the element M, and zinc, a:b:c be an atomic ratio within a range of an area surrounded by line segments that connect first coordinates (a:b:c=8:14:7), second coordinates (a:b:c=2:4:3), third coordinates (a:b:c=1:2:5.1), fourth coordinates (a:b:c=1:0:1.7), fifth coordinates (a:b:c=8:0:1), sixth coordinates (a:b:c=6:2:1), and the first coordinates in this order; and the range include the first coordinates to the sixth coordinates.

Another embodiment of the present invention is a semiconductor device including any of the above-described oxide semiconductor films. In the above structure, it is preferable that the semiconductor device further include a first conductive layer, a first insulating film in contact with a top surface and a side surface of the first conductive layer, and a pair of electrodes in contact with a top surface of the oxide semiconductor film; and the oxide semiconductor film include a region in contact with the first insulating film. Alternatively, in the above structure, it is preferable that the semiconductor device further include a first conductive layer, a first insulating film in contact with a top surface and a side surface of the first conductive layer, a second insulating film a top surface of the oxide semiconductor film, and a pair of electrodes in contact with a top surface of the oxide semiconductor film and a top surface and a side surface of the second insulating film; and the oxide semiconductor film include a region in contact with the first insulating film. In the above structure, it is preferable that the semiconductor device further include a second oxide film in contact with a top surface of the oxide semiconductor film. In the above structure, it is preferable that electron affinity of an oxide contained in the oxide semiconductor film be larger than electron affinity of an oxide contained in the second oxide film. In the above structure, it is preferable that the second oxide film contain indium, an element M, and zinc; the element M be at least one of aluminum, gallium, yttrium, and tin; an atomic ratio of indium to the element M and zinc contained in the second oxide film be represented by In:M:Zn=$x_2$:$y_2$:$z_2$; in an equilibrium diagram with vertices of indium, the element M, and zinc, $x_2$:$y_2$:$z_2$ be an atomic ratio within a range of an area surrounded by line segments that connect first coordinates (8:14:7), second coordinates (2:4:3), third coordinates (2:5:7), fourth coordinates (51:149:300), fifth coordinates (1:4:10), sixth coordinates (1:1:4), seventh coordinates (2:2:1), and the first coordinates in this order; and the range include the first coordinates to the seventh coordinates.

Another embodiment of the present invention is a display device including the above semiconductor device and a display element.

Another embodiment of the present invention is a module including the above semiconductor device or the above display device and an FPC.

Another embodiment of the present invention is an electronic device including the above-described semiconductor device, the above-described display device, or the above-described module, and a microphone, a speaker, or an operation key.

According to one embodiment of the present invention, a semiconductor device can be provided with favorable electrical characteristics. Further, a highly reliable semiconductor device can be provided.

In addition, a transistor with small variation in characteristics can be provided. A semiconductor device including a memory element with favorable retention characteristics can be provided. A semiconductor device that is suitable for miniaturization can be provided. Furthermore, a semiconductor device having a reduced circuit area can be provided. A semiconductor device with a novel structure can be provided. Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

In the accompanying drawings:

FIG. 1 illustrates an atomic ratio of an oxide film of one embodiment of the present invention;

FIGS. 2A and 2B each illustrate an atomic ratio of an oxide film of one embodiment of the present invention;

FIGS. 4A and 4B each illustrate an atomic ratio of an oxide film of one embodiment of the present invention;

FIG. 6 illustrates an atomic ratio;

FIGS. 17A and 17B show Cs-corrected high-resolution cross-sectional TEM images of a CAAC-OS and an nc-OS;

FIG. 24 illustrates a deposition model of an nc-OS schematically and a pellet;

FIGS. 30A and 30B illustrate an example of a transistor of one embodiment of the present invention;

FIGS. 31A and 31B illustrate an example of a transistor of one embodiment of the present invention;

FIGS. 40A to 40D illustrate a manufacturing method of a semiconductor device of one embodiment of the present invention;

DETAILED DESCRIPTION OF THE INVENTION

Figure 3A:
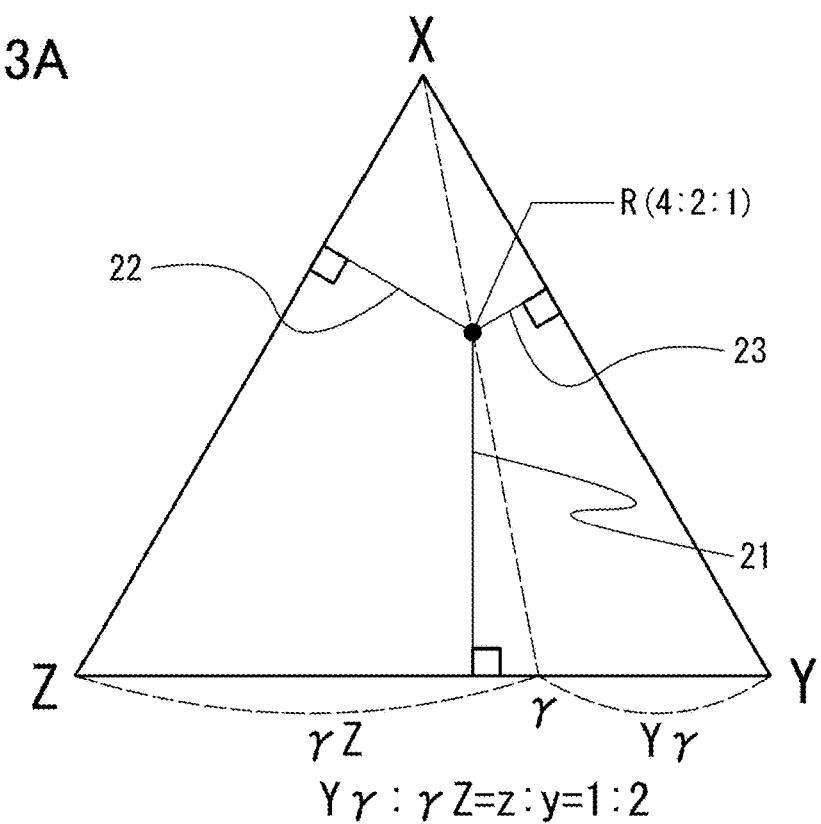
FIGS. 3A and 3B illustrate an atomic ratio.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

(Embodiment 1)

In this embodiment, an example of an oxide semiconductor film which is one embodiment of the present invention is described.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

Single crystal can be formed by sintering at a high temperature, e.g., 1000° C. or higher, in some cases. Thus, in terms of industrialization, a non-single-crystal oxide semiconductor film, which can be formed at a lower temperature, is preferably used because semiconductor devices can be manufactured at lower costs.

It is preferable that the number of grain boundaries be as few as possible. When the grain boundaries are reduced, for example, the carrier mobility can be increased. By forming a transistor using an oxide semiconductor film with few grain boundaries, for example, a transistor with high field-effect mobility can be fabricated in some cases. Although described later, as examples of the non-single-crystal oxide semiconductor film with few grain boundaries, the nc-OS film and the CAAC-OS film can be given.

Furthermore, the oxide semiconductor film might include a crystal with a spinel structure. When the crystal with a spinel structure is mixed into the CAAC-OS film or the nc-OS film, a clear boundary portion (or grain boundary) might be formed. In the boundary portion, for example, carrier scattering might be increased, and thus the carrier mobility might be reduced. Furthermore, the boundary portion tends to serve as a movement path of impurities and capture impurities easily; thus, the impurity concentration of the oxide semiconductor film might be increased. In the case where a conductive film is formed over the oxide semiconductor film, an element contained in the conductive film, such as metal, might be diffused into the boundary portion between the region with the spinel crystal structure and another region. Therefore, it is particularly preferable that the oxide semiconductor film have no or a small amount of spinel crystal structures.

Here, an oxide semiconductor is an oxide semiconductor containing indium, for example. An oxide semiconductor has high carrier mobility (electron mobility) by containing indium, for example. An oxide semiconductor preferably includes an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Further, the oxide semiconductor preferably includes zinc. When the oxide semiconductor includes zinc, the oxide semiconductor is easily to be crystallized, for example. Here, oxide containing indium, the element M, and zinc is referred to as an In-M-Zn oxide.

[Atomic Ratio]

The ratio of In atoms to M atoms and Zn atoms of the In-M-Zn oxide film, which is an oxide semiconductor film of one embodiment of the present invention, is represented by x:y:z. A favorable range of x:y:z is described with reference to FIG. 1 and FIGS. 2A and 2B.

Figure 3B:
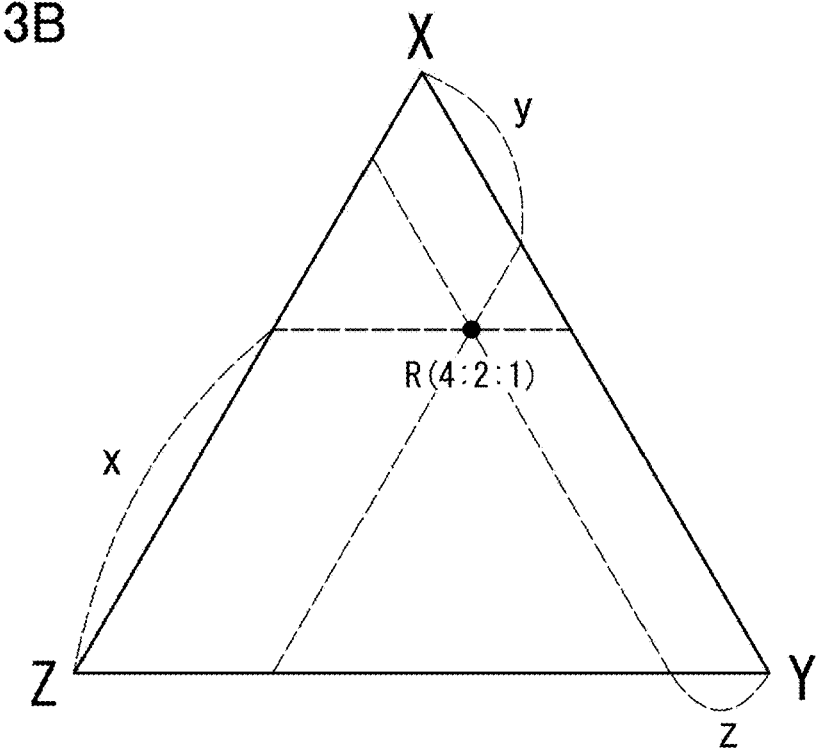

Here, an atomic ratio of elements is described with reference to FIGS. 3A and 3B. FIGS. 3A and 3B illustrate a range of x:y:z in the case where the ratio of X atoms to Y atoms and Z atoms of an X-Y-Z oxide film is represented by x:y:z. Note that a proportion of oxygen atoms is not illustrated in FIGS. 3A and 3B. Furthermore, FIGS. 3A and 3B are referred to as equilibrium diagrams in some cases. FIGS. 3A and 3B each illustrate a regular triangle with vertices X, Y, and Z, and coordinates R (4:2:1) as an example. The vertices denote the elements X, Y, and Z. As the distance from coordinates to each vertex is reduced, a value of a term of the corresponding element in the atomic ratio is increased, whereas as the distance is increased, the value of the term of the corresponding element in the atomic ratio is reduced. In addition, as illustrated in FIG. 3A, the value of the term of each element in the atomic ratio is represented by the length of a perpendicular line from the coordinates to the subtense of the corresponding vertex of the triangle. For example, the proportion of atoms of the element X is represented by the length of a perpendicular line 21 from the coordinates to the subtense of the vertex X, i.e., to a side YZ. Therefore, the coordinates R in FIGS. 3A and 3B represents that the atomic ratio of the element X to the element Y and the element Z is the ratio of the length of the perpendicular line 21 to the length of a perpendicular line 22 and the length of a perpendicular line 23, that is, x:y:z=4:2:1. Furthermore, an intersection point of the side YZ with a line passing through the vertex X and the coordinates R is denoted by y. Assuming that the ratio of the length of a line Yγ to the length of a line γZ is Yγ:γZ, Yγ:γZ corresponds to (the number of atoms of the element Z):(the number of atoms of the element Y).

As illustrated in FIG. 3B, three lines each of which passes through the coordinates R and is parallel to any of the three sides of the triangle are drawn. By using intersection points of the three lines with the three sides, x, y, and z can be represented as illustrated in FIG. 3B.

In FIG. 6, ranges in which x:y:z of the In-M-Zn oxide film satisfies the following formula are indicated by dashed lines.

$$x:y:z=(1-\alpha):(1+\alpha):m(-1\leq\alpha\leq1)$$

Here, FIG. 6 illustrates the cases where m is 1, 2, 3, 4, and 5.

For example, as disclosed in Non-Patent Document 1, it is known that there is a homologous series represented by $InMO_3(ZnO)$. (m is a natural number) as one of In-M-Zn oxides. Here, for example, the case where the element M is Ga is considered. It is known that regions denoted by thick lines in FIG. 6 indicate compositions which allow a single-phase solid solution range when powders of $In_2O_3$, $Ga_2O_3$, and ZnO are mixed and sintered at 1350° C., for example. It is known that as the value of m is increased, that is, as the proportion of zinc is increased, the solid solution range becomes wider.

Furthermore, the coordinates denoted by square symbols in FIG. 6 correspond to, as disclosed in Non-Patent Document 1, known compositions with which a spinel crystal structure is likely to be mixed when powders of $In_2O_3$, $Ga_2O_3$, and ZnO are mixed and sintered at 1350° C., for example. Non-Patent Document 1 discloses that when the composition of a film in the neighborhood of $ZnGa_2O_4$, that is, the ratio of x to y and z is close to 0:2:1 as illustrated in FIG. 6, a spinel crystal structure is likely to be formed or mixed.

In the In-M-Zn oxide film, which is an oxide semiconductor film of one embodiment of the present invention, the proportion of indium is preferably increased. In the In-M-Zn oxide film, the s orbital of a metal atom mainly contributes to carrier transfer, and when the indium content in the In-M-Zn oxide film is increased, overlaps of the s orbitals are increased, leading to higher carrier mobility. By forming a transistor including such a film in a channel formation region, a transistor having high field-effect mobility can be obtained, for example. For example, $x/y > 0.5$ is preferable, $x/y \geq 0.75$ is further preferable, and $x/y \geq 1$ is still further preferable. Furthermore, $(x+y) \geq z$ is preferable.

Accordingly, the atomic ratio of x:y:z is preferably within the range of an area 11 illustrated in FIG. 1, further preferably within the range of an area 12 illustrated in FIG. 2A. Here, the area 11 is an area surrounded by line segments that connect first coordinates K (x:y:z=8:14:7), second coordinates R (x:y:z=2:4:3), third coordinates L (x:y:z=2:5:7), fourth coordinates M (x:y:z=51:149:300), fifth coordinates N (x:y:z=46:288:833), sixth coordinates 0 (x:y:z=0:2:11), seventh coordinates P (x:y:z=0:0:1), eighth coordinates Q (x:y:z=1:0:0), and the first coordinates K in this order. Note that the area 11 also includes line segments that connect the eight points. In addition, the coordinates other than the coordinates P and Q are also included in the area 11. Furthermore, the area 12 is an area surrounded by line segments that connect first coordinates K (x:y:z=8:14:7), second coordinates R (x:y:z=2:4:3), third coordinates L (x:y:z=2:5:7), fourth coordinates S (x:y:z=1:0:1), fifth coordinates Q (x:y:z=1:0:0), and the first coordinates K in this order. Note that the area 12 also includes line segments that connect the five points. In addition, the coordinates other than the coordinates Q are also included in the area 12.

<Structure of Oxide Semiconductor Film>

Next, a structure of the oxide semiconductor film is described.

First, a CAAC-OS film is described.

The CAAC-OS film is one of oxide semiconductor films having a plurality of c-axis aligned crystal parts.

When observing the CAAC-OS film in a combined analysis image of a bright-field image and a diffraction pattern with the use of a transmission electron microscope (TEM) (the combined analysis image is also referred to as a high-resolution TEM image), a plurality of crystal parts can be found. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

Note that in an electron diffraction pattern of the CAAC-OS film, spots (bright spots) having alignment are shown. For example, when electron diffraction with an electron beam having a diameter of 1 nm or greater and 30 nm or less (such electron diffraction is also referred to as nanobeam electron diffraction) is performed on the formation surface or the top surface of the CAAC-OS film, spots are observed (see FIG. 7B).

The high-resolution cross-sectional TEM image and the high-resolution plan TEM image show that the crystal parts in the CAAC-OS film have alignment.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan high-resolution TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the crystal parts of the CAAC-OS film occurs from the vicinity of the top surface of the film, a proportion of the c-axis aligned crystal parts in the vicinity of the top surface is higher than that in the vicinity of the formation surface in some cases. Further, when an impurity is added to the CAAC-OS film, a region to which the impurity is added is altered, and a proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak at 2θ of around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

In some cases, oxygen vacancy in the oxide semiconductor film serves as a carrier trap or serves as a carrier generation source when hydrogen is captured therein.

The CAAC-OS film is an oxide semiconductor film having a low density of defect states. Specifically, an oxide semiconductor with a carrier density of lower than $8\times10^{11}/cm^3$, preferably lower than $1\times10^{11}/cm^3$, further preferably lower than $1\times10^{19}/cm^3$, and higher than or equal to $1\times10^{-9}/cm^3$ can be used.

With the use of the CAAC-OS film in a transistor, variation in the electrical characteristics of the transistor due to irradiation with visible light or ultraviolet light is small.

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a boundary between crystals may be observed.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability in some cases.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

Figure 8:
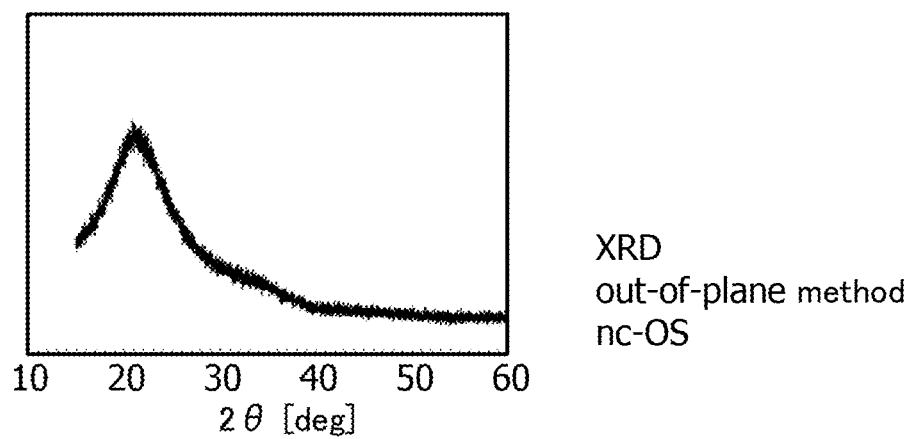
FIG. 8 shows analysis results of an nc-OS by an X-ray diffraction apparatus.
Figure 9A:
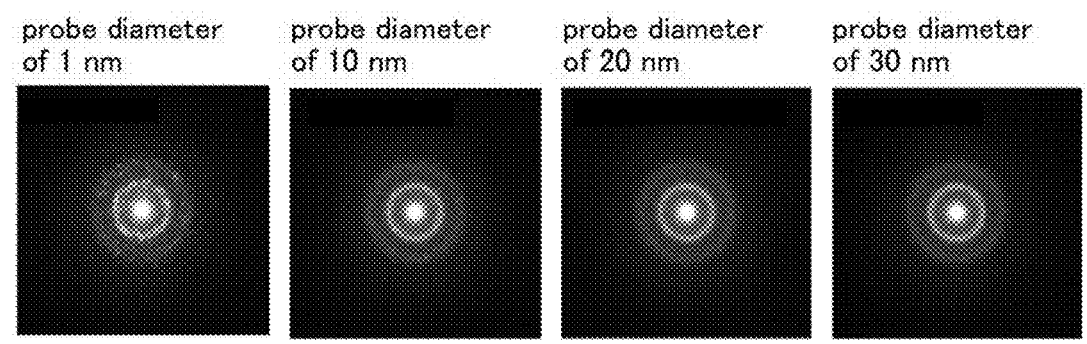
FIGS. 9A and 9B each show electron diffraction patterns of an nc-OS.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear at around 31° (see FIG. 8). Further, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases. For example, as shown in FIG. 9A, in a nanobeam electron diffraction pattern of the nc-OS with a thickness of approximately 50 nm with a probe diameter of 30 nm, 20 nm, 10 nm, or 1 nm, regions with high luminance in a circular (ring) pattern are shown. Furthermore, when the probe diameter is decreased, the regions in a ring pattern are formed of a plurality of spots.

Figure 9B:
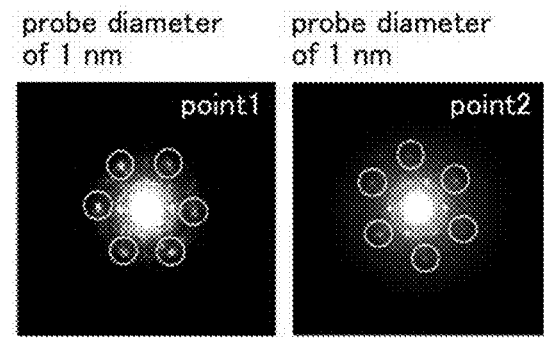

To analyze the structure in more detail, the nc-OS film is thinned to obtain a sample with a thickness of several nanometers (approximately 5 nm). Then, an electron beam with a probe diameter of 1 nm enters the sample to obtain transmission electron diffraction patterns. As a result, as shown in FIG. 9B, transmission electron diffraction patterns having spots indicating crystallinity are obtained.

In a nanobeam electron diffraction pattern of the nc-OS film, two ring-like regions are observed in some cases.

The nc-OS film is an oxide semiconductor film that has high regularity as compared to an amorphous oxide semiconductor film. Therefore, the nc-OS film has a lower density of defect states than an amorphous oxide semiconductor film.

Note that there is no regularity of crystal orientation between different crystal parts in the nc-OS film. Hence, the nc-OS film has a higher density of defect states than the CAAC-OS film. Thus, the nc-OS film may have a higher carrier density than the CAAC-OS film. The oxide semiconductor film having a high carrier density may have high electron mobility. Thus, a transistor including the nc-OS film may have high field-effect mobility.

The nc-OS film can be formed at a lower temperature than the CAAC-OS film. The nc-OS film can be formed in some cases even when a relatively large amount of impurities is contained. Thus, the nc-OS film can be formed easily as compared to the CAAC-OS film in some cases. Therefore, a semiconductor device including the transistor using the nc-OS film can be manufactured with high productivity in some cases.

Furthermore, the nc-OS film has an appropriate oxygen-transmitting property in some cases. In such a case, for example, oxygen released from a film having excess oxygen is easily diffused into the entire nc-OS film. Therefore, in the nc-OS film, oxygen vacancies are easily reduced in some cases.

The state in which impurity concentration is low and a density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, the transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (a small amount of oxygen vacancy). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization occurs by a slight amount of electron beam used for TEM observation and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, a spacing between these adjacent layers is equivalent to a lattice spacing on the (009) plane (also referred to as d value). The value is calculated to 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal. The maximum length of the region in which the lattice fringes are observed is regarded as the size of the crystal parts of the a-like OS film and the nc-OS film. Note that the crystal part whose size is 0.8 nm or larger is selectively evaluated.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition.

Note that single crystal with the same composition does not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

[Nanobeam Electron Diffraction]

Next, nanobeam electron diffraction is described.

In the case where the oxide semiconductor film has a plurality of structures, the structures can be analyzed using nanobeam electron diffraction in some cases.

Figure 7A:
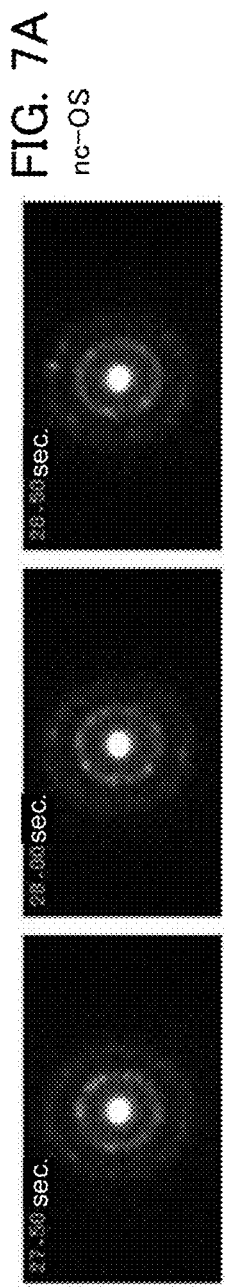
FIGS. 7A and 7B show nanobeam electron diffraction patterns of oxide semiconductor films and FIGS. 7C and 7D illustrate an example of a transmission electron diffraction measurement apparatus.
Figure 7B:
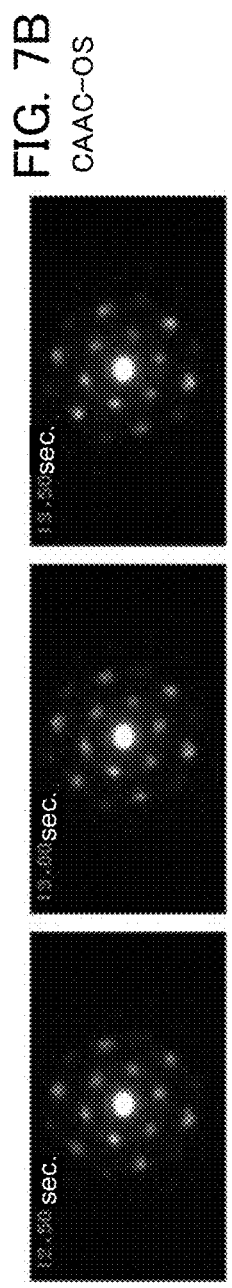
Figure 7D:
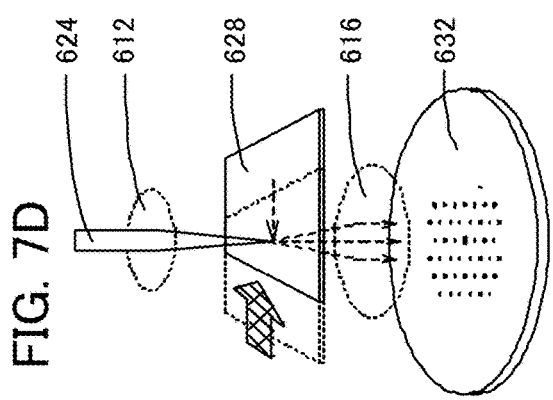
Figure 7C:
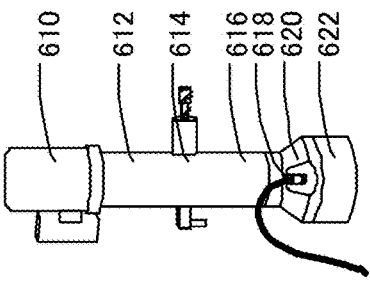

FIG. 7C illustrates a transmission electron diffraction measurement apparatus that includes an electron gun chamber 610, an optical system 612 below the electron gun chamber 610, a sample chamber 614 below the optical system 612, an optical system 616 below the sample chamber 614, an observation chamber 620 below the optical system 616, a camera 618 installed in the observation chamber 620, and a film chamber 622 below the observation chamber 620. The camera 618 is provided to face the inside of the observation chamber 620. Note that the film chamber 622 is not necessarily provided.

FIG. 7D illustrates an internal structure of the transmission electron diffraction measurement apparatus illustrated in FIG. 7C. In the transmission electron diffraction measurement apparatus, a substance 628 provided in the sample chamber 614 is irradiated with electrons ejected from an electron gun provided in the electron gun chamber 610 through the optical system 612. The electrons that have passed through the substance 628 enter a fluorescent plate 632 provided in the observation chamber 620 through the optical system 616. On the fluorescent plate 632, a pattern corresponding to the intensity of entered electron appears, which allows measurement of a transmission electron diffraction pattern.

The camera 618 is set toward the fluorescent plate 632 so that a pattern on the fluorescent plate 632 can be taken. An angle formed by a straight line that passes through the center of a lens of the camera 618 and the center of the fluorescent plate 632 and an upper surface of the fluorescent plate 632 is, for example, 15° or more and 80° or less, 30° or more and 75° or less, or 45° or more and 70° or less. As the angle is reduced, distortion of the transmission electron diffraction pattern taken by the camera 618 becomes larger. Note that if the angle is obtained in advance, the distortion of an obtained transmission electron diffraction pattern can be corrected. Note that the film chamber 622 may be provided with the camera 618. For example, the camera 618 may be set in the film chamber 622 so as to be opposite to the incident direction of electrons 624. In this case, a transmission electron diffraction pattern with less distortion can be taken from the rear surface of the fluorescent plate 632.

A holder for fixing the substance 628 that is a sample is provided in the sample chamber 614. The holder transmits electrons passing through the substance 628. The holder may have, for example, a function of moving the substance 628 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 628.

Then, a method for measuring a transmission electron diffraction pattern of a substance by the transmission electron diffraction measurement apparatus described above will be described.

For example, changes in the structure of a substance can be observed by changing the irradiation position of the electrons 624 that are a nanobeam on the substance (or by scanning) as illustrated in FIG. 7D. At this time, when the substance 628 is a CAAC-OS film, diffraction patterns shown in FIG. 7B can be observed. When the substance 628 is an nc-OS film, diffraction patterns as shown in FIG. 7A, e.g., a diffraction pattern including a plurality of bright spots disposed in a circular pattern (a ring-like diffraction pattern with bright spots), can be observed. The diffraction pattern shown in FIG. 7A includes bright spots that are not disposed symmetrically.

As shown in FIG. 7B, for example, spots corresponding to the vertices of a hexagon appear in a diffraction pattern of the CAAC-OS film. By scanning the irradiation position in the CAAC-OS film, the orientation of the hexagon is varied and rotated gradually. In addition, the angle of the rotation has a certain range.

Alternatively, by scanning the irradiation position, the diffraction pattern of the CAAC-OS film is gradually rotated with the c-axis. In other words, a plane formed by the a-axis and the b-axis is rotated, for example.

The substance 628 includes a region where a diffraction pattern similar to that of a CAAC-OS film is observed (hereinafter referred to as a region having a CAAC structure) and a region where a diffraction pattern similar to that of an nc-OS film is observed (hereinafter referred to as a region having an nc structure) in some cases. Here, the proportion of a region where a diffraction pattern of a CAAC-OS film is observed in a predetermined area can be referred to as a CAAC proportion. Similarly, the proportion of a region where a diffraction pattern of an nc-OS film is observed can be referred to as an nc proportion.

A method for evaluating the CAAC proportion of a CAAC-OS film is described below. Measurement points are randomly selected, transmission electron diffraction patterns thereof are obtained, and the percentage of the number of measurement points where a CAAC-OS film diffraction pattern is observed in the total measurement points is calculated. The number of total measurement points is preferably larger than or equal to 50, further preferably larger than or equal to 100.

As a way to randomly select measurement points, for example, the irradiation position is scanned linearly to obtain diffraction patterns at even time intervals, which is preferable because the boundary between a region having a CAAC structure and another region, or the like can be found. Note that the nc proportion can be calculated similarly by selecting measurement points randomly and obtaining transmission electron diffraction patterns thereof.

With such a measurement method, the structure of an oxide semiconductor film having a plurality of structures can be analyzed in some cases.

In an oxide semiconductor film of one embodiment of the present invention, for example, the sum of the nc proportion and the CAAC proportion is preferably higher than or equal to 80%, further preferably higher than or equal to 90% and lower than or equal to 100%, further preferably higher than or equal to 95% and lower than or equal to 100%, further preferably higher than or equal to 98% and lower than or equal to 100%, further preferably higher than or equal to 99% and lower than or equal to 100%. When the sum of the nc proportion and the CAAC proportion is increased, for example, an oxide semiconductor film in which few clear grain boundaries exist can be formed. By reducing clear grain boundaries, the carrier mobility of the oxide semiconductor film can be increased, for example.

At least part of this embodiment can be implemented in combination with any of the other embodiments described in this specification as appropriate.

(Embodiment 2)

In this embodiment, an example of an oxide semiconductor film which is one embodiment of the present invention is described.

An nc-OS film can be formed at a relatively lower temperature than the CAAC-OS film. For example, the nc-OS film can be formed without heating a substrate in some cases. Therefore, a semiconductor device including the transistor using the nc-OS film can be manufactured with high productivity in some cases.

Furthermore, the nc-OS film has an appropriate oxygen-transmitting property; thus, oxygen is easily diffused into the entire film and oxygen vacancies are easily reduced in some cases. Therefore, an oxide semiconductor film with a low density of defects can be formed in some cases. Then, the characteristics of a semiconductor device including a transistor using the nc-OS film can be improved in some cases. Furthermore, the reliability can be improved in some cases.

The nc-OS film and the CAAC-OS film each have a layered atomic arrangement. Such a layered atomic arrangement can be observed by the TEM or the like.

Here, images obtained by TEM using a spherical aberration corrector function (also referred to as TEM images) of the nc-OS film and the CAAC-OS film are observed. Note that a combined analysis image of a bright-field image obtained by TEM analysis and a diffraction pattern is referred to as a high-resolution TEM image. The high-resolution TEM image obtained with a spherical aberration corrector function is particularly referred to as a Cs-corrected high-resolution TEM image. Note that the Cs-corrected high-resolution TEM image can be obtained with, for example, an atomic resolution analytical electron microscope JEM-ARM200F manufactured by JEOL Ltd.

In the CAAC-OS and the nc-OS, Cs-corrected high-resolution cross-sectional TEM images are analyzed in more detail to examine the crystal size and orientation. A crystal part of the nc-OS may be referred to as a pellet in the following description. The crystal size and orientation are examined by extracting, for example, a pellet larger than or equal to 20 nm square in a cross-sectional TEM image.

FIG. 17A show Cs-corrected high-resolution cross-sectional TEM images of the CAAC-OS. FIG. 17B show Cs-corrected high-resolution cross-sectional TEM images of the nc-OS. Note that the same portion is observed in the left diagram and the right diagram. In the right diagram, a pellet is denoted by an auxiliary line.

Figure 18A:
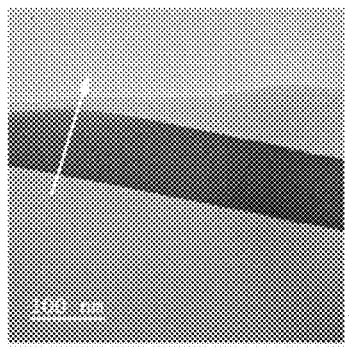
FIGS. 18A and 18B show Cs-corrected high-resolution cross-sectional TEM images of a CAAC-OS.
Figure 18B:
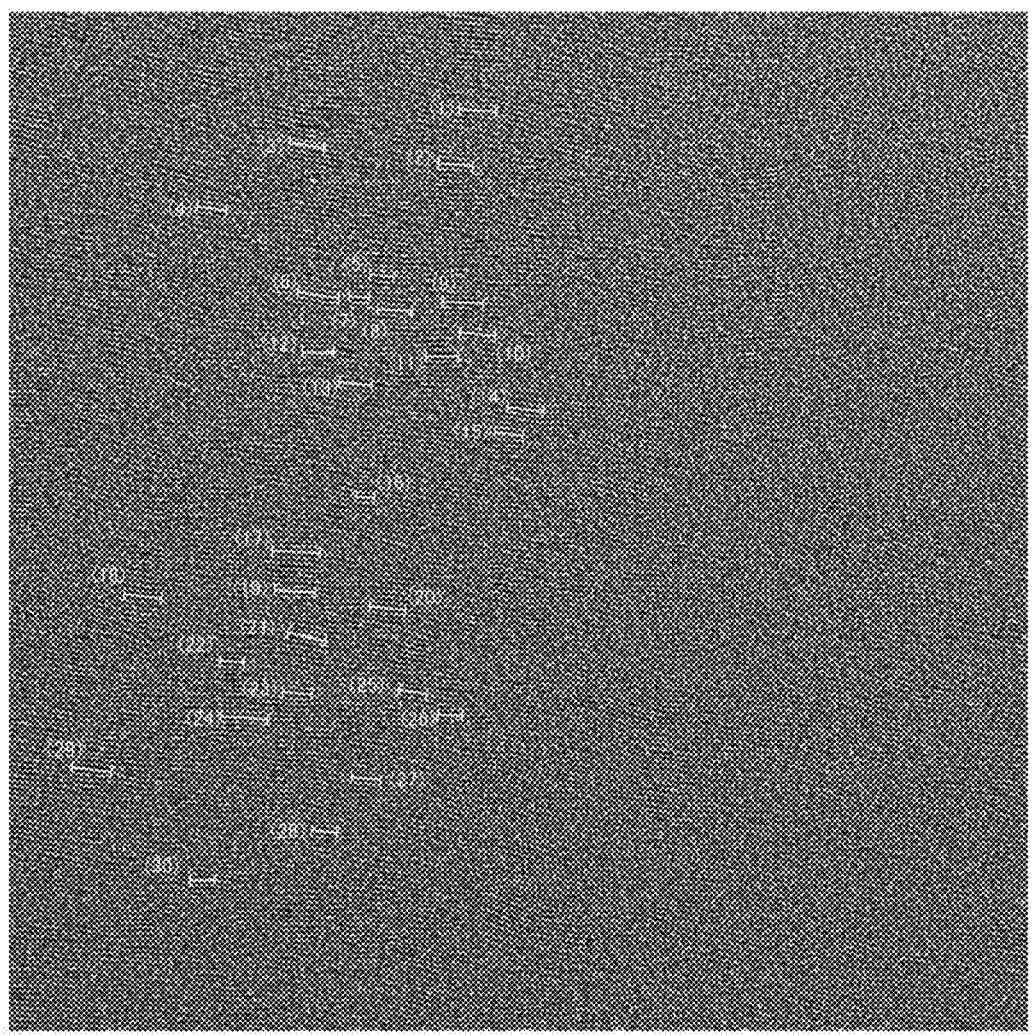
Figure 22A:
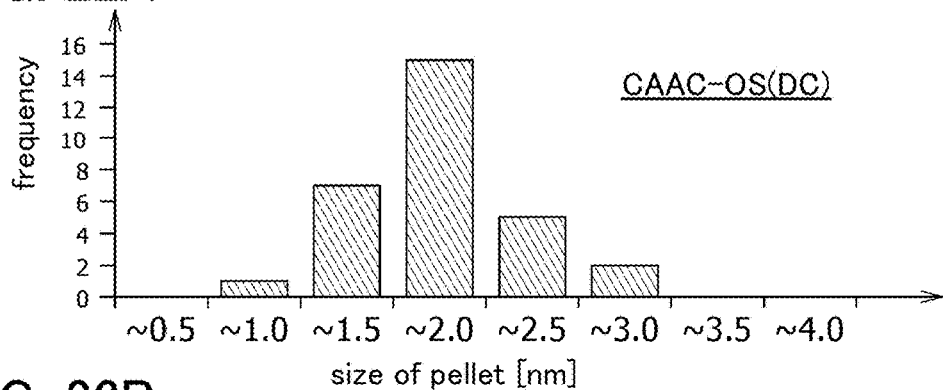
FIGS. 22A and 22B each show a pellet size observed by a Cs-corrected high-resolution cross-sectional TEM image of a CAAC-OS and a frequency thereof, and FIGS. 22C and 22D each show a pellet size observed by a Cs-corrected high-resolution cross-sectional TEM image of an nc-OS and a frequency thereof.

FIG. 18A is a cross-sectional TEM image of the CAAC-OS deposited by a DC sputtering method. FIG. 18B is a Cs-corrected high-resolution cross-sectional TEM image in which part of the TEM image in FIG. 18A is enlarged. In FIG. 18B, the number of pellets is counted and the size and direction thereof are shown in a frequency distribution (see FIG. 22A). Here, an arrow illustrated in FIG. 18A indicates a direction perpendicular to a sample surface. White lines illustrated in FIG. 18B indicate directions of the pellets and a length of the white line indicates a size of the pellet.

Figure 19A:
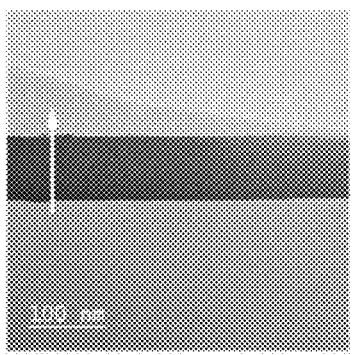
FIGS. 19A and 19B show Cs-corrected high-resolution cross-sectional TEM images of a CAAC-OS.
Figure 19B:
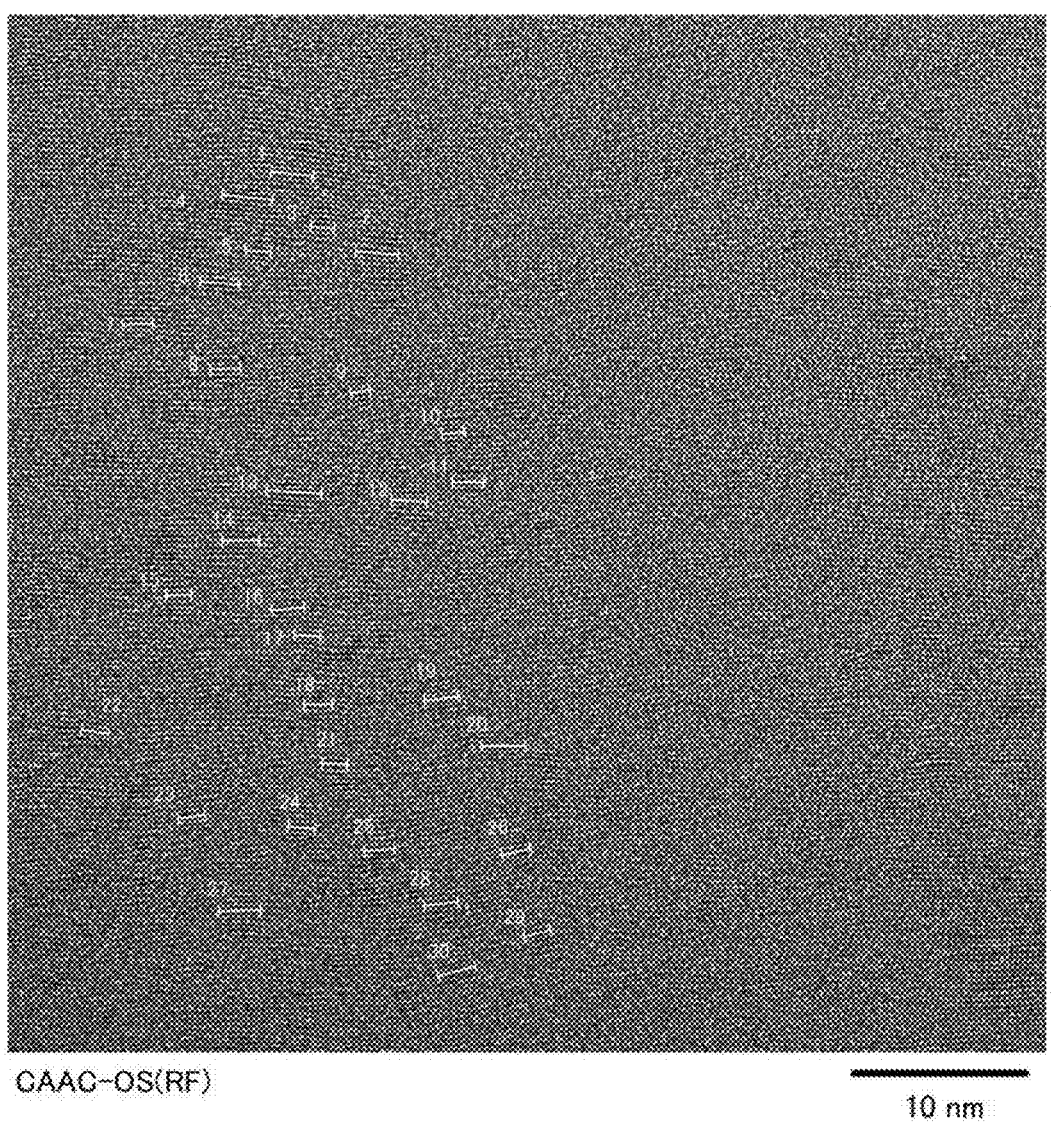
Figure 22B:
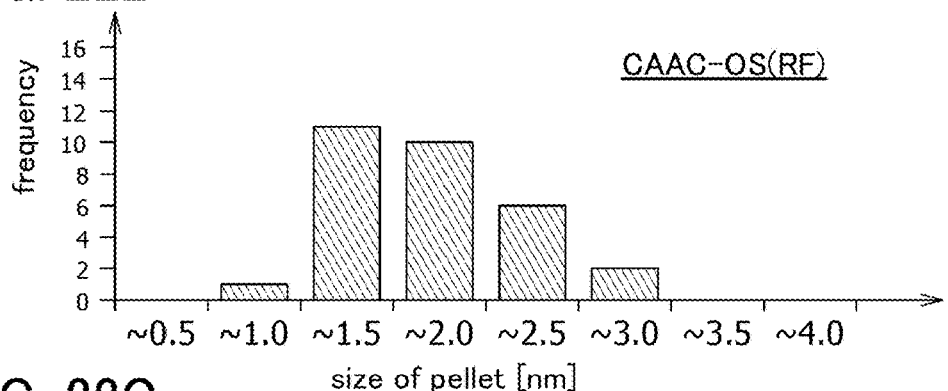

FIG. 19A is a cross-sectional TEM image of the CAAC-OS deposited by an RF sputtering method. FIG. 19B is a Cs-corrected high-resolution cross-sectional TEM image in which part of the TEM image in FIG. 19A is enlarged. In FIG. 19B, the number of pellets is counted and the size and direction thereof are shown in a frequency distribution (see FIG. 22B).

Figure 20A:
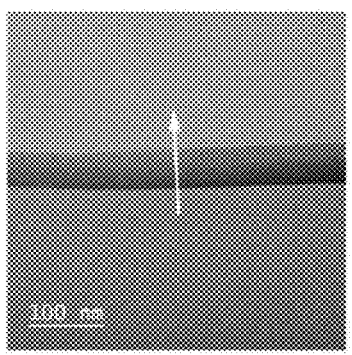
FIGS. 20A and 20B show Cs-corrected high-resolution cross-sectional TEM images of an nc-OS.
Figure 20B:
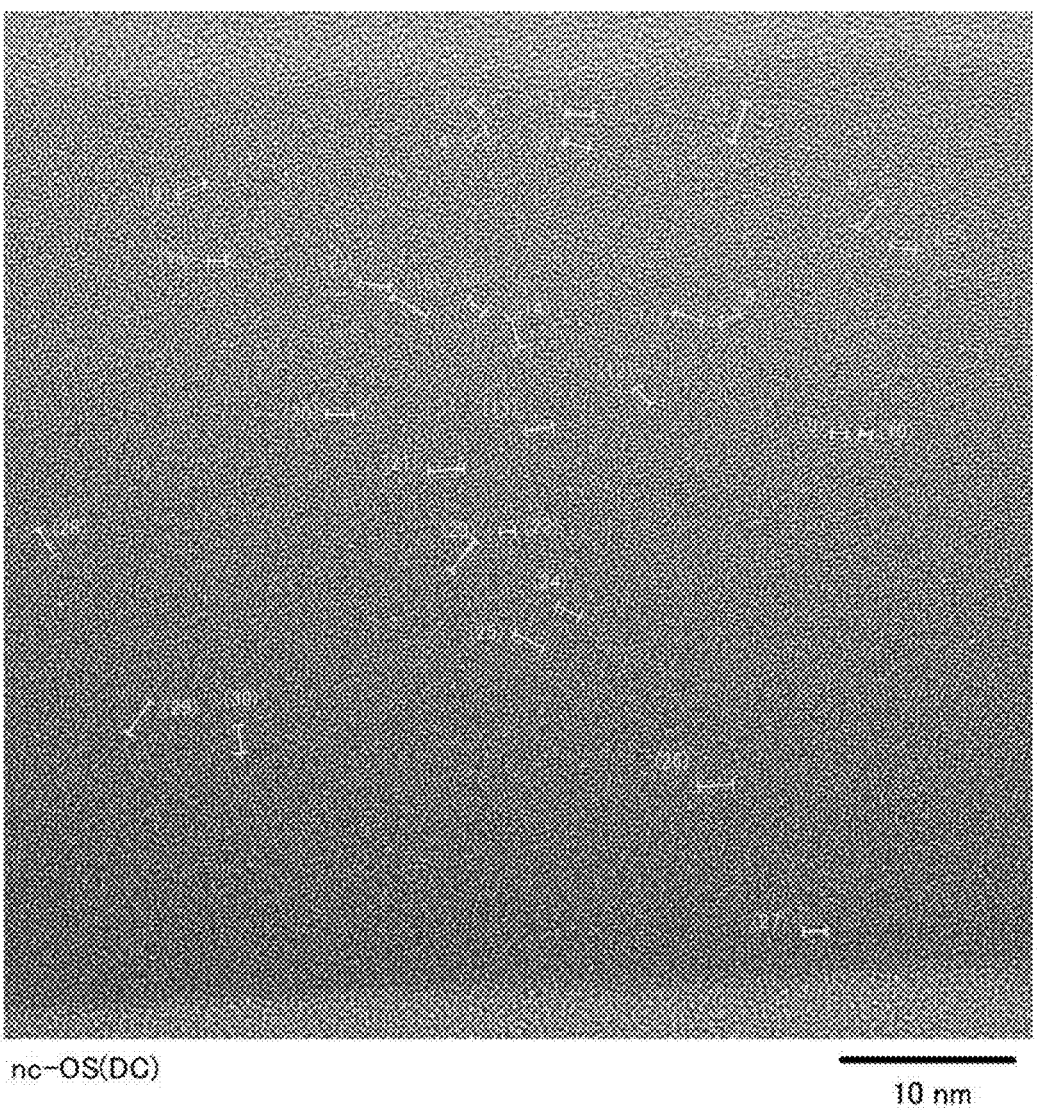
Figure 22C:
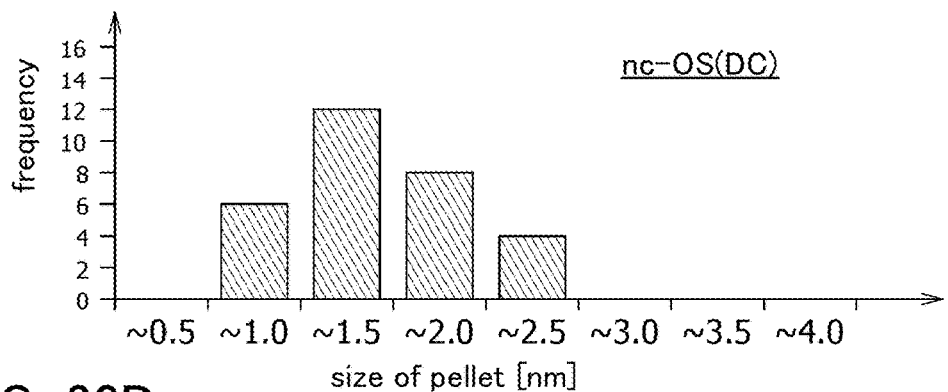

FIG. 20A is a cross-sectional TEM image of the nc-OS deposited by a DC sputtering method. FIG. 20B is a Cs-corrected high-resolution cross-sectional TEM image in which part of the TEM image in FIG. 20A is enlarged. In FIG. 20B, the number of pellets is counted and the size and direction thereof are shown in a frequency distribution (see FIG. 22C).

Figure 21A:
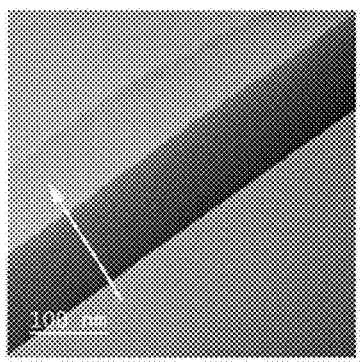
FIGS. 21A and 21B show Cs-corrected high-resolution cross-sectional TEM images of an nc-OS.
Figure 21B:
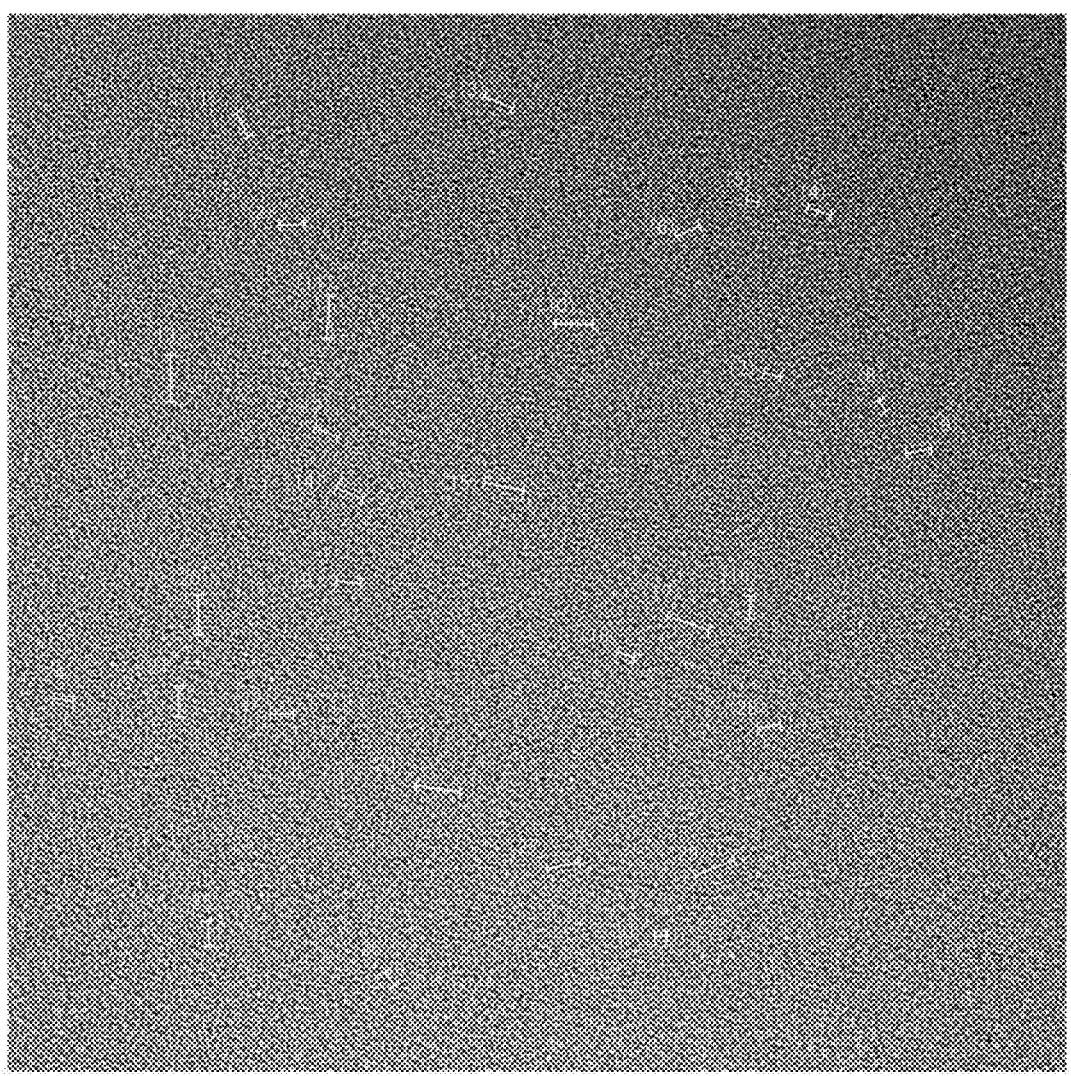
Figure 22D:
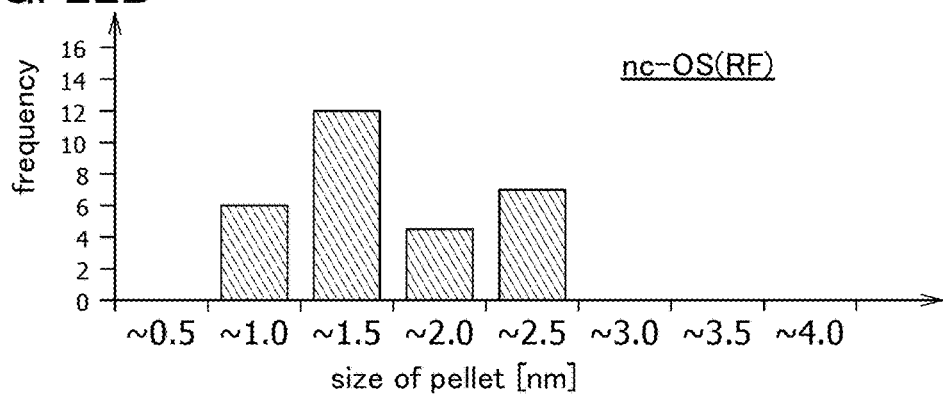

FIG. 21A is a cross-sectional TEM image of the nc-OS deposited by an RF sputtering method. FIG. 21B is a Cs-corrected high-resolution cross-sectional TEM image in which part of the TEM image in FIG. 21A is enlarged. In FIG. 21B, the number of pellets is counted and the size and direction thereof are shown in a frequency distribution (see FIG. 22D).

The results in FIGS. 22A to 22D are shown in the following table. Here, the direction of the pellet indicates an absolute value of an angle to the sample surface.

TABLE 1

| IGZO state | Pellet size | | | | Pellet direction [%] | | |
|---|---|---|---|---|---|---|---|
| | Average value [nm] | Standard deviation σ [nm] | Maximum value [nm] | Minimum value [nm] | 0~30° | 30~60° | 60~90° |
| DC CAAC | 1.74 | 0.39 | 2.6 | 0.97 | 100 | 0 | 0 |
| RF CAAC | 1.73 | 0.42 | 2.69 | 1 | 100 | 0 | 0 |
| | ∨ | | | | ⩔ | ∧ | ∧ |
| DC nc | 1.44 | 0.41 | 2.21 | 0.65 | 63 | 27 | 10 |
| RF nc | 1.47 | 0.52 | 2.42 | 0.63 | 7 | 53 | 40 |

In the nc-OS, for example, the pellet size is preferably larger than or equal to 0.5 nm and smaller than or equal to 3 nm, more preferably larger than or equal to 1 nm and smaller than or equal to 3 nm. Furthermore, the direction of the pellet in the nc-OS is more perpendicular to the sample surface in the RF sputtering method than that in the DC sputtering method. Here, the percentage where the direction of the pellet of the nc-OS to the sample surface is greater than or equal to 0° and less than 30° is preferably 0% or higher and 70% or lower, the percentage where the direction of the pellet to the sample surface is greater than or equal to 30° and less than 60° is preferably 10% or higher and 60% or lower, and the percentage where the direction of the pellet to the sample surface is greater than or equal to 60° and less than 90° is preferably 0% or higher and 60% or lower. The directions of the pellets of the nc-OS are random as compared with those of the CAAC-OS.

An oxide semiconductor film including such a pellet can be described using the following deposition model, for example.

[Deposition Model]

An example of a deposition model of an nc-OS is described below.

FIG. 24 is a schematic diagram of a deposition chamber illustrating a state where the nc-OS film is formed by a sputtering method.

A target 5130 is attached to a backing plate. Under the target 5130 and the backing plate, a plurality of magnets are provided. The plurality of magnets cause a magnetic field over the target 5130. A sputtering method in which the disposition speed is increased by utilizing a magnetic field of magnets is referred to as a magnetron sputtering method.

The target 5130 has a polycrystalline structure in which a cleavage plane exists in at least one crystal grain. Note that the details of the cleavage plane are described later.

A substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol. % or higher) and controlled to higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. Note that the magnetic field over the target 5130 forms a high-density plasma region. In the high-density plasma region, the deposition gas is ionized, so that an ion 5101 is generated. Examples of the ion 5101 include an oxygen cation ($O^+$) and an argon cation ($Ar^+$).

The ion 5101 is accelerated to the target 5130 side by an electric field, and collides with the target 5130 eventually. At this time, a pellet 5100a and a pellet 5100b which are flat-plate-like or pellet-like sputtered particles are separated and sputtered from the cleavage plane. Note that structures of the pellet 5100a and the pellet 5100b may be distorted by an impact of collision of the ion 5101.

The pellet 5100a is a flat-plate-like or pellet-like sputtered particle having a triangle plane, e.g., a regular triangle plane. The pellet 5100b is a flat-plate-like or pellet-like sputtered particle having a hexagon plane, e.g., regular hexagon plane. Note that flat-plate-like or pellet-like sputtered particles such as the pellet 5100a and the pellet 5100b are collectively called pellets. The shape of a flat plane of the pellet is not limited to a triangle or a hexagon. For example, the flat plane may have a shape formed by combining greater than or equal to 2 and less than or equal to 6 triangles. For example, a square is formed by combining two regular triangles in some cases.

The thickness of the pellet is determined depending on the kind of the deposition gas and the like. The thicknesses of the pellets are preferably uniform. In addition, the sputtered particle preferably has a pellet shape with a small thickness as compared to a dice shape with a large thickness.

The pellet receives charge when passing through the plasma, so that side surfaces of the pellet are negatively or positively charged in some cases. The pellet includes an oxygen atom on its side surface, and the oxygen atom may be negatively charged.

As shown in FIG. 24, the pellet flies like a kite in plasma and flutters up to the substrate 5120. Since the pellets are charged, when the pellet gets close to a region where another pellet has already been deposited, repulsion is generated. Here, above the substrate 5120, a magnetic field is generated in a direction parallel to a top surface of the substrate 5120. A potential difference is given between the substrate 5120 and the target 5130, and accordingly, current flows from the substrate 5120 toward the target 5130. Thus, the pellet is given a force (Lorentz force) on the top surface of the substrate 5120 by an effect of the magnetic field and the current. In order to increase a force applied to the pellet, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate is 1.5 times or higher, preferably twice or higher, further preferably 3 times or higher, still further preferably 5 times or higher as high as the magnetic field in a direction perpendicular to the top surface of the substrate 5120.

It is considered that as shown in such a model, the pellets are deposited over the substrate 5120. Thus, an nc-OS film can be deposited even when a surface over which a film is formed (film formation surface) does not have a crystal structure, which is different from film deposition by epitaxial growth. For example, even when a surface (film formation surface) of the substrate 5120 has an amorphous structure, an nc-OS film can be formed.

Since the nc-OS film is deposited in accordance with such a model, the sputtered particle preferably has a pellet shape with a small thickness. Note that in the case where the sputtered particle has a dice shape with a large thickness, planes of the sputtered particles facing the substrate 5120 are not uniform and thus, the thickness and the orientation of the crystals cannot be uniform in some cases.

Furthermore, in the case where the substrate 5120 is heated, resistance such as friction between the pellet and the substrate 5120 is lower. As a result, the pellet glides above the surface of the substrate 5120. The glide of the pellet is caused in a state where the flat plane of the pellet faces the substrate 5120. Then, when the pellet reaches the side surface of another pellet that has been already deposited, the side surfaces of the pellets are bonded, so that a CAAC-OS film is obtained.

In the case where the substrate 5120 is not heated, resistance such as friction between the pellet and the substrate 5120 is higher. As a result, the pellets do not easily glide on the surface of the substrate 5120 and are stacked randomly, thereby forming an nc-OS.

The CAAC-OS is deposited by heating the substrate 5120 while the nc-OS can be deposited without heating the substrate 5120.

Figure 25:
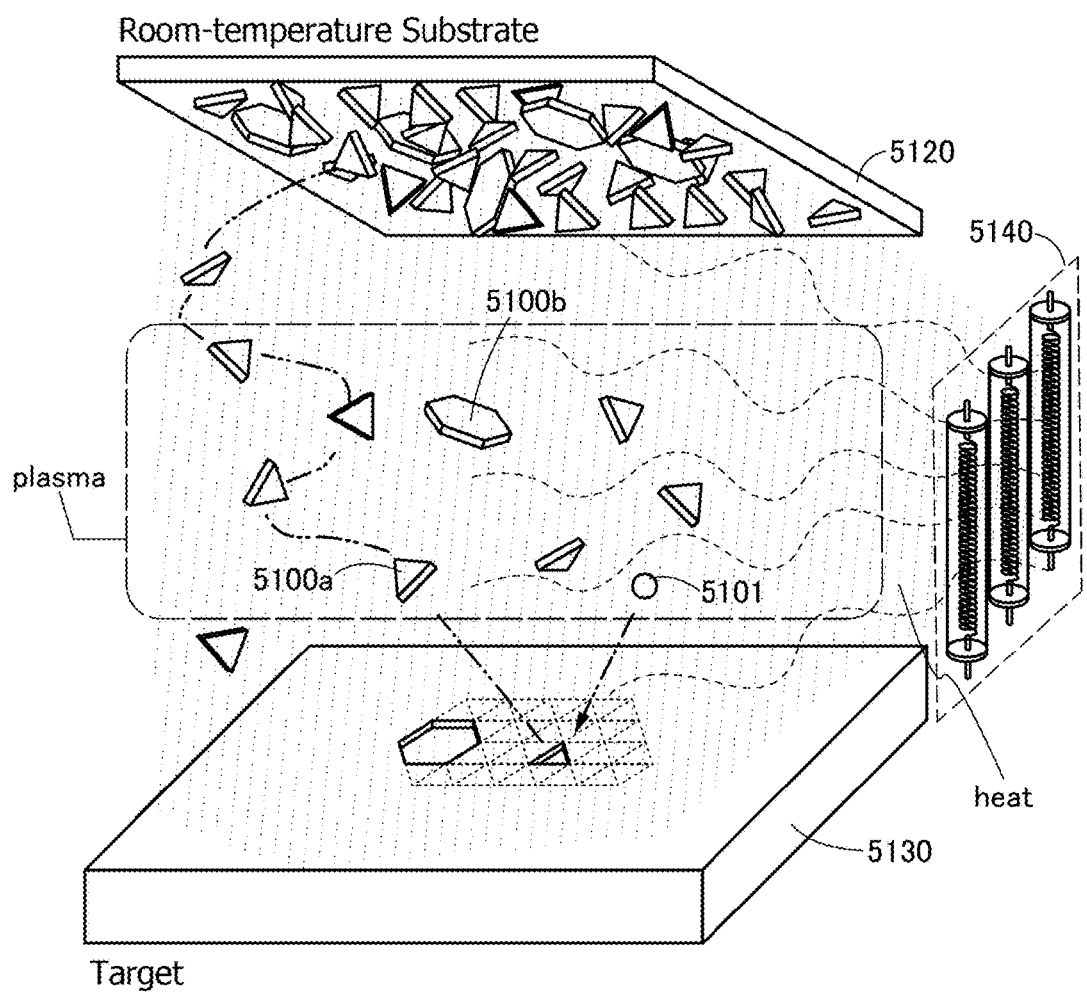
FIG. 25 illustrates a deposition apparatus schematically.

Alternatively, as illustrated in FIG. 25, the atmosphere in the chamber is preferably heated at room temperature or higher and 500° C. or lower, further preferably heated at 200° C. or higher and 400° C. or lower. The atmosphere is preferably heated using a lamp 5140 such as a halogen lamp. By heating the atmosphere, for example, a pellet flying in the chamber is heated, and the defects may be reduced. In addition, the pellet size may be increased. Moreover, when the atmosphere is heated, for example, moisture in the chamber is easily evaporated, and the degree of vacuum can be further increased.

[Cleavage Plane]

A cleavage plane that has been mentioned in the deposition model of the nc-OS will be described below.

Figure 10A:
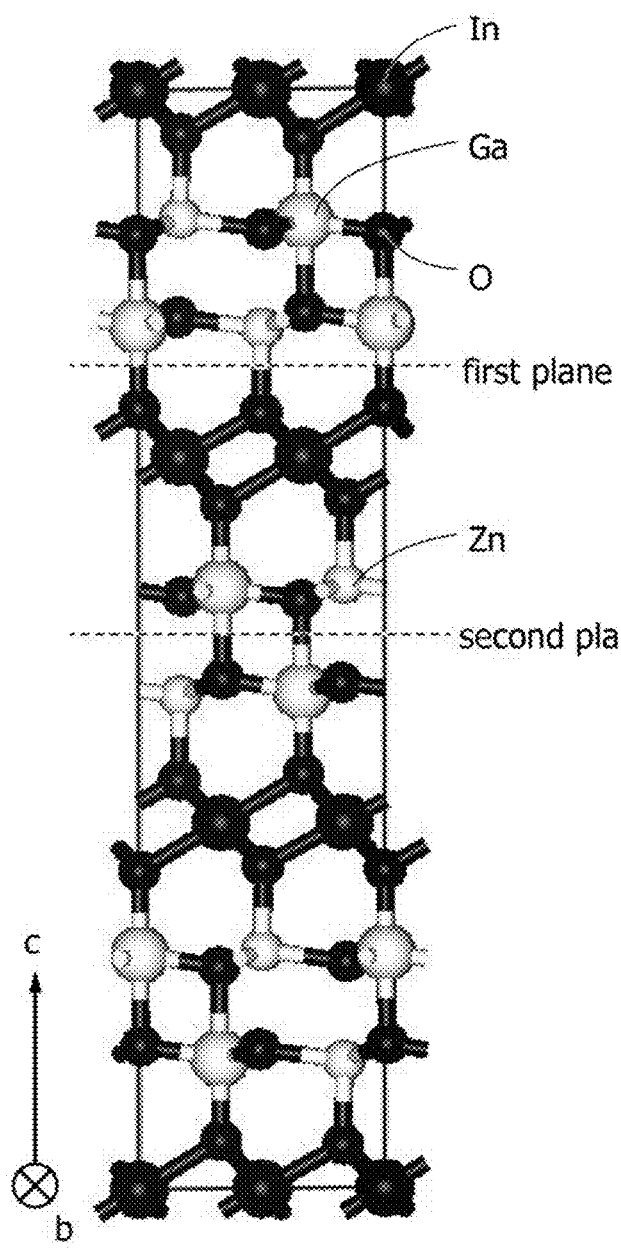
FIGS. 10A and 10B show an InGaZnO$_4$ crystal.
Figure 10B:
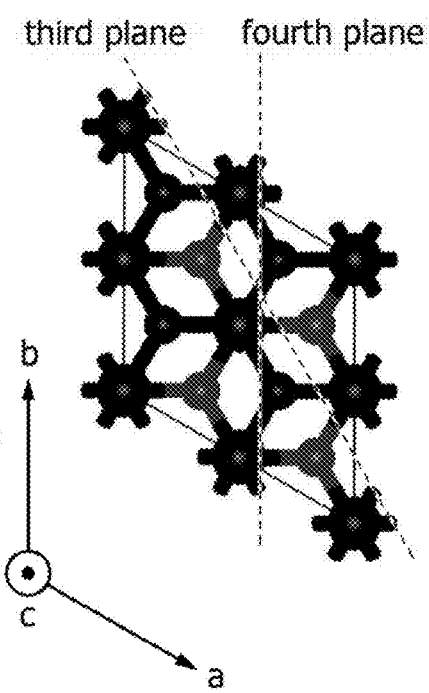

First, a cleavage plane of the target is described with reference to FIGS. 10A and 10B. FIGS. 10A and 10B show the crystal structure of $InGaZnO_4$. Note that FIG. 10A shows the structure of the case where an $InGaZnO_4$ crystal is observed from a direction parallel to the b-axis when the c-axis is in an upward direction. Furthermore, FIG. 10B shows the structure of the case where the $InGaZnO_4$ crystal is observed from a direction parallel to the c-axis.

Energy needed for cleavage at each of crystal planes of the $InGaZnO_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the $InGaZnO_4$ crystal in FIGS. 10A and 10B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (also referred to as the a-b plane) (see FIG. 10A). The second plane is a crystal plane between a Ga—Zn—O layer and a Ga—Zn—O layer and is parallel to the (001) plane (also referred to as the a-b plane) (see FIG. 10A). The third plane is a crystal plane parallel to the (110) plane (see FIG. 10B). The fourth plane is a crystal plane parallel to the (100) plane (also referred to as the b-c plane) (see FIG. 10B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane was 2.60 $J/m^2$, that of the second plane was 0.68 $J/m^2$, that of the third plane was 2.18 $J/m^2$, and that of the fourth plane was 2.12 $J/m^2$ (see Table 2).

TABLE 2

|  | Cleavage energy [$J/m^2$] |
| --- | --- |
| First plane | 2.60 |
| Second plane | 0.68 |
| Third plane | 2.18 |
| Fourth plane | 2.12 |

From the calculations, in the structure of the $InGaZnO_4$ crystal in FIG. 10A and 10B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between the Ga—Zn—O layer and the Ga—Zn—O layer, the $InGaZnO_4$ crystals in FIG. 10A can be separated at a plane equivalent to two second planes. Therefore, in the case where an ion or the like is made to collide with a target, a wafer-like unit (we call this a pellet) which is cleaved at a plane with the lowest cleavage energy is thought to be blasted off as the minimum unit. In that case, a pellet of $InGaZnO_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (also referred to as the b-c plane)) are lower than that of the first plane (crystal plane between the Ga—Zn—O layer and the In—O layer and plane that is parallel to the (001) plane (also referred to as the a-b plane)), which suggests that most of the flat planes of the pellets have triangle shapes or hexagonal shapes.

[Film Density]

Next, the density of the In-M-Zn oxide film was evaluated. An nc-OS film was deposited by a DC sputtering method using a polycrystalline In—Ga—Zn oxide having an atomic ratio of In:Ga:Zn=1:1:1 as a target. The pressure was 0.4 Pa, the deposition temperature was room temperature, the power supply was 100 W, and argon and oxygen were used as deposition gases at the flow rates of 98 sccm and 2 sccm, respectively. The density of the obtained In—Ga—Zn oxide was 6.1 g/cm$^3$. According to Non-Patent Document 2, the density of single-crystal InGaZnO$_4$ is 6.357 g/cm$^3$. Furthermore, as in JCPDS card no. 00-038-1097, the density of single-crystal In$_2$Ga$_2$ZnO$_7$ is 6.494 g/cm$^3$. Thus, the obtained nc-OS film is an excellent film having high density.

The density of the In-M-Zn oxide film that is an oxide semiconductor film of one embodiment of the present invention is preferably 85% or higher of the density of single crystal having substantially the same atomic ratio as that of the In-M-Zn oxide, further preferably 90% or higher thereof, further preferably 95% or higher thereof.

Alternatively, in the case where the element M is gallium, the density of the oxide semiconductor film of one embodiment of the present invention is preferably, for example, higher than or equal to 5.7 g/cm$^3$ and lower than or equal to 6.49 g/cm$^3$, further preferably higher than or equal to 5.75 g/cm$^3$ and lower than or equal to 6.49 g/cm$^3$, further preferably higher than or equal to 5.8 g/cm$^3$ and lower than or equal to 6.33 g/cm$^3$, further preferably higher than or equal to 5.85 g/cm$^3$ and lower than or equal to 6.33 g/cm$^3$.

Here, substantially the same atomic ratios indicate that the difference of the atomic ratios is within 10%.

The density of single crystal may be estimated from the density of two or more In-M-Zn oxide films having different atomic ratios. Here, the density of single crystal having an atomic ratio of In:M:Zn=1:1:1 is $D_1$, and the density of single crystal having an atomic ratio of In:M:Zn=2:2:1 is $D_2$. The density of an In-M-Zn oxide film having an atomic ratio of In:M:Zn=1:1:0.8 is expected to be set to a value between $D_1$ and $D_2$. Thus, for the density of single crystal, for example, an average value of $D_1$ and $D_2$ may be calculated and referred to, or a value of either $D_1$ or $D_2$, e.g., a value closer to the atomic ratio may be referred to. When the average value is calculated using $D_1$ and $D_2$, for example, $0.6 \times D_1 + 0.4 \times D_2$ may be used. Furthermore, the density of single crystal having an atomic ratio of In:M:Zn=A:B:C is $D_\alpha$, and the density of single crystal having an atomic ratio of In:M:Zn=D:E:F is $D_\beta$. The density of single crystal having an atomic ratio of In:M:Zn=X:Y:Z may be calculated in the following manner, for example.

First, $\alpha$ and $\beta$ are calculated so as to be $(\alpha A+\beta D):(\alpha B+\beta E):(\alpha C+\beta F)=X:Y:Z$. Then, the obtained $\alpha$ and $\beta$ are used to calculate the density of the single crystal using $\{\alpha/(\alpha+\beta)\}D_\alpha+\{\beta/(\alpha+\beta)\}D_\beta$.

Next, an example of a formation method of the nc-OS film is described.

As examples of a general method for forming an oxide semiconductor film, a sputtering method; a chemical vapor deposition (CVD) method such as a metal organic chemical vapor deposition (MOCVD) method, an atomic layer deposition (ALD) method, and a plasma-enhanced chemical vapor deposition (PECVD) method; a vacuum evaporation method; and a pulse laser deposition (PLD) method are given.

The nc-OS film is preferably formed by a sputtering method. As a target used in a sputtering method, an In-M-Zn oxide can be used.

Furthermore, a target preferably includes a polycrystalline In-M-Zn oxide. For example, in the case where a target including a polycrystalline In-M-Zn oxide is used, the target can be cleaved and an nc-OS film can be easily formed, which is preferable.

Although an In-M-Zn oxide can be formed using a mixture of an indium oxide, oxide including an element M, and a zinc oxide as a target in some cases, the target including the polycrystalline In-M-Zn oxide is preferably used.

Furthermore, the nc-OS film can be formed at about room temperature in some cases, which is preferable. For example, the nc-OS film can be formed without heating a substrate, which is preferable. Alternatively, the atmosphere in the chamber may be heated at room temperature or higher and 500° C. or lower, and preferably heated at 200° C. or higher and 400° C. or lower.

[Atomic Ratio]

Here, as an oxide semiconductor film of one embodiment of the present invention, an In-M-Zn oxide film is preferably used, for example. The ratio of In atoms to M atoms and Zn atoms of the In-M-Zn oxide is represented by x:y:z.

In the In-M-Zn oxide film, which is an oxide semiconductor film of one embodiment of the present invention, the proportion of indium is preferably increased.

It is preferable that the number of grain boundaries be as few as possible. As examples of the non-single-crystal oxide semiconductor film with few grain boundaries, an nc-OS film and a CAAC-OS film can be given. Furthermore, the oxide semiconductor film may include both of the nc-OS film and the CAAC-OS film.

The oxide semiconductor film of one embodiment of the present invention preferably includes a region where a diffraction pattern of the nc-OS film (nc structure) is observed by nanobeam electron diffraction. Furthermore, the oxide semiconductor film of one embodiment of the present invention may include a region where a diffraction pattern of the nc-OS film is observed and a region where a diffraction pattern of the CAAC-OS film is observed (CAAC structure).

The oxide semiconductor film of one embodiment of the present invention preferably has a high nc proportion. For example, the nc proportion is preferably higher than or equal to 30%, further preferably higher than or equal to 50%, further preferably higher than or equal to 80%. In the oxide semiconductor film of one embodiment of the present invention, the sum of the nc proportion and the CAAC proportion is preferably higher than or equal to 80%, further preferably higher than or equal to 90% and lower than or equal to 100%, further preferably higher than or equal to 95% and lower than or equal to 100%, further preferably higher than or equal to 98% and lower than or equal to 100%, further preferably higher than or equal to 99% and lower than or equal to 100%.

The oxide semiconductor film of one embodiment of the present invention may be formed by stacking a plurality of films. The nc proportions and the CAAC proportions of the respective plurality of films may be different from each other. Furthermore, at least one film of the stacked plurality of films preferably has a high nc proportion. For example, the nc proportion is preferably higher than or equal to 30%, further preferably higher than or equal to 50%, further preferably higher than or equal to 80%. In at least one film of the stacked plurality of films, the sum of the nc proportion and the CAAC proportion is preferably higher than or equal to 80%, further preferably higher than or equal to 90% and lower than or equal to 100%, further preferably higher than or equal to 95% and lower than or equal to 100%, further preferably higher than or equal to 98% and lower than or equal to 100%, further preferably higher than or equal to 99% and lower than or equal to 100%.

As illustrated in FIG. 6, Non-Patent Document 1 discloses that when powders of $In_2O_3$, $Ga_2O_3$, and ZnO are mixed and sintered at 1350° C., the proportion of zinc is increased and the solid solution range becomes wider. Here, when the atomic ratio of the In—Ga—Zn oxide is within the range which allows a solid solution range, the CAAC proportion of the oxide semiconductor film of one embodiment of the present invention is further increased in some cases. Therefore, when the proportion of zinc is reduced, the nc proportion of the oxide semiconductor film of one embodiment of the present invention can be further increased in some cases. The atomic ratio of indium to the element M and zinc contained in an oxide semiconductor film is represented by x:y:z. For example, when the proportion of x+y to z, i.e., (x+y)/z, is increased, the nc proportion can be further increased in some cases. Specifically, for example, (x+y)>z is preferable, (x+y)≥1.5z is further preferable, and (x+y)≥2z is further preferable.

When crystal with a spinel structure is mixed into the CAAC-OS film or the nc-OS film, a clear grain boundary or boundary portion might be formed. Thus, it is preferable that the atomic ratio of the oxide semiconductor film not be closer to the atomic ratio with which crystal with a spinel crystal structure is easily formed.

Therefore, the atomic ratio of indium to the element M and zinc, x:y:z, of the In-M-Zn oxide film that is the oxide semiconductor film of one embodiment of the present invention is preferably an atomic ratio in an area 13 shown in FIG. 4A, further preferably an atomic ratio in an area 14 shown in FIG. 4B. Here, the area 13 is an area surrounded by line segments that connect first coordinates K (x:y:z=8:14:7), second coordinates R (x:y:z=2:4:3), third coordinates V (x:y:z=1:2:3), fourth coordinates S (x:y:z=1:0:1), fifth coordinates T (x:y:z=8:0:1), sixth coordinates U (x:y:z=6:2:1), and the first coordinates K in this order. Note that the area 13 also includes line segments that connect the six points. In addition, all the coordinates are included in the area 13. Furthermore, the area 14 is an area surrounded by line segments that connect first coordinates K (x:y:z=8:14:7), second coordinates R (x:y:z=2:4:3), third coordinates V (x:y:z=1:2:3), fourth coordinates W (x:y:z=7:1:8), fifth coordinates X (x:y:z=7:1:1), sixth coordinates U (x:y:z=6:2:1), and the first coordinates K in this order. Note that the area 14 also includes line segments that connect the six points. In addition, all the coordinates are included in the area 14.

In the case where the oxide semiconductor film is formed by a sputtering method, the atomic ratio of an obtained film is deviated from the atomic ratio of the target in some cases. Especially for zinc, the proportion of zinc of the obtained film is smaller than that of zinc atoms of the target in some cases. Specifically, the proportion of zinc of the obtained film may be approximately 40 atomic % to 90 atomic % of the proportion of zinc of the target.

Here, the relation between the atomic ratio of a target and the atomic ratio of an obtained film in the case where an In—Ga—Zn oxide is deposited by a sputtering method is investigated.

As for the deposition conditions, argon and oxygen were used as deposition gases and the flow rate percentage of oxygen was 33%. Here, the flow rate percentage of oxygen is expressed by (the flow rate of oxygen)÷((the flow rate of oxygen)+(the flow rate of argon))×100 [%]. In addition, the pressure was in the range of 0.4 Pa to 0.7 Pa, the substrate temperature was 200° C. to 300° C., and the power supply (DC) was 0.5 kW.

Figure 23A:
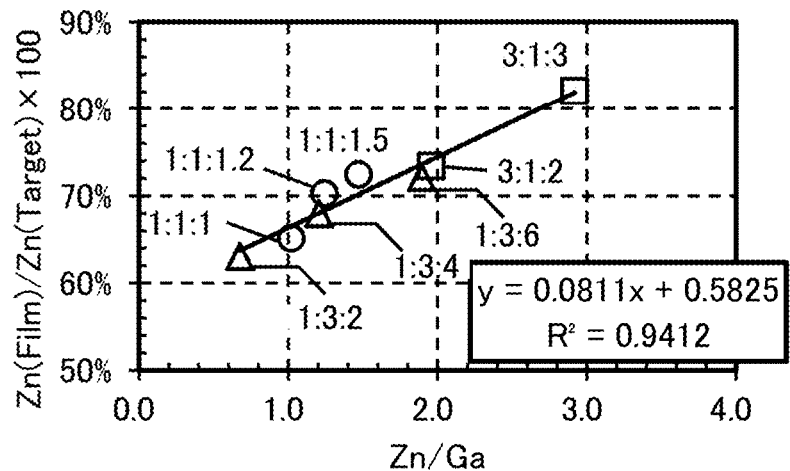
FIGS. 23A to 23C each show a relation between an atomic ratio of a target and an atomic ratio of an oxide semiconductor film.
Figure 23B:
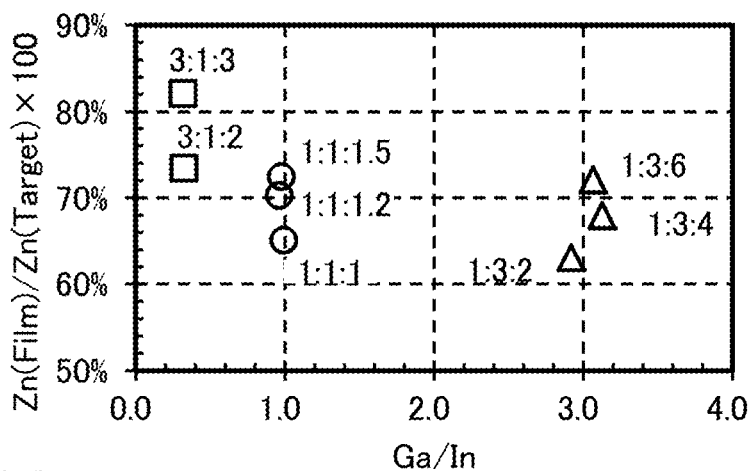
Figure 23C:
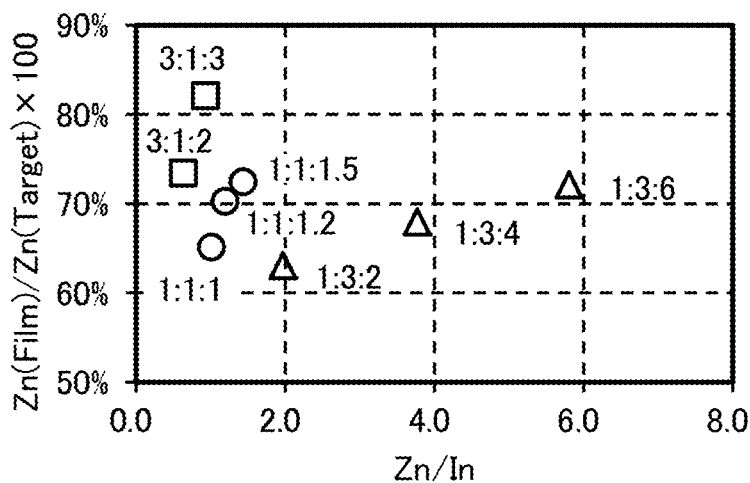

FIGS. 23A to 23C each show the relation between the atomic ratio of two elements of the target and a percentage of remaining zinc. Numbers in FIGS. 23A to 23C each represent the atomic ratio of In:Ga:Zn of the target. Here, the percentage of remaining zinc is described. A value obtained by dividing a value of a term of zinc atoms of the atomic ratio of an obtained film by a total value of terms of indium, gallium, and zinc atoms of the film is referred to as Zn(Film). Furthermore, a value obtained by dividing a value of a term of zinc atoms of the atomic ratio of the target by a total value of terms of indium, gallium, and zinc atoms of the target is referred to as Zn(Target). Here, the percentage of remaining zinc (A) is defined as follows: A=Zn(Film)÷Zn(Target)×100 [%].

The atomic ratio of indium to gallium and zinc of the In—Ga—Zn oxide target is referred to as a:b:c.

In FIG. 23A, the horizontal axis represents the atomic ratio of zinc to gallium (c/b) of the target, in FIG. 23B the horizontal axis represents the atomic ratio of gallium to indium (b/a) of the target, and in FIG. 23C, the horizontal axis represents the atomic ratio of zinc to indium (c/a) of the target. Furthermore, each vertical axis represents the percentage of remaining zinc (A).

Here, according to FIGS. 23A to 23C, the percentages of remaining zinc of the obtained films by a sputtering method are 50% to 90% approximately. Furthermore, there is no large difference in the atomic ratio of indium to gallium between the oxide semiconductor film and the target as compared to zinc. In addition, for example, when the atomic ratio of zinc to gallium (c/b) is 1, 2, and 3, the percentage of remaining zinc (A) is approximately 66%, 74%, and 83%, respectively.

In addition, FIG. 23A indicates that there is a favorable correlation between the atomic ratio of zinc to gallium (c/b) of the target and the percentage of remaining zinc. That is, as the ratio of zinc to gallium becomes smaller, the remaining percentage is reduced.

Figure 5:
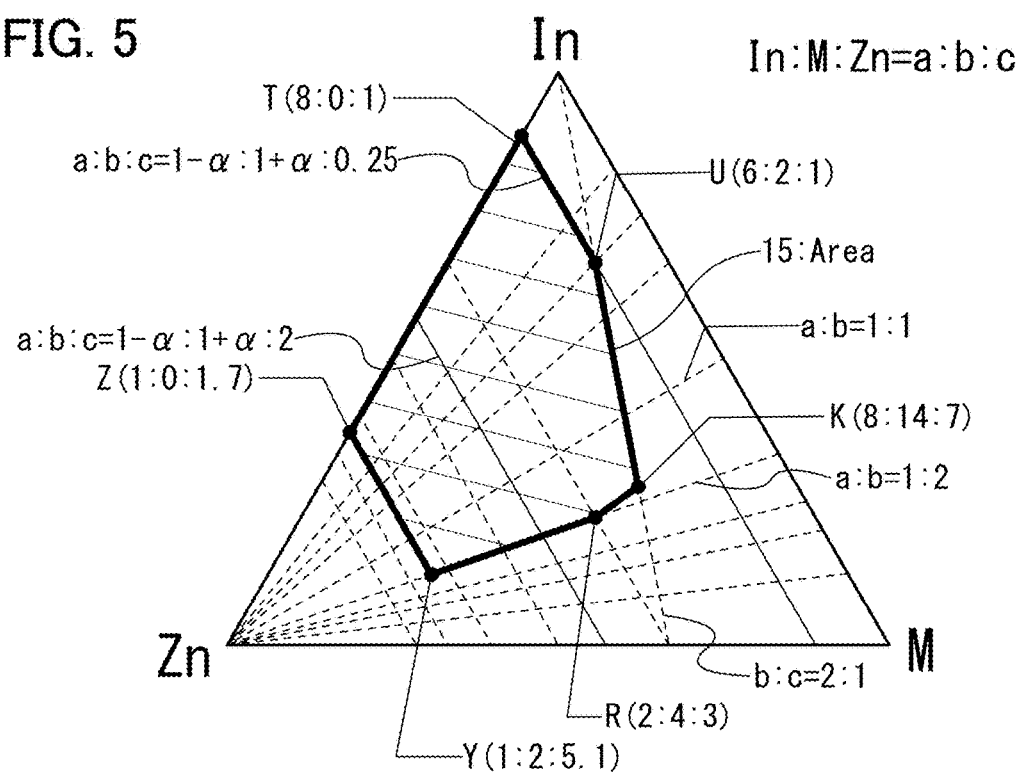
FIG. 5 illustrates an atomic ratio of a target of one embodiment of the present invention.

In view of the above, to obtain the oxide semiconductor film in the area 13 shown in FIG. 4A by a sputtering method, for example, the proportion of zinc in the target is preferably 1.7 times or higher, further preferably 1.5 times or higher than that in the film to be formed. Thus, indium, gallium, and zinc in the target preferably has an atomic ratio in an area 15 illustrated in FIG. 5. Here, the area 15 is an area surrounded by line segments that connect first coordinates K (a:b:c=8:14:7), second coordinates R (a:b:c=2:4:3), third coordinates Y (a:b:c=1:2:5.1), fourth coordinates Z (a:b:c=1:0:1.7), fifth coordinates T (a:b:c=8:0:1), sixth coordinates U (a:b:c=6:2:1), and the first coordinates K in this order. Note that the area 15 also includes line segments that connect the six points. In addition, all the coordinates are included in the area 15.

At least part of this embodiment can be implemented in combination with any of the other embodiments described in this specification as appropriate.

(Embodiment 3)

In this embodiment, an example of a transistor including an oxide semiconductor film, which is one embodiment of the present invention, is described.

TRANSISTOR EXAMPLE 1

Figure 12C:
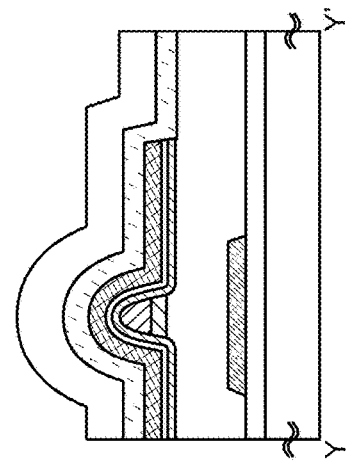
FIGS. 12A to 12C illustrate an example of a transistor of one embodiment of the present invention.

An example of a transistor including an oxide semiconductor film is described with reference to FIGS. 12A to 12C.

Figure 12A:
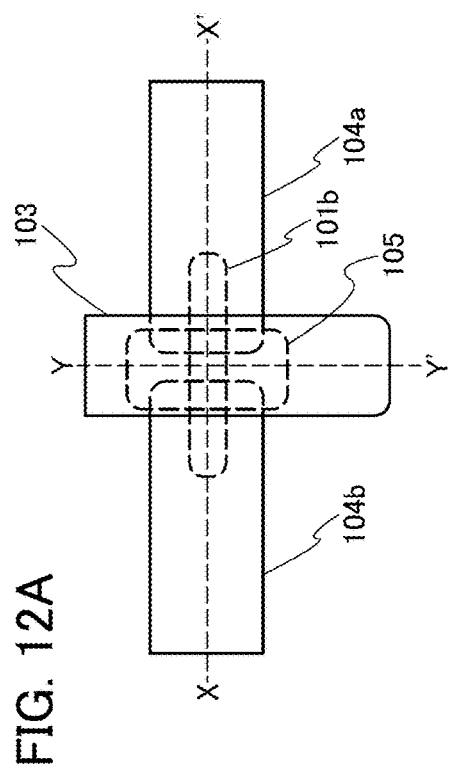

FIG. 12A is a top view of a transistor 100. FIG. 12B shows a cross section taken along dashed dotted line X-X' in FIG. 12A, and FIG. 12C is a cross section taken along dashed dotted line Y-Y' in FIG. 12A. The transistor 100 in FIGS. 12A to 12C includes a substrate 50, an insulating film 51 in contact with a top surface of the substrate 50, an insulating film 114 in contact with a top surface of the insulating film 51, a semiconductor layer 101 in contact with a top surface of the insulating film 114, conductive layers 104a and 104b, a gate insulating film 102 over the semiconductor layer 101, and a gate electrode 103 overlapping the semiconductor layer 101 with the gate insulating film 102 positioned therebetween. The transistor 100 is covered with an insulating film 112 and an insulating film 113. Furthermore, the transistor 100 may include a conductive layer 105. The insulating film is not necessarily provided between the substrate 50 and the insulating film 114.

The semiconductor layer 101 may be formed of a single layer but is preferably formed with a stacked-layer structure of a first layer, a second layer, and a third layer. The second layer is provided over and in contact with the first layer, and the third layer is provided over and in contact with the second layer. Here, in the transistor of one embodiment of the present invention, the first layer and the third layer each have a region in which current does not easily flow as compared with the second layer. Therefore, the first layer and the third layer each may be referred to as an insulating layer. Thus, the semiconductor layer 101 is preferably formed with a stacked-layer structure of an insulating layer 101a, a semiconductor layer 101b, and an insulating layer 101c as in the example illustrated in FIGS. 12A to 12C. Alternatively, either the insulating layer 101a or the insulating layer 101c may be omitted. In the example shown in FIGS. 12A to 12C, the semiconductor layer 101b is in contact with a top surface of the insulating layer 101a. The conductive layers 104a and 104b are in contact with the top surface of the semiconductor layer 101b and are apart from each other in a region overlapping with the semiconductor layer 101b. The insulating layer 101c is in contact with the top surface of the semiconductor layer 101b. The gate insulating film 102 is in contact with the top surface of the insulating layer 101c. The gate electrode 103 overlaps the semiconductor layer 101b with the gate insulating film 102 and the insulating layer 101c positioned therebetween.

The transistor 100 is covered with the insulating film 112 and the insulating film 113. The insulating films 112 and 113 are described in detail in the following embodiment.

The conductive layer 104a and the conductive layer 104b function as a source electrode and a drain electrode. A voltage lower or higher than that of the source electrode may be applied to the conductive layer 105 so that the threshold voltage of the transistor may be shifted in the positive or negative direction. By shifting the threshold voltage of the transistor in the positive direction, a normally-off transistor in which the transistor is in a non-conduction state (off state) when the gate voltage is 0 V can be achieved in some cases. Note that the voltage applied to the conductive layer 105 may be variable or fixed. In the case where a variable voltage is applied to the conductive layer 105, a circuit for controlling the voltage may be connected to the conductive layer 105. Furthermore, the conductive layer 105 may be connected to the gate electrode 103.

It is preferable that the top surface of the insulating film 114 be planarized by a chemical mechanical polishing (CMP) method or the like.

The insulating film 114 preferably includes oxide. In particular, the insulating film 114 preferably includes an oxide material from which part of oxygen is released by heating. The insulating film 114 preferably includes an oxide containing oxygen in excess of that in the stoichiometric composition. Part of oxygen is released by heating from the oxide film containing oxygen in excess of that in the stoichiometric composition. Oxygen released from the insulating film 114 is supplied to the semiconductor layer 101 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen in excess of that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. As the metal oxide, aluminum oxide, aluminum oxynitride, gallium oxide, gallium oxynitride, yttrium oxide, yttrium oxynitride, hafnium oxide, or hafnium oxynitride can be used. Note that in this specification, "silicon oxynitride" refers to a material that contains oxygen at a higher proportion than nitrogen, and "silicon nitride oxide" refers to a material that contains nitrogen at a higher proportion than oxygen.

In order that the insulating film 114 includes excess oxygen, a region containing excess oxygen may be formed in the insulating film 114 by introduction of oxygen into the insulating film 114. For example, oxygen (at least including any of oxygen radicals, oxygen atoms, and oxygen ions) is introduced into the insulating film 114 which has been deposited, whereby a region containing excess oxygen is formed. Oxygen can be introduced by an ion implantation method, an ion doping method, a plasma immersion ion implantation method, plasma treatment, or the like.

The semiconductor layer 101 is formed using an oxide semiconductor. A semiconductor material having a wider band gap and a lower carrier density than silicon is preferably used in the oxide semiconductor because off-state current of the transistor can be reduced. When the semiconductor layer 101 is formed using an oxide semiconductor, a highly reliable transistor in which a change in the electrical characteristics is suppressed can be provided.

As the semiconductor layer 101, for example, the oxide semiconductor described in Embodiment 1 or Embodiment 2 can be used.

Note that in this specification and the like, in the case of the substantially purified oxide semiconductor layer, the carrier density thereof is lower than $1 \times 10^{17}$/cm$^3$, lower than $1 \times 10^{15}$/cm$^3$, or lower than $1 \times 10^{13}$/cm$^3$. With a highly purified intrinsic oxide semiconductor layer, the transistor can have stable electrical characteristics.

Here, the case where a stacked-layer film of the insulating layer 101a, the semiconductor layer 101b, and the insulating layer 101c is used as the semiconductor layer 101 is described in detail. As the semiconductor layer 101b, an oxide which has higher electron affinity than the insulating layer 101a and the insulating layer 101c is preferably used. For example, for the semiconductor layer 101b, an oxide having an electron affinity higher than that of each of the insulating layer 101a and the insulating layer 101c by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the conduction band minimum.

An oxide which has higher electron affinity than the insulating layers 101a and 101c is used for the semiconductor layer 101b, whereby when an electric field is applied to the gate electrode, a channel is formed in the semiconductor layer 101b that has the highest electron affinity among the insulating layer 101a, the semiconductor layer 101b, and the insulating layer 101c. Here, when the channel is formed in the semiconductor layer 101b, for example, the channel formation region is apart from the interface with the gate insulating film 102; as a result, influence of scattering at the interface with the gate insulating film can be reduced. Thus, the field effect mobility of the transistor can be increased. Here, as described later, the semiconductor layer 101b and the insulating layer 101c have the common constituent element and thus interface scattering hardly occurs therebetween.

Furthermore, in the case where a silicon oxide film, a silicon oxynitride film, a silicon nitride oxide film, a silicon nitride film, or the like is used as the gate insulating film, silicon contained in the gate insulating film enters the oxide semiconductor film in some cases. When silicon is contained in the oxide semiconductor film, a decrease in crystallinity of the oxide semiconductor film, a decrease in carrier mobility, or the like might occur. Therefore, to reduce the impurity concentration, for example, the silicon concentration, of the semiconductor layer 101b where the channel is formed, it is preferable that the insulating layer 101c be provided between the semiconductor layer 101b and the gate insulating film. For a similar reason, to reduce influence of an impurity diffused from the insulating film 114, it is preferable that the insulating layer 101a be provided between the semiconductor layer 101b and the insulating film 114.

As the semiconductor layer 101b, for example, an oxide semiconductor film containing indium, an element M, and zinc may be used. For example, the oxide semiconductor film described in Embodiment 1 or Embodiment 2 is preferably used.

For the semiconductor layer 101b, an oxide with a wide energy gap is used. The energy gap of the semiconductor layer 101b is, for example, larger than or equal to 2.5 eV and smaller than or equal to 4.2 eV, preferably larger than or equal to 2.7 eV and smaller than or equal to 3.7 eV, further preferably larger than or equal to 2.8 eV and smaller than or equal to 3.3 eV.

Next, the insulating layer 101a and the insulating layer 101c are described. For example, the insulating layer 101a and the insulating layer 101c are each an oxide which includes one or more kinds of elements other than oxygen that are contained in the semiconductor layer 101b. Since the insulating layer 101a and the insulating layer 101c are each formed using one or more kinds of elements other than oxygen that are contained in the semiconductor layer 101b, interface states are less likely to be formed at the interface between the insulating layer 101a and the semiconductor layer 101b and the interface between the semiconductor layer 101b and the insulating layer 101c.

Figure 11:
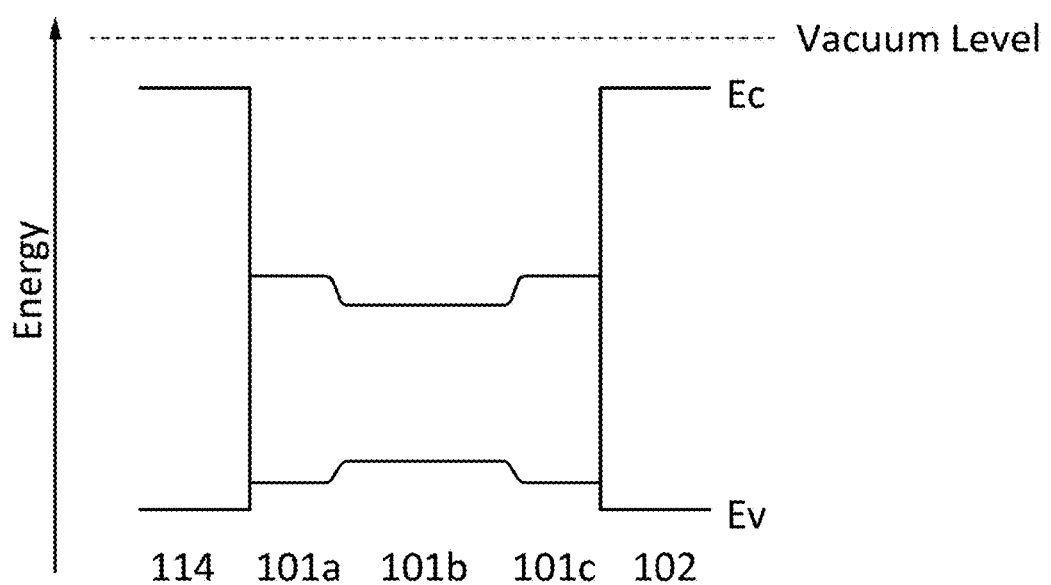
FIG. 11 illustrates a band structure of part of a transistor of one embodiment of the present invention.

FIG. 11 illustrates a band structure. FIG. 11 shows a vacuum level (denoted by vacuum level), and the conduction band minimum (denoted by Ec) and the valence band maximum (denoted by Ev) of each of the layers.

Here, a mixed region of the insulating layer 101a and the semiconductor layer 101b might exist between the insulating layer 101a and the semiconductor layer 101b. Furthermore, a mixed region of the semiconductor layer 101b and the insulating layer 101c might exist between the semiconductor layer 101b and the insulating layer 101c. The mixed region has a low density of interface states. For that reason, the stack including the semiconductor layers 101a, 101b, and 101c has a band structure where energy at each interface and in the vicinity of the interface is changed continuously (continuous junction).

At this time, electrons mainly move not in the insulating layer 101a and the insulating layer 101c but in the semiconductor layer 101b. As described above, when the interface state density at the interface between the insulating layer 101a and the semiconductor layer 101b and the interface state density at the interface between the semiconductor layer 101b and the insulating layer 101c are lowered, the on-state current of the transistor can be increased without interruption of the movement of electrons in the semiconductor layer 101b.

Note that FIG. 11 illustrates the case where the Ec of the insulating layer 101a and the Ec of the insulating layer 101c are equal to each other; however, they may be different from each other. For example, Ec of the insulating layer 101c may be higher than Ec of the insulating layer 101a.

Figure 12B:
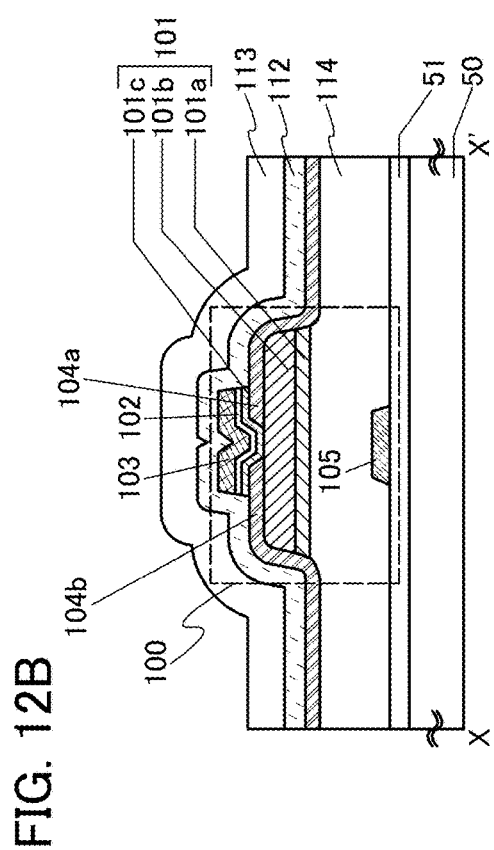

As illustrated in FIG. 12B, the side surface of the semiconductor layer 101b is in contact with the conductive layer 104a and the conductive layer 104b. Furthermore, as illustrated in FIG. 12C, the semiconductor layer 101b can be electrically surrounded by an electric field of the gate electrode 103 (a structure in which a semiconductor is electrically surrounded by an electric field of a conductor is referred to as a surrounded channel (s-channel) structure). Since the gate electrode 103 is provided so as to face top and side surfaces of the semiconductor layer 101b, a channel is formed not only in the vicinity of the top surface but also in the entire semiconductor layer 101b (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm. In particular, as the channel width is small, a region where the channel is formed spreads inside the semiconductor layer 101b; thus, the on-state current is increased as the transistor is miniaturized.

In the insulating layer 101a and the insulating layer 101c, an In-M-Zn oxide can be used.

An indium gallium oxide has small electron affinity and a high oxygen-blocking property. Therefore, for example, the insulating layer 101c may contain indium gallium oxide. The gallium atomic ratio [Ga/(In+Ga)] is, for example, higher than or equal to 70%, preferably higher than or equal to 80%, more preferably higher than or equal to 90%.

Furthermore, in the insulating layer 101c, gallium oxide is preferably contained. When the gallium oxide is contained in the insulating layer 101c, lower off-state current can be obtained.

Here, nc-OS films and CAAC-OS films are preferably used as the semiconductor layers 101a and 101c. Here, by an increase in the nc proportion and the CAAC proportion of the insulating layer 101a and the insulating layer 101c, defects can be reduced, an area having a spinel crystal can be reduced, carrier scattering can be reduced, and the CAAC-OS film can be a film having a high blocking property against impurities, for example. Furthermore, mixing of impurities to the semiconductor layer 101b can be suppressed; as a result, the impurity concentration of the semiconductor layer 101b can be reduced.

Each of the nc proportions of the insulating layer 101a and the insulating layer 101c is, for example, preferably 10% or higher, further preferably 30% or higher, further preferably 50% or higher, further preferably 80% or higher, further preferably 90% or higher, further preferably 95% or higher.

Here, the case where the semiconductor layers 101a, 101b, and 101c are each formed of an In-M-Zn oxide is considered. The atomic ratio of In to the element M and Zn contained in the insulating layer 101a is represented as $x_a:y_a:z_a$. In a similar manner, the atomic ratio of In to the element M and Zn contained in the semiconductor layer 101b is represented as $x_b:y_b:z_b$, and the atomic ratio of In to the element M and Zn of the insulating layer 101c is represented as $x_c:y_c:z_c$. Favorable values thereof are described below.

It is preferable that $x_b:y_b:z_b$ be in any range of the area 11, the area 12, the area 13, and the area 14 illustrated in FIG. 1, FIG. 2A, and FIGS. 4A and 4B.

Furthermore, the semiconductor layers 101a and 101c preferably have no or a small amount of spinel crystal structures. Accordingly, it is preferable that, for example, $x_a:y_a:z_a$ and $x_c:y_c:z_c$ be values within the range of the area 11 in FIG. 1 so that the semiconductor layers 101a and 101c each have lower electron affinity than the semiconductor layer 101b.

Here, in order that the semiconductor layer 101b has higher electron affinity than the semiconductor layers 101a and 101c, for example, the indium content of the semiconductor layer 101b is preferably higher than those of the semiconductor layers 101a and 101c.

For example, $x_b/(x_b+y_b+z_b) > x_a/(x_a+y_a+z_a)$ and $x_b/(x_b+y_b+z_b) > x_c/(x_c+y_c+z_c)$ are preferably satisfied.

For example, $x_a/(x_a+y_a) < 0.5$ is preferable, $x_a/(x_a+y_a) < 0.33$ is further preferable, and $x_a/(x_a+y_a) < 0.25$ is still further preferable. Furthermore, $x_b/(x_b+y_b) \geq 0.25$ is preferable, and $x_b/(x_b+y_b) \geq 0.34$ is further preferable. Furthermore, $x_c/(x_c+y_c) < 0.5$ is preferable, $x_c/(x_c+y_c) < 0.33$ is further preferable, and $x_c/(x_c+y_c) < 0.25$ is still further preferable.

Alternatively, each atomic ratio of $x_a:y_a:z_a$ and $x_c:y_c:z_c$ is preferably within the range of an area 16 illustrated in FIG. 2B. Here, the area 16 is an area surrounded by line segments that connect first coordinates K (x:y:z=8:14:7), second coordinates R (x:y:z=2:4:3), third coordinates L (x:y:z=2:5:7), fourth coordinates M (x:y:z=51:149:300), fifth coordinates B (x:y:z=1:4:10), sixth coordinates C (x:y:z=1:1:4), seventh coordinates A (x:y:z=2:2:1), and the first coordinates K in this order. Note that the area 16 also includes all the coordinates.

Note that in the case where the transistor has an s-channel structure, the channel is formed in the entire region of the semiconductor layer 101b. Therefore, as the thickness of the semiconductor layer 101b is increased, the size of the channel region is increased. That is, the thicker the semiconductor layer 101b is, the larger the on-state current of the transistor is. For example, the semiconductor layer 101b may have a region with a thickness of greater than or equal to 20 nm, preferably greater than or equal to 40 nm, further preferably greater than or equal to 60 nm, and still further preferably greater than or equal to 100 nm. Note that there is a possibility that the productivity of the semiconductor device is reduced; therefore, for example, the semiconductor layer 101b includes a region with a thickness of, for example, less than or equal to 300 nm, preferably less than or equal to 200 nm, and further preferably less than or equal to 150 nm.

Moreover, the thickness of the insulating layer 101c is preferably as small as possible to increase the on-state current of the transistor. For example, the insulating layer 101c may include a region with a thickness of less than 10 nm, preferably less than or equal to 5 nm, and further preferably less than or equal to 3 nm. Meanwhile, the insulating layer 101c has a function of blocking elements other than oxygen (such as hydrogen and silicon) contained in the adjacent insulator from entering the semiconductor layer 101b where a channel is formed. For this reason, it is preferable that the insulating layer 101c have a certain thickness. For example, the insulating layer 101c may include a region with a thickness of greater than or equal to 0.3 nm, preferably greater than or equal to 1 nm, and further preferably greater than or equal to 2 nm. The insulating layer 101c preferably has an oxygen blocking property to inhibit outward diffusion of oxygen released from the gate insulating film 102 and the like.

To improve reliability, preferably, the thickness of the insulating layer 101a is large and the thickness of the insulating layer 101c is small. For example, the insulating layer 101a may include a region with a thickness of greater than or equal to 10 nm, preferably greater than or equal to 20 nm, further preferably greater than or equal to 40 nm, and still further preferably greater than or equal to 60 nm. When the thickness of the insulating layer 101a is made large, a distance from an interface between the adjacent insulator and the insulating layer 101a to the semiconductor layer 101b in which a channel is formed can be large. Since the productivity of the semiconductor device might be decreased, the insulating layer 101a has a region with a thickness of, for example, less than or equal to 200 nm, preferably less than or equal to 120 nm, further preferably less than or equal to 80 nm.

When a large amount of hydrogen and moisture is contained in an oxide semiconductor film, a donor level might be formed owing to the hydrogen, so that the threshold voltage of the transistor shifts in the negative direction in some cases. Therefore, it is preferable that, after the formation of the oxide semiconductor film, dehydration treatment (dehydrogenation treatment) be performed to remove hydrogen or moisture so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be supplied to the oxide semiconductor film after the dehydration treatment to fill oxygen vacancies. In this specification and the like, supplying oxygen to the oxide semiconductor film may be expressed as oxygen adding treatment. Furthermore, making oxygen proportion in the oxide semiconductor film higher than that in the stoichiometric composition may be expressed as treatment for making an oxygen-excess state.

In this manner, hydrogen or moisture is removed by the dehydration treatment and oxygen vacancies therein are filled by the oxygen adding treatment, whereby an i-type (intrinsic) oxide semiconductor film or a substantially i-type (intrinsic) oxide semiconductor film which is extremely close to an i-type oxide semiconductor film can be obtained. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

The transistor including an i-type or substantially i-type oxide semiconductor film can achieve extremely favorable off-state current. For example, the drain current of the transistor including an oxide semiconductor film can be less than or equal to $1\times10^{-18}$ A, preferably less than or equal to $1\times10^{-21}$ A, further preferably less than or equal to $1\times10^{-24}$ A at room temperature (approximately 25° C.); or less than or equal to $1\times10^{-15}$ A, preferably less than or equal to $1\times10^{-18}$ A, further preferably less than or equal to $1\times10^{-21}$ A at 85° C. Here, the off-state current refers to a drain current of a transistor in the off state. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

One of the conductive layer 104a and the conductive layer 104b serves as a source electrode and the other serves as a drain electrode.

The conductive layer 104a and the conductor layer 104b are each formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The gate insulating film 102 may be formed with a single layer or a stack using, for example, one or more of silicon oxide, silicon oxynitride, silicon nitride oxide, aluminum oxide, hafnium oxide, gallium oxide, Ga—Zn-based metal oxide, silicon nitride, and the like.

The gate insulating film 102 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide.

The gate insulating film 102 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a film in which any of the above materials are mixed.

As the gate insulating film 102, like the insulating film 114, an oxide insulating film that contains oxygen in excess of that in the stoichiometric composition is preferably used.

When the specific material is used for the gate insulating film, electrons are trapped in the gate insulating film under the specific conditions and the threshold voltage can be shifted in the positive direction. For example, like a stacked-layer film of silicon oxide and hafnium oxide, part of the gate insulating film uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor layer to the gate electrode, and some of the electrons are trapped by the electron trap states.

The gate electrode 103 can be formed using, for example, a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Alternatively, a semiconductor typified by polycrystalline silicon doped with an impurity element such as phosphorus, or a silicide such as nickel silicide may be used for the gate electrode 103. Further, the gate electrode 103 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film, or a nitride film containing aluminum and one or more metals selected from titanium, tantalum, tungsten, molybdenum, chromium, neodymium, and scandium may be used.

The gate electrode 103 can also be formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added. It is also possible to have a stacked-layer structure formed using the above light-transmitting conductive material and the above metal.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 103 and the gate insulating film 102. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn-based oxynitride semiconductor film, an In—Ga—Zn-based oxynitride semiconductor film having a higher nitrogen concentration than at least the semiconductor layer 101, specifically an In—Ga—Zn-based oxynitride semiconductor film having a nitrogen concentration higher than or equal to 7 atomic %, is used.

The above is the description of the transistor 100.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

TRANSISTOR EXAMPLE 2

Figure 13A:
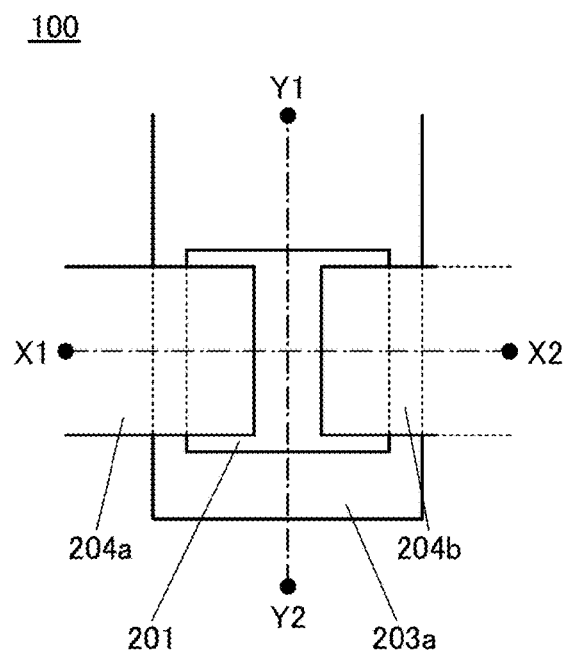
FIGS. 13A to 13C illustrate an example of a transistor of one embodiment of the present invention.
Figure 13B:
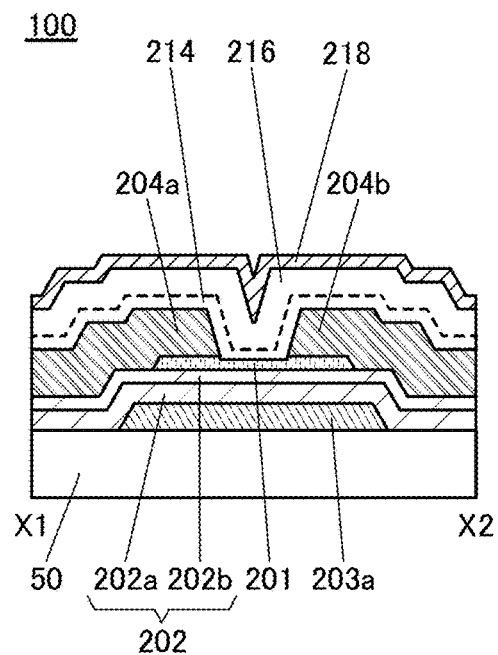
Figure 13C:
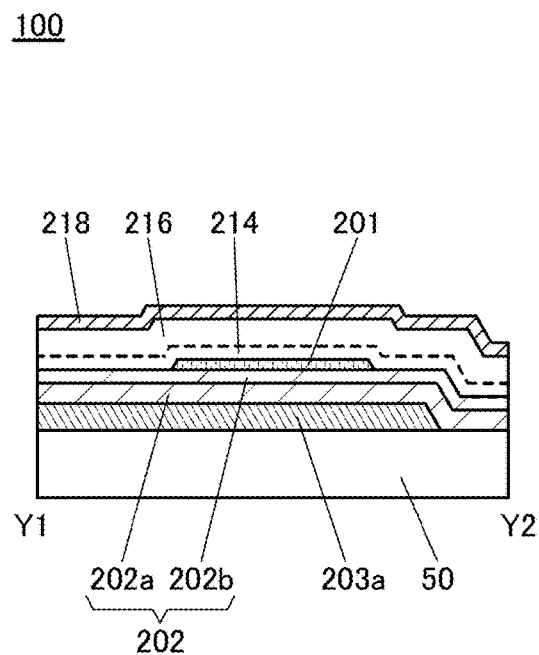

A structure example of a transistor including an oxide semiconductor film that is one embodiment of the present invention is described with reference to FIGS. 13A to 13C. The structure is different from that in FIGS. 12A to 12C. FIG. 13A is a top view of a transistor 100 that is a semiconductor device of one embodiment of the present invention. FIG. 13B is a cross-sectional view taken along dashed dotted line X1-X2 in FIG. 13A, and FIG. 13C is a cross-sectional view taken along dashed dotted line Y1-Y2 in FIG. 13A.

The transistor 100 includes a gate electrode 203a functioning as a gate electrode over the substrate 50, a gate insulating film 202 over the substrate 50 and the gate electrode 203a, a semiconductor layer 201 over the gate insulating film 202, and conductive layers 204a and 204b functioning as source and drain electrodes electrically connected to the semiconductor layer 201. Over the transistor 100, specifically, over the conductive layers 204a and 204b and the semiconductor layer 201, an insulating film 214, an insulating film 216, and an insulating film 218 are stacked in this order.

Then, the components included in a transistor of this embodiment are described.

For the gate electrode 203a functioning as a gate electrode of the transistor 100, the description of the gate electrode 103 may be referred to.

For the gate insulating film 202 functioning as a gate insulating film of the transistor 100, the description of the gate insulating film 102 may be referred to. Furthermore, as the gate insulating film 202, a stacked-layer film of two or more layers may be used. For example, as illustrated in FIGS. 13A to 13C, a two-layer structure of a gate insulating film 202a and a gate insulating film 202b may be used. In this case, as a lower layer, here, the gate insulating film 202a, a film functioning as a blocking film which inhibits permeation of oxygen may be used, for example. For the film functioning as a blocking film, a barrier film 111 described below or the like may be referred to, for example.

As the semiconductor layer 201, the oxide semiconductor film described in Embodiment 1 or Embodiment 2 may be used. Furthermore, for the semiconductor layer 201, the description of the semiconductor layer 101 may be referred to. Furthermore, as the semiconductor layer 201, a stacked-layer film of two or more layers may be used.

The insulating films 214, 216, and 218 function as protective insulating films for the transistor 100. The insulating film 214 also functions as a film that relieves damage to the semiconductor layer 201 at the time of forming the insulating film 216.

It is preferable that the insulating films 214 and 216 each include a region including oxygen in excess of that in the stoichiometric composition (oxygen excess region), for example, like the above-described insulating film 114.

In addition, it is preferable that the number of defects in the insulating film 214 be small and typically, the spin density corresponding to a signal that appears at g=2.001 due to a dangling bond of silicon be lower than or equal to $3 \times 10^1$ spins/cm$^3$ by electron spin resonance (ESR) measurement. This is because if the density of defects in the insulating film 214 is high, oxygen is bonded to the defects and the amount of oxygen that penetrates the insulating film 214 is decreased.

Note that all oxygen entering the insulating film 214 from the outside does not move to the outside of the insulating film 214 and some oxygen remains in the insulating film 214. Furthermore, movement of oxygen occurs in the insulating film 214 in some cases in such a manner that oxygen enters the insulating film 214 and oxygen contained in the insulating film 214 moves to the outside of the insulating film 214. When an oxide insulating film which is permeable to oxygen is formed as the insulating film 214, oxygen released from the insulating film 216 provided over the insulating film 214 can be moved to the semiconductor layer 201 through the insulating film 214.

The insulating film 214 can be formed using an oxide insulating film having a low density of states due to nitrogen oxide between the energy of the valence band maximum ($E_{v\_os}$) and the energy of the conduction band minimum ($E_{c\_os}$) of the oxide semiconductor film. A silicon oxynitride film that releases a small amount of nitrogen oxide, an aluminum oxynitride film that releases a small amount of nitrogen oxide, or the like can be used as the oxide insulating film in which the density of states due to nitrogen oxide is low between $E_{v\_os}$ and $E_{c\_os}$.

Note that a silicon oxynitride film that releases a small amount of nitrogen oxide is a film of which the number of released ammonia molecules is larger than the amount of released nitrogen oxide in thermal desorption spectroscopy analysis; the number of released ammonia molecules is typically greater than or equal to $1 \times 10^{18}$/cm$^3$ and less than or equal to $5 \times 10^{19}$/cm$^3$. Note that the number of released ammonia molecules is the number of ammonia molecules released by heat treatment in which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 214, for example. The level is positioned in the energy gap of the semiconductor layer 201. Therefore, when nitrogen oxide is diffused to the interface between the insulating film 214 and the semiconductor layer 201, an electron is trapped by the level on the insulating film 214 side. As a result, the trapped electron remains in the vicinity of the interface between the insulating film 214 and the semiconductor layer 201; thus, the threshold voltage of the transistor is shifted in the positive direction.

Nitrogen oxide reacts with ammonia and oxygen in heat treatment. Since nitrogen oxide contained in the insulating film 214 reacts with ammonia contained in the insulating film 216 in heat treatment, nitrogen oxide contained in the insulating film 214 is reduced. Therefore, an electron is hardly trapped at the interface between the insulating film 214 and the semiconductor layer 201.

The insulating film 214 is in contact with a region (hereinafter referred to as a back channel region) of the semiconductor layer 201 that is on the opposite side of a region where a channel is formed, whereby the insulating film 214 has a function of protecting the back channel region.

By using, for the insulating film 214, the oxide insulating film having a low density of states due to nitrogen oxide between $E_{v\_os}$ and $E_{c\_os}$, the shift in the threshold voltage of the transistor can be reduced, which leads to a smaller change in the electrical characteristics of the transistor.

The nitrogen concentration of the oxide insulating film having a low density of states due to nitrogen oxide between $E_{v\_os}$ and $E_{c\_os}$ measured by SIMS is lower than or equal to $6 \times 10^{20}$ atoms/cm$^3$.

It is preferable that the number of defects in the insulating film 216 be small, and typically the spin density corresponding to a signal which appears at g=2.001 due to a dangling bond of silicon, be lower than $1.5 \times 10^{18}$ spins/cm$^3$, more preferably lower than or equal to $1 \times 10^{18}$ spins/cm$^3$ by ESR measurement. Note that the insulating film 216 is provided more apart from the semiconductor layer 201 than the insulating film 214 is; thus, the insulating film 216 may have higher density of defects than the insulating film 214.

The transistor 100 may have either of structures illustrated in FIGS. 14A to 14C and FIGS. 15A to 15C. The transistor 100 illustrated in FIGS. 13A to 13C is a channel-etched transistor; in contrast, the transistors 100 illustrated in FIGS. 14A to 14C and FIGS. 15A to 15C are channel-protective transistors.

Figure 14A:
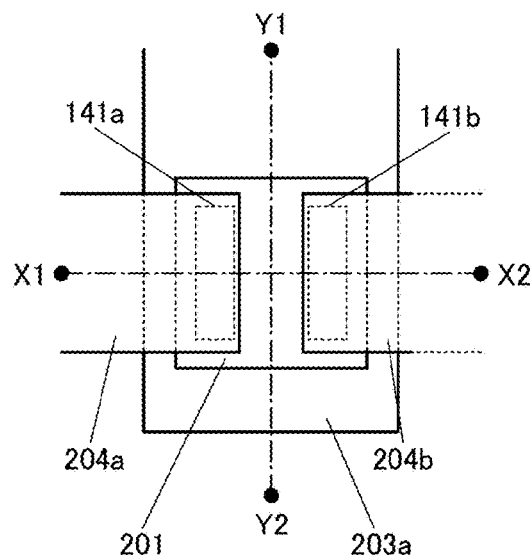
FIGS. 14A to 14C illustrate an example of a transistor of one embodiment of the present invention.
Figure 14B:
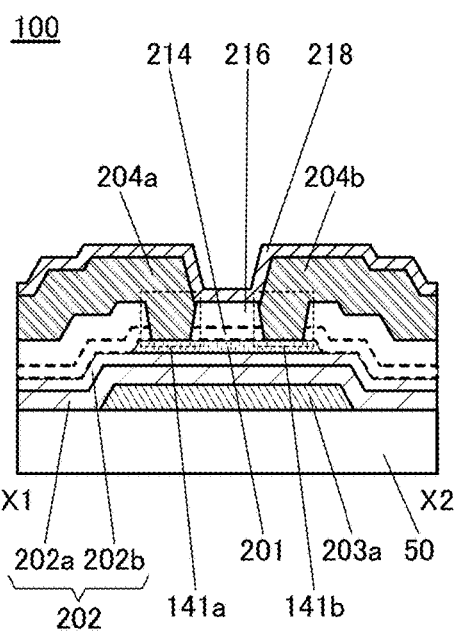
Figure 14C:
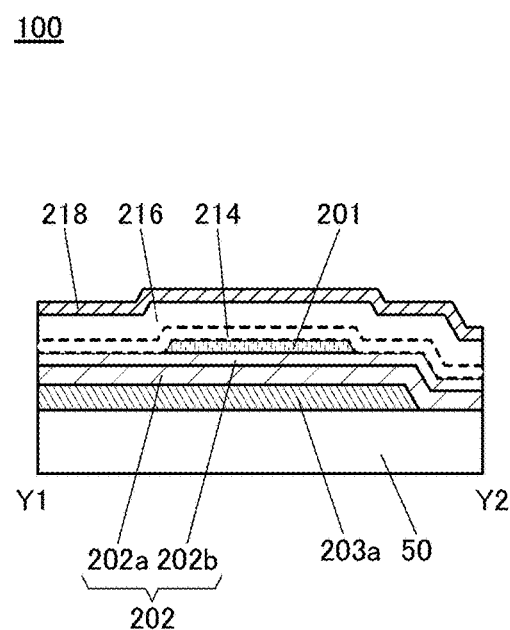

FIG. 14A is a top view of the transistor 100 that is a semiconductor device of one embodiment of the present invention. FIG. 14B is a cross-sectional view taken along dashed dotted line X1-X2 in FIG. 14A, and FIG. 14C is a cross-sectional view taken along dashed dotted line Y1-Y2 in FIG. 14A. The transistor 100 illustrated in FIGS. 14A to 14C includes the gate electrode 203a over the substrate 50; the gate insulating film 202 over the substrate 50 and the gate electrode 203a; the semiconductor layer 201 overlapping the gate electrode 203a with the gate insulating film 202 positioned therebetween; the insulating film 214 over the gate insulating film 202 and the semiconductor layer 201; the insulating film 216 over the insulating film 214; and the pair of conductive layers 204a and 204b in contact with the semiconductor layer 201 in openings 141a and 141b of the insulating films 214 and 216. Furthermore, over the transistor 100, specifically, over the conductive layers 204a and 204b and the insulating film 216, the insulating film 218 may be provided.

Figure 15A:
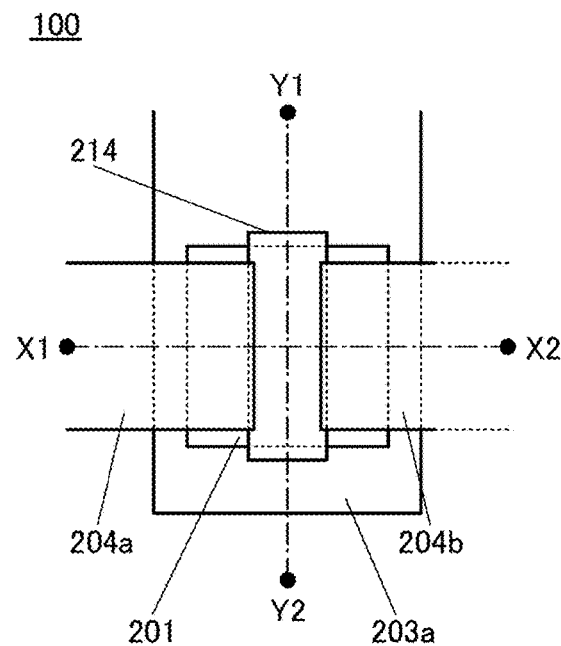
FIGS. 15A to 15C illustrate an example of a transistor of one embodiment of the present invention.
Figure 15B:
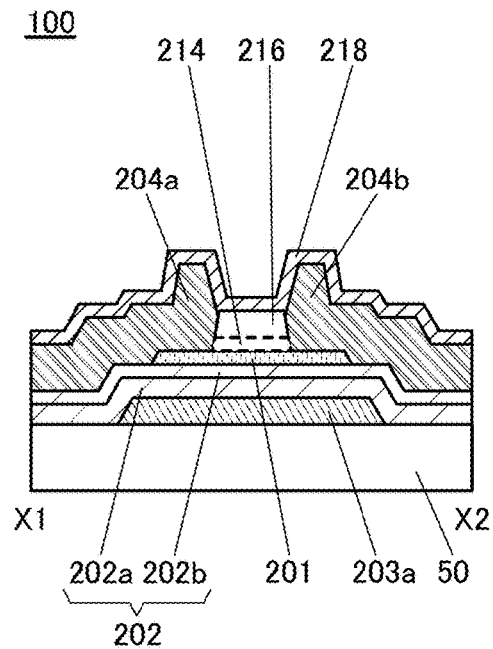
Figure 15C:
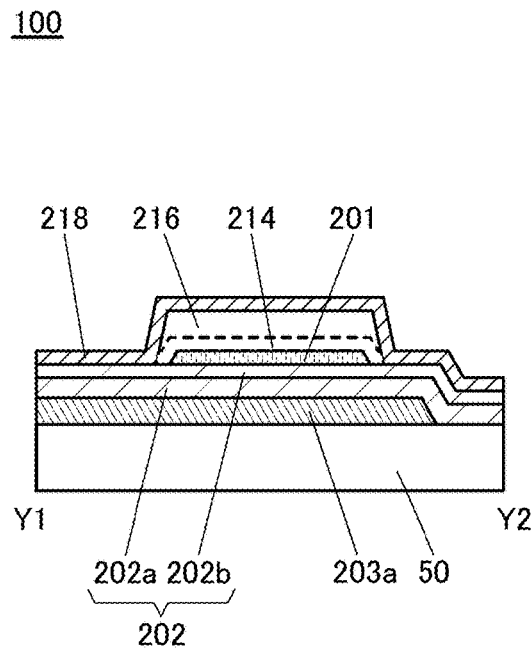

FIG. 15A is a top view of the transistor 100 that is a semiconductor device of one embodiment of the present invention. FIG. 15B is a cross-sectional view taken along dashed dotted line X1-X2 in FIG. 15A, and FIG. 15C is a cross-sectional view taken along dashed dotted line Y1-Y2 in FIG. 15A. The transistor 100 in FIGS. 15A to 15C is different from the transistor 100 in FIGS. 14A to 14C in the shapes of the insulating films 214 and 216. Specifically, the insulating films 214 and 216 of the transistor 100 in FIGS. 15A to 15C have island shapes and are provided over a channel region of the semiconductor layer 101. The other components are the same as those of the transistor 100 in FIGS. 14A to 14C, and the effect similar to that in the case of the transistor 100 is obtained.

In each of the transistors 100 in FIGS. 14A to 14C and FIGS. 15A to 15C, the semiconductor layer 201 is covered with the insulating film 214 and 216 at the time of forming the pair of conductive layers 204a and 204b; therefore, the semiconductor layer 201 is not damaged by etching for forming the pair of conductive layers 204a and 204b. In addition, when the insulating films 214 and 216 are each an oxide insulating film containing nitrogen and having a small number of defects, a change in electrical characteristics is suppressed, whereby the transistor can have improved reliability.

Figure 16A:
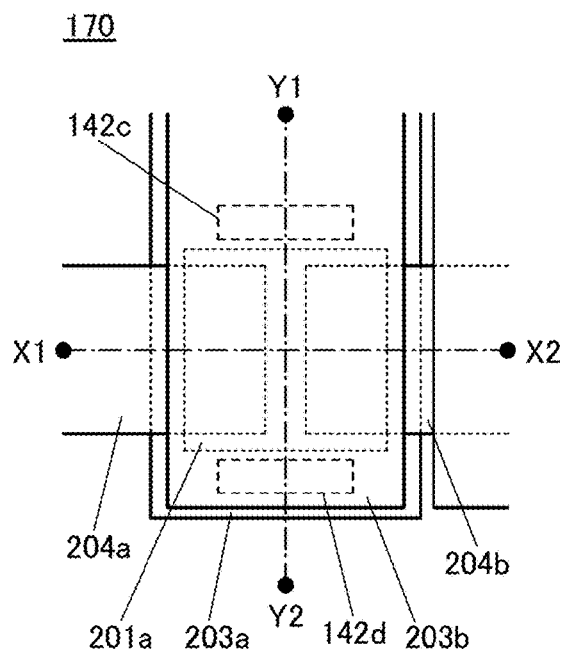
FIGS. 16A to 16C illustrate an example of a transistor of one embodiment of the present invention.
Figure 16B:
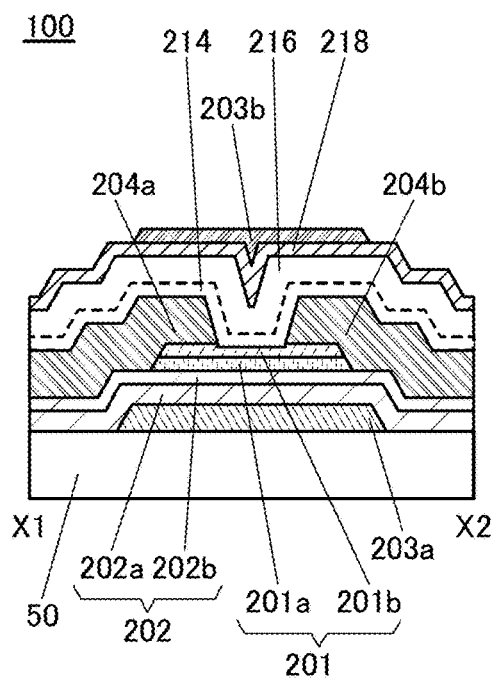
Figure 16C:
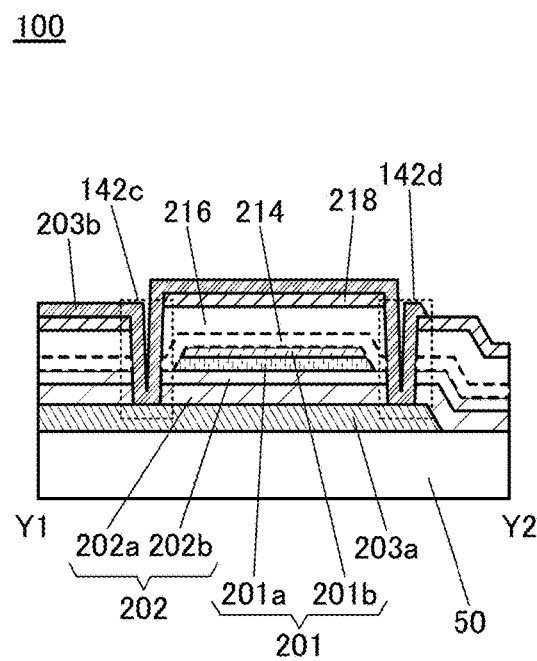

Furthermore, as illustrated in FIGS. 16A to 16C, an electrode 203b may be provided over the insulating film 218 in the transistor 100. FIG. 16A is a top view of the transistor 100 that is a semiconductor device of one embodiment of the present invention. FIG. 16B is a cross-sectional view taken along dashed dotted line X1-X2 in FIG. 16A, and FIG. 16C is a cross-sectional view taken along dashed dotted line Y1-Y2 in FIG. 16A. Although the electrode 203b in FIGS. 16A to 16C is connected to the gate electrode 203a through an opening 142c and an opening 142d provided in the insulating films 214 and 216, the electrode 203b is not necessarily connected to the gate electrode 203a. In the case where the electrode 203b is not connected to the gate electrode 203a, different potentials can be applied to the respective electrodes.

As illustrated in FIGS. 16A to 16C, the side surfaces of the semiconductor layer 201 face the electrode 203b in the channel width direction, and the semiconductor layer 201 is surrounded by the gate electrode 203a and the electrode 203b with the gate insulating film 202 interposed between the semiconductor layer 201 and the gate electrode 203a and with the insulating films 214, 216, and 218 interposed between the semiconductor layer 201 and the electrode 203b in the channel width direction. Thus, in the semiconductor layer 201, carriers flow not only at the interface between the gate insulating film 202 and the semiconductor layer 201 and the interface between the insulating film 214 and the semiconductor layer 201, but also in the semiconductor layer 201, so that the amount of transfer of carriers is increased in the transistor 100. As a result, the on-state current and field-effect mobility of the transistor 100 are increased. The electric field of the electrode 203b affects the side surface or an end portion including the side surface and its vicinity of the semiconductor layer 201; thus, generation of a parasitic channel at the side surface or the end portion of the semiconductor layer 201 can be suppressed.

In the example in FIGS. 16A to 16C, the semiconductor layer 201 includes a semiconductor layer 201b over a semiconductor layer 201a. Here, for example, the energy at the conduction band bottom thereof is closer to a vacuum level than that of the semiconductor layer 201a is. Specifically, the difference between the energy at the conduction band bottom of the semiconductor layer 201b and the energy at the conduction band bottom of the semiconductor layer 201a is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the semiconductor layer 201b and the electron affinity of the semiconductor layer 201a is any one of 0.05 eV or more, 0.07 eV or more, 0.1 eV or more, and 0.15 eV or more, and any one of 2 eV or less, 1 eV or less, 0.5 eV or less, and 0.4 eV or less.

For the semiconductor layer 201a, the semiconductor layer 101b in this embodiment may be referred to. For example, a favorable range of the atomic ratio of indium to the element M and zinc contained in the semiconductor layer 101b may be referred to. For the semiconductor layer 201b, the insulating layer 101c in this embodiment may be referred to. For example, a favorable range of the atomic ratio of indium to the element M and zinc contained in the insulating layer 101c may be referred to.

[Modification Example of Transistor]

Modification examples of the transistor 100 are illustrated in FIGS. 30A and 30B, FIGS. 31A and 31B, FIGS. 32A to 32D, and FIGS. 33A and 33B. For example, the transistor 100 may have a structure illustrated in FIGS. 30A and 30B. The structure of FIGS. 30A and 30B is different from that of FIGS. 12A to 12C in the shapes of the conductive layer 104a and the conductive layer 104b. Note that FIG. 30B illustrates a cross section taken along dashed dotted line A-B in FIG. 30A, which is perpendicular to the cross section in FIG. 30A.

Alternatively, the transistor 100 may have a structure illustrated in FIGS. 31A and 31B. In FIGS. 12A to 12C, the insulating layer 101c is in contact with the top surfaces of the conductive layers 104a and 104b, whereas in FIGS. 31A and 31B, the insulating layer 101c is in contact with the bottom surfaces of the conductive layers 104a and 104b. Note that FIG. 31B illustrates a cross section taken along dashed dotted line A-B in FIG. 31A, which is perpendicular to the cross section in FIG. 31A. Such a structure enables films used for the insulating layer 101a, the semiconductor layer 101b, and the insulating layer 101c to be formed successively without contact with the air and therefore can reduce defects at each interface.

Figure 32A:
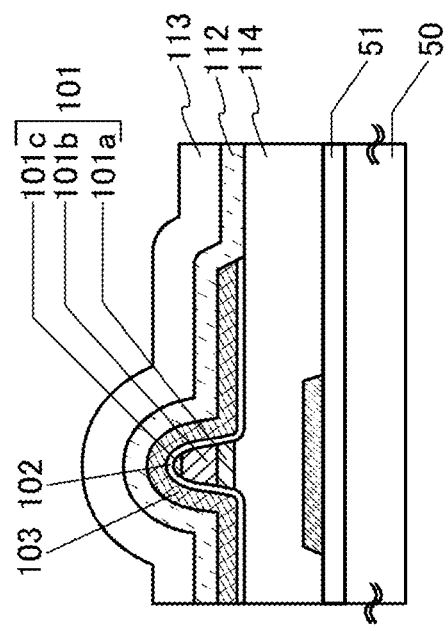
FIGS. 32A to 32D illustrate examples of a transistor of one embodiment of the present invention.
Figure 32B:
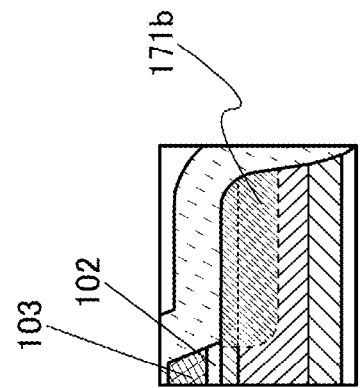
Figure 32C:
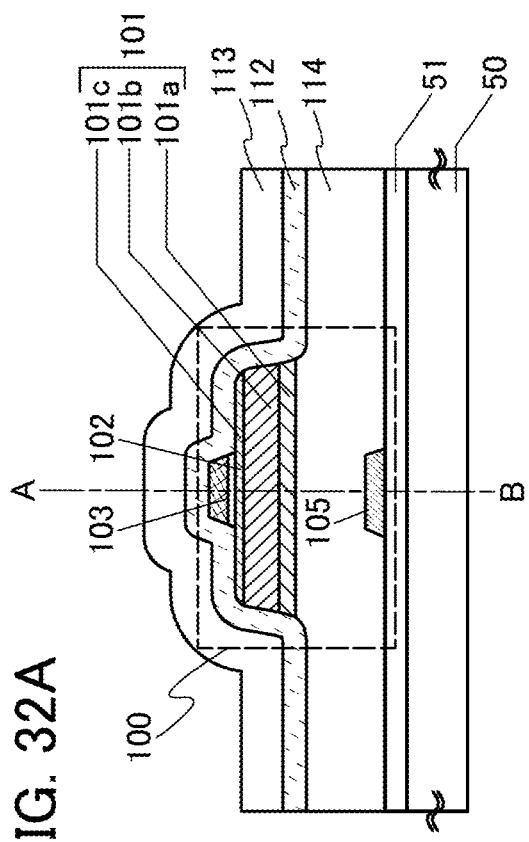
Figure 32D:
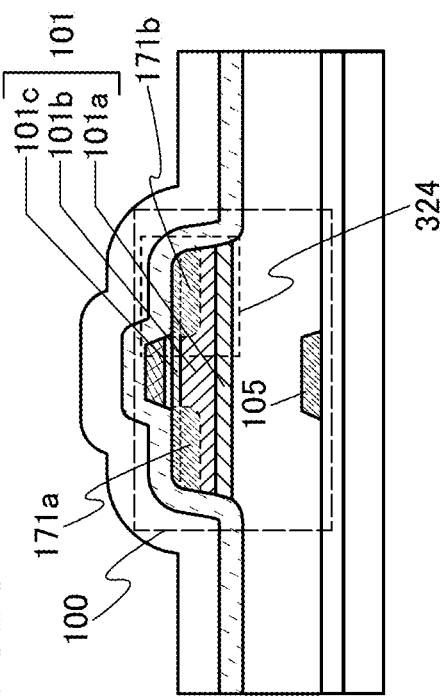

Alternatively, the transistor 100 may have a structure illustrated in FIGS. 32A to 32D. Note that FIG. 32B illustrates a cross section taken along dashed dotted line A-B in FIG. 32A, which is perpendicular to the cross section in FIG. 32A. The structure of FIGS. 32A to 32D is different from that of FIGS. 12A to 12C in that neither the conductive layer 104a nor the conductive layer 104b is provided. Here, as illustrated in FIG. 32C, the transistor 100 may include a low-resistance layer 171a and a low-resistance layer 171b. The low-resistance layer 171a and the low-resistance layer 171b preferably function as a source region and a drain region. Furthermore, an impurity may be added to the low-resistance layer 171a and the low-resistance layer 171b. Adding the impurity can reduce the resistance of the semiconductor layer 101. As the impurity, for example, one or more kinds of element selected from argon, boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten are preferably added. The low-resistance layer 171a and the low-resistance layer 171b in the semiconductor layer 101 each include for example, any of the above impurities at a concentration of higher than or equal to $5 \times 10^{19}$ atoms/cm$^3$, preferably higher than or equal to $1 \times 10^{20}$ atoms/cm$^3$, further preferably higher than or equal to $2 \times 10^{20}$ atoms/cm$^3$, still further preferably higher than or equal to $5 \times 10^{20}$ atoms/cm$^3$. FIG. 32D is an enlarged view of a region 324 in FIG. 32C.

Note that an impurity such as unnecessary hydrogen can be trapped in such a low-resistance region. The trap of unnecessary hydrogen in the low-resistance layer can reduce the hydrogen concentration of the channel region, and as a result, the transistor 100 can have favorable characteristics.

Figure 33A:
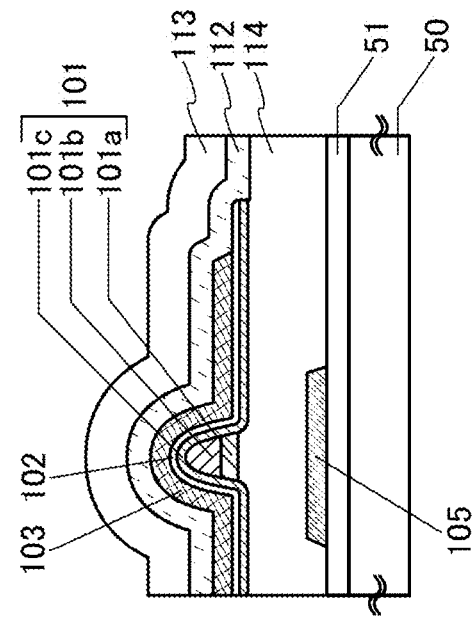
FIGS. 33A and 33B illustrate an example of a transistor of one embodiment of the present invention.
Figure 33B:
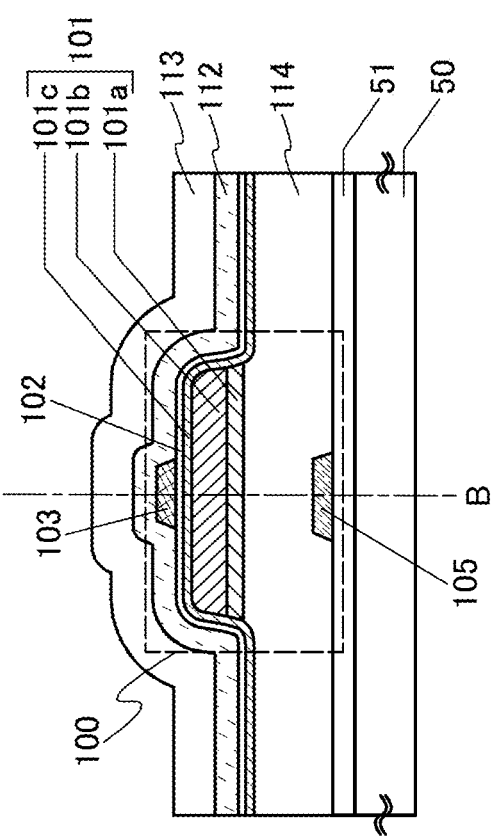

Alternatively, the transistor 100 may have a structure illustrated in FIGS. 33A and 33B. The structure of FIGS. 33A and 33B is different from those of FIGS. 32A to 32D in the shapes of insulating layer 101c and the gate insulating film 102. Note that FIG. 33B illustrates a cross section taken along dashed dotted line A-B in FIG. 33A, which is perpendicular to the cross section in FIG. 33A.

FIGS. 30A and 30B, FIGS. 31A and 31B, FIGS. 32A to 32D, and FIGS. 33A and 33B each illustrate the structure in which the insulating layer 101a and the insulating layer 101c are in contact with the semiconductor layer 101b; however, a structure without one or both of the insulating layer 101a and the insulating layer 101c may be employed.

At least part of this embodiment can be implemented in combination with any of the other embodiments described in this specification as appropriate.

(Embodiment 4)

In this embodiment, an example of a display device that includes any of the transistors described in the embodiment above is described below with reference to FIG. 34, FIG. 35, and FIG. 36.

Figure 34:
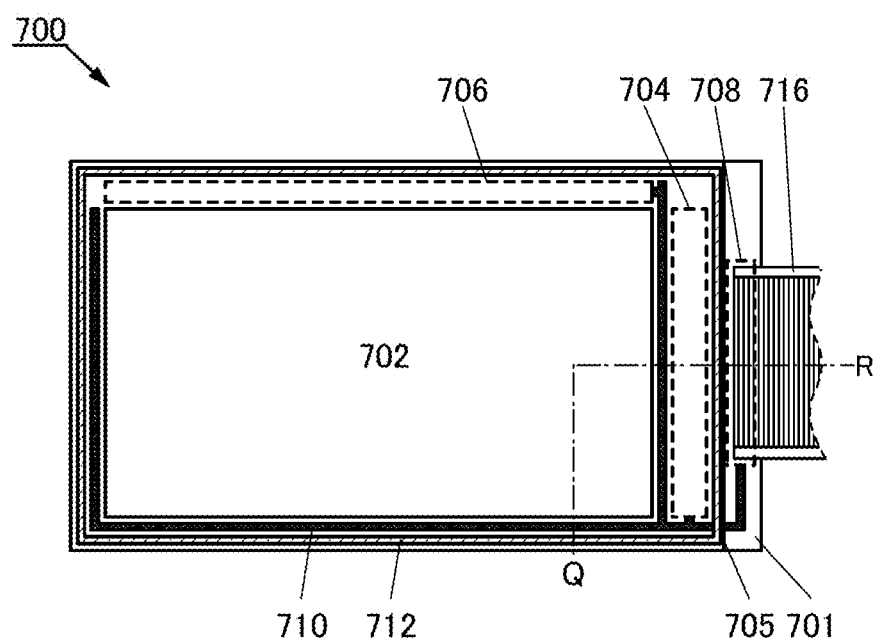
FIG. 34 is a top view illustrating one embodiment of a display device.

FIG. 34 is a top view of an example of a display device. A display device 700 illustrated in FIG. 34 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 34, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, and the gate driver circuit portion 706 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a wiring portion or a plurality of transistors. For the wiring portion or the plurality of transistors, any of the semiconductor devices of embodiments of the present invention can be used.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

In this embodiment, a structure including a liquid crystal element and an EL element as display elements is described with reference to FIG. 35 and FIG. 36. Note that FIG. 35 is a cross-sectional view along the dashed-dotted line Q-R shown in FIG. 34 and shows a structure including a liquid crystal element as a display element, whereas FIG. 36 is a cross-sectional view along the dashed-dotted line Q-R shown in FIG. 34 and shows a structure including an EL element as a display element.

Figure 35:
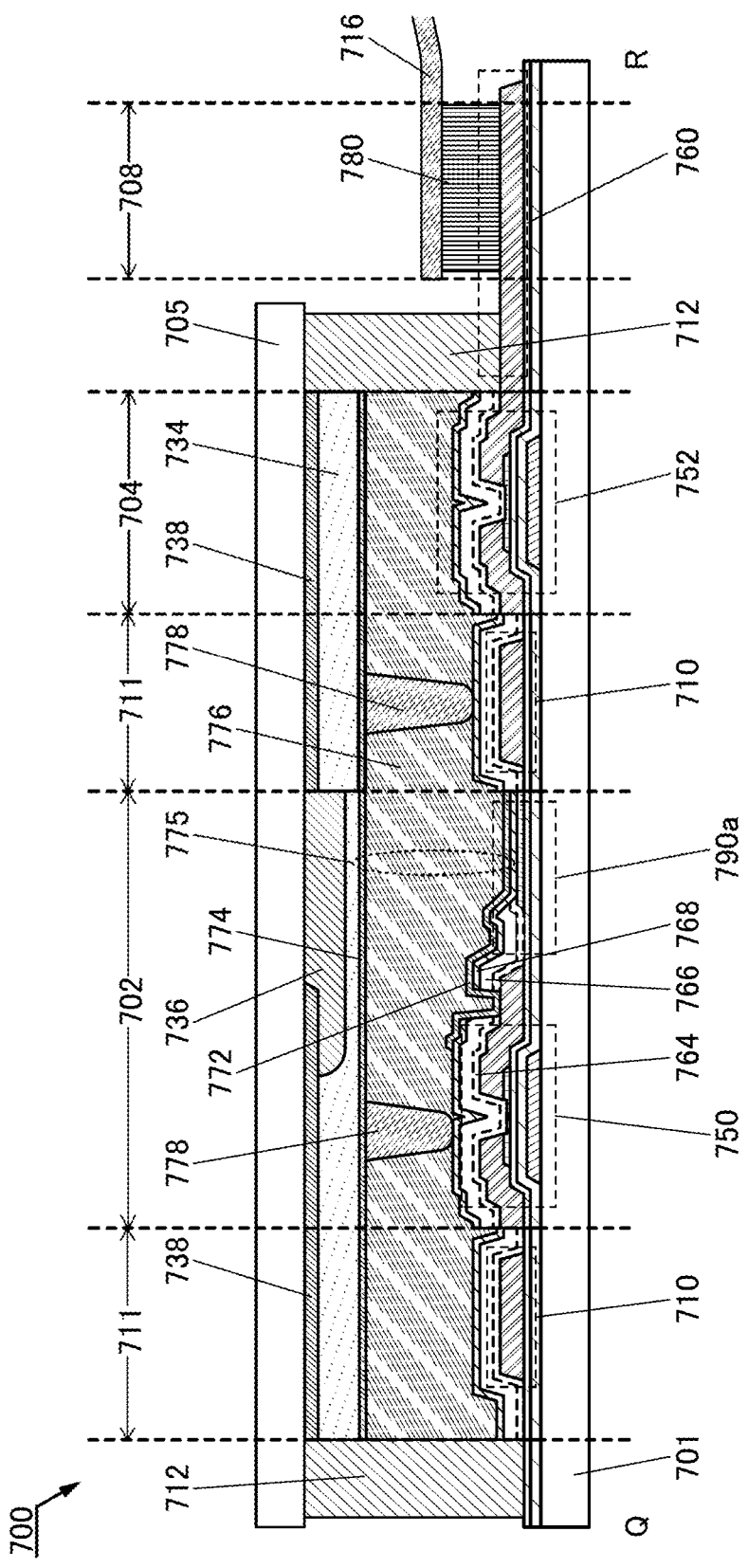
FIG. 35 is a cross-sectional view illustrating one embodiment of a display device.
Figure 36:
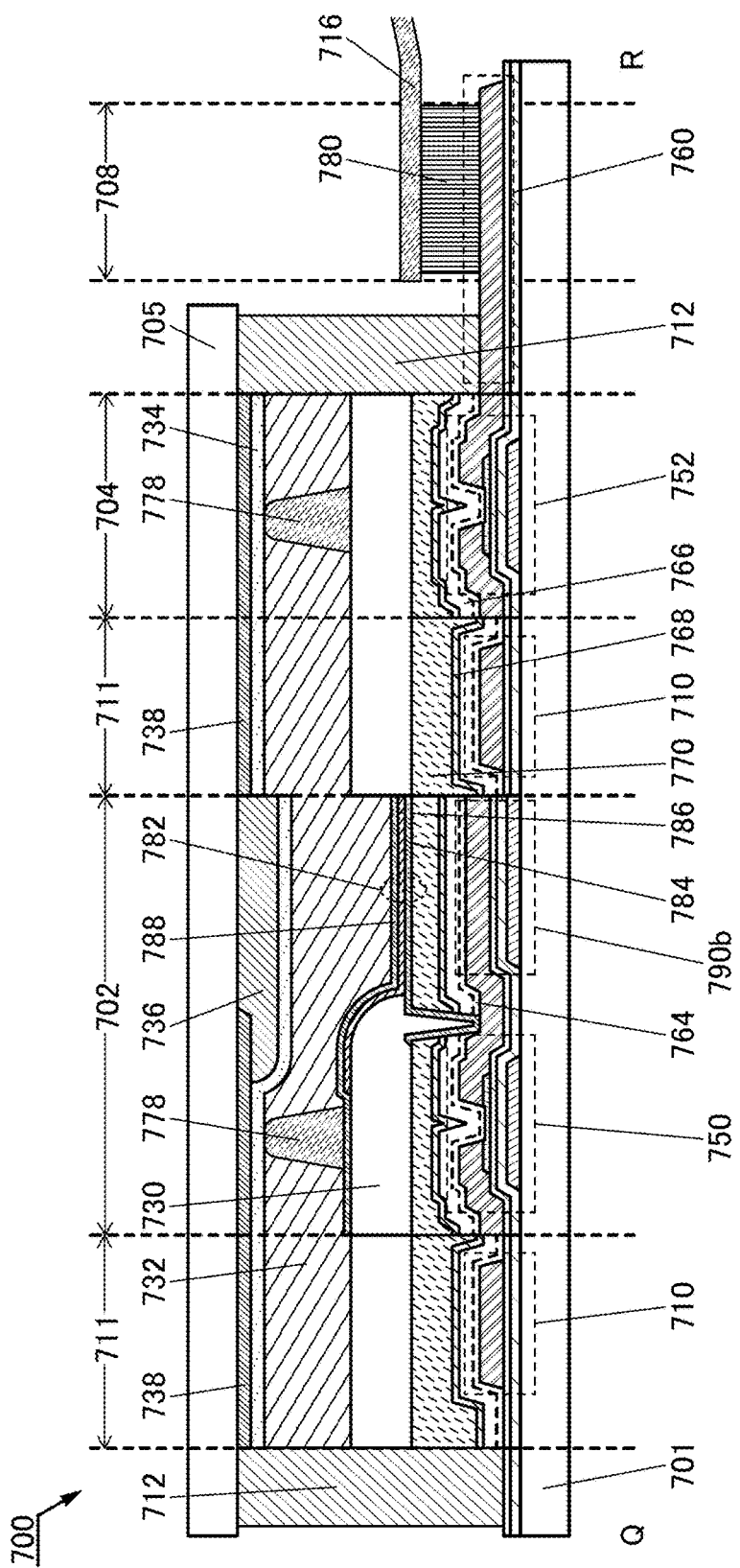
FIG. 36 is a cross-sectional view illustrating one embodiment of a display device.

Common portions between FIG. 35 and FIG. 36 are described first, and then different portions are described.

[Common Portions in Display Devices]

The display device 700 illustrated in FIG. 35 and FIG. 36 include a lead wiring portion 711, the pixel portion 702, the source driver circuit portion 704, and the FPC terminal portion 708. Note that the lead wiring portion 711 includes a signal line 710. The pixel portion 702 includes a transistor 750 and a capacitor 790 (a capacitor 790a or a capacitor 790b). The source driver circuit portion 704 includes a transistor 752.

The signal line 710 is formed in the same process as conductive films functioning as a source electrode and a drain electrode of the transistor 750 or 752. Note that the signal line 710 may be formed using a conductive film which is formed in a different process as a source electrode and a drain electrode of the transistor 750 or 752, e.g., a conductive film functioning as a gate electrode may be used. In the case where the signal line 710 is formed using a material including a copper element, signal delay or the like due to wiring resistance is reduced, which enables display on a large screen.

Any of the transistors described above can be used as the transistors 750 and 752. Here, the transistor 100 in FIGS. 13A to 13C is used as the transistors 750 and 752; however, any of the other transistors described above may be used.

Alternatively, the transistor 100 in FIGS. 16A to 16C may be used as the transistors 750 and 752. In this case, the electrode 203b can be formed through the same process as a conductive layer 772 and a conductive layer 784, for example. With a structure of the transistor 100 in FIGS. 16A to 16C, for example, the on-state current of the transistors 750 and 752 can be increased and the circuit operation speed can be increased. Furthermore, the channel width of the transistors 750 and 752 can be reduced, which leads to circuit integration.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The FPC terminal portion 708 includes a connection electrode 760, an anisotropic conductive layer 780, and the FPC 716. Note that the connection electrode 760 is formed in the same process as conductive films functioning as a source electrode and a drain electrode of the transistor 750 or 752. The connection electrode 760 is electrically connected to a terminal included in the FPC 716 through the anisotropic conductive layer 780.

For example, a glass substrate can be used as the first substrate 701 and the second substrate 705. A flexible substrate may be used as the first substrate 701 and the second substrate 705. Examples of the flexible substrate include a plastic substrate.

A semiconductor device having flexibility can be manufactured with the use of a flexible substrate. When the semiconductor device has flexibility, the semiconductor device can be attached to a curved surface or an irregular shape, whereby a variety of applications are achieved.

For example, a flexible substrate such as a plastic substrate is used, whereby the display device can be thinner and more lightweight. In addition, the display device in which a flexible substrate such as a plastic substrate is used is hardly broken, and can well withstand impacts when being dropped, for example.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the second substrate 705 side is illustrated as an example in FIG. 35, one embodiment of the present invention is not limited thereto. For example, as illustrated in FIG. 36, a structure in which the structure body 778 is provided on the first substrate 701 side, or a structure in which both of the first substrate 701 and the second substrate 705 are provided with the structure body 778 may be employed.

In FIG. 35 and FIG. 36, insulating films 764, 766, and 768 are formed over the transistor 750 and the transistor 752.

The insulating films 764, 766, and 768 can be formed using materials and methods similar to those of the insulating films 214, 216, and 218 described in the above embodiment, respectively.

[Structure Example of Display Device Using Liquid Crystal Element as Display Element]

The display device 700 in FIG. 35 includes the capacitor 790a. The capacitor 790a includes a dielectric between a pair of electrodes. Specifically, an oxide semiconductor film with high conductivity which is formed through the same process as an oxide semiconductor film functioning as a semiconductor layer of the transistor 750 is used as one electrode of the capacitor 790a, and the conductive layer 772 electrically connected to the transistor 750 is used as the other electrode of the capacitor 790a. The insulating film 768 is used as the dielectric between the pair of electrodes.

An oxide semiconductor film with high conductivity which serves as one electrode of the capacitor 790a is described below.

[Oxide Semiconductor Film with High Conductivity]

When hydrogen is added to an oxide semiconductor in which an oxygen vacancy is generated, hydrogen enters an oxygen vacant site and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

Here, the temperature dependence of resistivity of a film formed using an oxide semiconductor (hereinafter referred to as an oxide semiconductor film (OS)) and that of a film formed using an oxide conductor (hereinafter referred to as an oxide conductor film (OC)) are described.

The temperature dependence of resistivity of the oxide conductor film (OC) is lower than the temperature dependence of resistivity of the oxide semiconductor film (OS). Typically, variation of the resistivity of the oxide conductor film (OC) at temperatures from 80 K to 290 K is more than −20% and less than +20%. Alternatively, the range of variation of resistivity at temperatures from 150 K to 250 K is from more than −10% to less than +10%. In other words, the oxide conductor is a degenerate semiconductor and it is suggested that the conduction band edge agrees with or substantially agrees with the Fermi level. Therefore, the oxide conductor film can be used as one electrode of the capacitor 790a. Here, the oxide semiconductor film can be formed by forming nitride silicon over an In-M-Zn oxide, for example.

The display device 700 illustrated in FIG. 35 includes a liquid crystal element 775. The liquid crystal element 775 includes a conductive layer 772, a conductive layer 774, and a liquid crystal layer 776. The conductive layer 774 is provided on the second substrate 705 side and functions as a counter electrode. The display device 700 in FIG. 35 is capable of displaying an image in such a manner that transmission or non-transmission is controlled by change in the alignment state of the liquid crystal layer 776 depending on a voltage applied to the conductive layer 772 and the conductive layer 774.

The conductive layer 772 is connected to the conductive films functioning as a source electrode and a drain electrode included in the transistor 750. The conductive layer 772 is formed over the insulating film 768 to function as a pixel electrode, i.e., one electrode of the display element.

For the conductive layer 772, for example, a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added can be used.

Although not illustrated in FIG. 35, an alignment film may be provided on a side of the conductive layer 772 in contact with the liquid crystal layer 776 and on a side of the conductive film 774 in contact with the liquid crystal layer 776. Although not illustrated in FIG. 35, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time, and has optical isotropy, which makes the alignment process unneeded and viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

[Display Device Using Light-emitting Element as Display Element]

The display device 700 illustrated in FIG. 36 includes the capacitor 790b. The capacitor 790b includes a dielectric between a pair of electrodes. Specifically, a conductive film which is formed using the same step as a conductive film functioning as a gate electrode of the transistor 750 is used as one electrode of the capacitor 790b, and a conductive film functioning as a source electrode or a drain electrode of the transistor 750 is used as the other electrode of the capacitor

790b. Furthermore, an insulating film functioning as a gate insulating film of the transistor 750 is used as the dielectric between the pair of electrodes.

Furthermore, in FIG. 36, a planarization insulating film 770 is provided over the insulating film 768.

The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, as illustrated in FIG. 35, a structure without the planarization insulating film 770 may be employed.

The display device 700 illustrated in FIG. 36 includes a light-emitting element 782. The light-emitting element 782 includes a conductive layer 784, an EL layer 786, and a conductive layer 788. The display device 700 shown in FIG. 36 is capable of displaying an image by light emission from the EL layer 786 included in the light-emitting element 782.

The conductive layer 784 is connected to the conductive films functioning as a source electrode and a drain electrode included in the transistor 750. The conductive layer 784 is formed over the planarization insulating film 770 to function as a pixel electrode, i.e., one electrode of the display element. A conductive film which transmits visible light or a conductive film which reflects visible light can be used for the conductive layer 784. The conductive film which transmits visible light can be formed using a material including one kind selected from indium (In), zinc (Zn), and tin (Sn), for example. The conductive film which reflects visible light can be formed using a material including aluminum or silver, for example.

In the display device 700 shown in FIG. 36, an insulating film 730 is provided over the planarization insulating film 770 and the conductive layer 784. The insulating film 730 covers part of the conductive layer 784. Note that the light-emitting element 782 has a top emission structure. Therefore, the conductive layer 788 has a light-transmitting property and transmits light emitted from the EL layer 786. Although the top-emission structure is described as an example in this embodiment, one embodiment of the present invention is not limited thereto. A bottom-emission structure in which light is emitted to the conductive layer 784 side, or a dual-emission structure in which light is emitted to both of the conductive layer 784 side and the conductive layer 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 shown in FIG. 36, the structure is not limited thereto. In the case where the EL layer 786 is formed by a separate coloring method, the coloring film 736 is not necessarily provided.

The structure described in this embodiment can be used in appropriate combination with any of the structures described in the other embodiments.

(Embodiment 5)

In this embodiment, a display device that includes a semiconductor device of one embodiment of the present invention is described with reference to FIGS. 26A to 26C.

The display device illustrated in FIG. 26A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Further, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504*a*. For example, to the pixel circuit 501 in the m-th row and the n-th column (m is a natural number of less than or equal to X, and n is a natural number of less than or equal to Y), a pulse signal is input from the gate driver 504*a* through the scan line GL_m, and a data signal is input from the source driver 504*b* through the data line DL_n in accordance with the potential of the scan line GL_m.

Figure 26A:
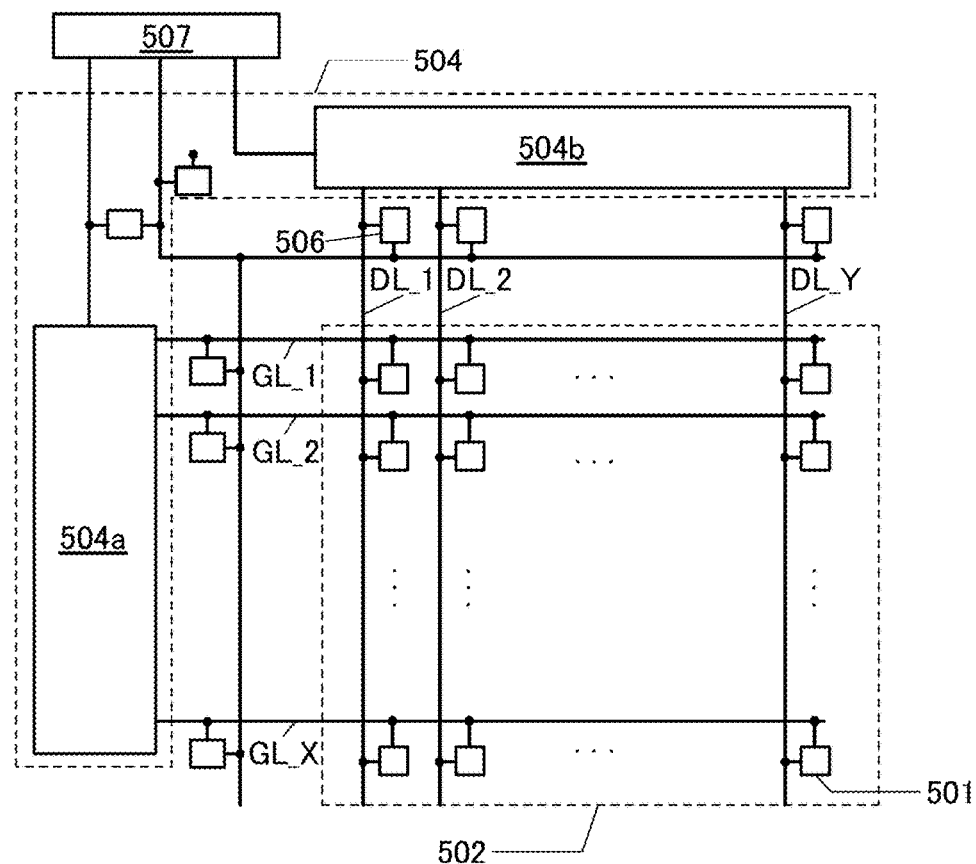
FIGS. 26A to 26C are a block diagram and circuit diagrams illustrating a display device.

The protection circuit 506 shown in FIG. 26A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 26A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504*a* or the protection circuit 506 may be configured to be connected to the source driver 504*b*. Alternatively, the protection circuit 506 may be configured to be connected to the terminal portion 507.

In FIG. 26A, an example in which the driver circuit portion 504 includes the gate driver 504*a* and the source driver 504*b* is shown; however, the structure is not limited thereto. For example, only the gate driver 504*a* may be formed and a separately prepared substrate where a source driver circuit is formed (e.g., a driver circuit substrate formed with a single crystal semiconductor film or a polycrystalline semiconductor film) may be mounted.

Figure 26B:
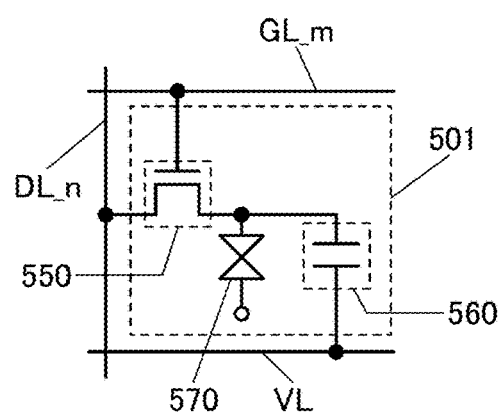

Each of the plurality of pixel circuits 501 in FIG. 26A can have the structure illustrated in FIG. 26B, for example.

The pixel circuit 501 illustrated in FIG. 26B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Further, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 26B, the pixel circuits 501 are sequentially selected row by row by the gate driver 504*a* illustrated in FIG. 26A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 26C:
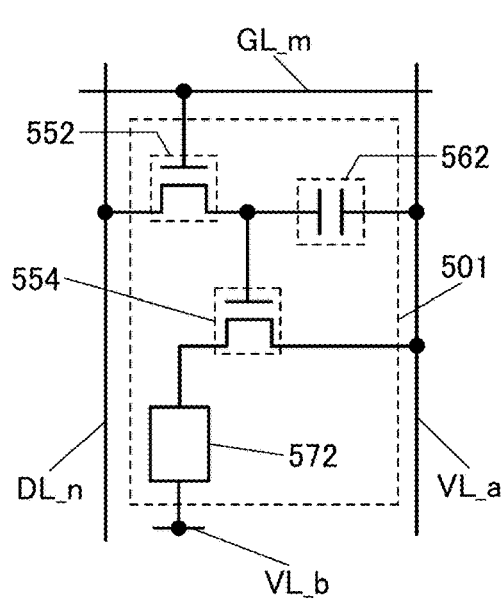

Alternatively, each of the plurality of pixel circuits 501 in FIG. 26A can have the structure illustrated in FIG. 26C, for example.

The pixel circuit 501 illustrated in FIG. 26C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Further, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 26C, the pixel circuits 501 are sequentially selected row by row by the gate driver 504a illustrated in FIG. 26A, whereby the transistors 552 are turned on and a data signal is written.

When the transistors 552 are turned off, the pixel circuits 501 in which the data has been written are brought into a holding state. Further, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structure described in this embodiment can be used in appropriate combination with any of the structures described in the other embodiments.

(Embodiment 6)

An example of a semiconductor device including an oxide semiconductor of one embodiment of the present invention is described below.

[Example of Semiconductor Device]

Figure 37A:
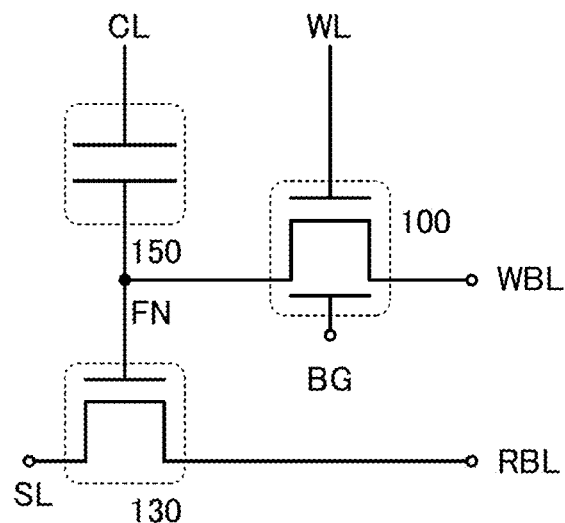
FIGS. 37A to 37D are circuit diagrams of an embodiment.

FIG. 37A is an example of a circuit diagram of the semiconductor device of one embodiment of the present invention. The semiconductor device in FIG. 37A includes the transistor 100, the transistor 130, the capacitor 150, a wiring WBL, a wiring RBL, a wiring WL, a wiring CL, a wiring BG, and a wiring SL.

One of a source or a drain of the transistor 130 is electrically connected to the wiring RBL, the other is electrically connected to the wiring SL, and a gate of the transistor 130 is electrically connected to one of a source and a drain of the transistor 100 and one electrode of the capacitor 150. The other of the source and the drain of the transistor 100 is electrically connected to the wiring WBL, and a first gate of the transistor 100 is electrically connected to the wiring WL. The other electrode of the capacitor 150 is electrically connected to the wiring CL. The wiring BG is electrically connected to a second gate of the transistor 100. Note that a node connecting the gate of the transistor 130, the one of the source and the drain of the transistor 100, and the one electrode of the capacitor 150 is referred to as a node FN.

The semiconductor device shown in FIG. 37A supplies a potential corresponding to the potential of the wiring WBL to the node FN when the transistor 100 is in an on state (i.e., is on). Meanwhile, the semiconductor device has a function of retaining the potential of the node FN when the transistor 100 is in an off state (i.e., is off). In other words, the semiconductor device shown in FIG. 37A functions as a memory cell of a memory device. When the semiconductor device illustrated in FIG. 37A is arranged in a matrix, a memory device (memory cell array) can be formed.

In the case where a display element such as a liquid crystal element or an organic electroluminescence (EL) element is electrically connected to the node FN, the semiconductor device in FIG. 37A can function as a pixel of a display device.

The on/off state of the transistor 100 can be selected in accordance with the potential supplied to the wiring WL or the wiring BG. The threshold voltage of the transistor 100 can be controlled by a potential supplied to the wiring WL or the wiring BG. A transistor with small off-state current is used as the transistor 100, whereby the potential of the node FN at the time when the transistor 100 is in a non-conduction state can be retained for a long time. Thus, the refresh rate of the semiconductor device can be reduced, resulting in low power consumption of the semiconductor device. By using a transistor including an oxide semiconductor film as the transistor 100, the transistor can have low off-state current.

Note that a reference potential, a ground potential, or a fixed potential such as an arbitrary fixed potential is supplied to the wiring CL. In that case, the apparent threshold voltage of the transistor 100 varies depending on the potential of the node FN. Conduction and non-conduction states of the transistor 130 change in response to the change in the apparent threshold voltage; thus, data of a potential retained in the node FN can be read as data.

To retain a potential retained in the node FN at 85° C. for 10 years ($3.15 \times 10^8$ seconds), off-state current is preferably lower than 4.3 yA (yoctoamperes, where 1 yA is $10^{-24}$ A) per femtofarad of capacitance and per micrometer of channel width of the transistor. In that case, the allowable potential variation in the node FN is preferably within 0.5 V. Alternatively, the off-state current is preferably lower than 1.5 yA at 95° C.

Furthermore, when the capacitance is increased, the potential can be retained in the node FN for a longer time. In other words, the retention time can be lengthened.

The semiconductor device in FIG. 37A has a feature that the potential of the gate electrode of the transistor 130 can be retained, and thus enables writing, retaining, and reading of data as follows.

Writing and retaining of data are described. First, the potential of the wiring WL is set to a potential at which the transistor 100 is turned on, so that the transistor 100 is turned on. Accordingly, the potential of the wiring WBL is supplied to the gate electrode of the transistor 130 and the capacitor 150. That is, predetermined charge is supplied to the gate electrode of the transistor 130 (writing). Here, one of two kinds of charges providing different potential levels (hereinafter referred to as a low-level charge and a high-level charge) is supplied. After that, the potential of the wiring WL is set to a potential at which the transistor 100 is turned off, so that the transistor 100 is turned off. Thus, the charge supplied to the gate electrode of the transistor 130 is retained (retaining).

Since the off-state current of the transistor 100 is extremely small, the charge of the gate electrode of the transistor 130 is retained for a long time.

Next, reading of data is described. An appropriate potential (a reading potential) is supplied to the wiring CL while a predetermined potential (a constant potential) is supplied to the wiring RBL, whereby the potential of the wiring SL varies depending on the amount of charge retained in the gate electrode of the transistor 130. This is because in the case of using an n-channel transistor as the transistor 130, an apparent threshold voltage $V_{th\_H}$ at the time when the high-level charge is given to the gate electrode of the transistor 130 is lower than an apparent threshold voltage $V_{th\_L}$ at the time when the low-level charge is given to the gate electrode of the transistor 130. Here, an apparent threshold voltage refers to the potential of the wiring CL that is needed to turn on the transistor 130. Thus, the potential of the wiring CL is set to a potential $V_0$ that is between $V_{th\_H}$ and $V_{th\_L}$, whereby charge supplied to the gate electrode of the transistor 130 can be determined. For example, in the case where the high-level charge is supplied to the gate electrode of the transistor 130 in writing and the potential of the wiring CL is $V_0$ ($>V_{th\_H}$), the transistor 130 is turned on. In the case where the low-level charge is supplied to the gate electrode of the transistor 130 in writing, even when the potential of the wiring CL is $V_0(V_{th\_L})$, the transistor 130 remains off. Thus, the data retained in the gate electrode of the transistor 130 can be read by determining the potential of the wiring SL. Note that, in order to reduce the number of wirings, WBL and RBL in FIG. 37A may be electrically connected to each other, for example.

Note that in the case where memory cells are arrayed, only data of desired memory cells need to be read. The wiring CL in the case where data is not read may be supplied with a potential at which the transistor 130 is turned off regardless of the state of the gate electrode, that is, a potential lower than $V_{th\_H}$. Alternatively, the wiring CL may be supplied with a potential at which the transistor 130 is turned on regardless of the state of the gate electrode, that is, a potential higher than $V_{th\_L}$.

Figure 37B:
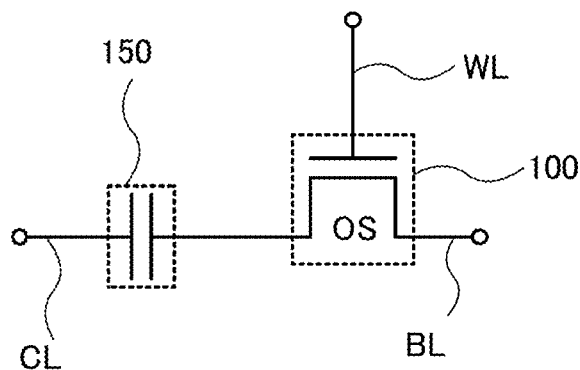

The semiconductor device illustrated in FIG. 37B is mainly different from the semiconductor device illustrated in FIG. 37A in that the transistor 130 is not provided. Also in this case, writing and retaining operation of data can be performed in a manner similar to that of the semiconductor device illustrated in FIG. 37A.

Next, reading of data is described. When the transistor 100 is turned on, the wiring BL in a floating state and the capacitor 150 are electrically connected to each other, and the charge is redistributed between the wiring BL and the capacitor 150. As a result, the potential of the wiring BL is changed. The amount of change in potential of the wiring BL varies depending on the potential of one electrode of the capacitor 150 (or the charge accumulated in the capacitor 150).

For example, the potential of the wiring BL after the charge redistribution is $(C_B \times V_{B0} + C \times V)/(C_B + C)$, where V is the potential of the one electrode of the capacitor 150, C is the capacitance of the capacitor 150, $C_B$ is the capacitance component of the wiring BL, and $V_{B0}$ is the potential of the wiring BL before the charge redistribution. Thus, it can be found that, assuming that the memory cell is in either of two states in which the potential of the one electrode of the capacitor 150 is $V_1$ and $V_1$ ($V_1>V_0$), the potential of the wiring BL in the case of retaining the potential $V_1 (=(C_B \times V_{B0} + C \times V_1)/(C_B+C))$ is higher than the potential of the wiring BL in the case of retaining the potential $V_0 (=(C_B \times V_{B0} + C \times V_0)/(G_B+C))$.

Then, by comparing the potential of the wiring BL with a predetermined potential, data can be read.

The semiconductor devices in FIGS. 37A and 37B can be used as a memory device of a CPU, for example.

Figure 38C:
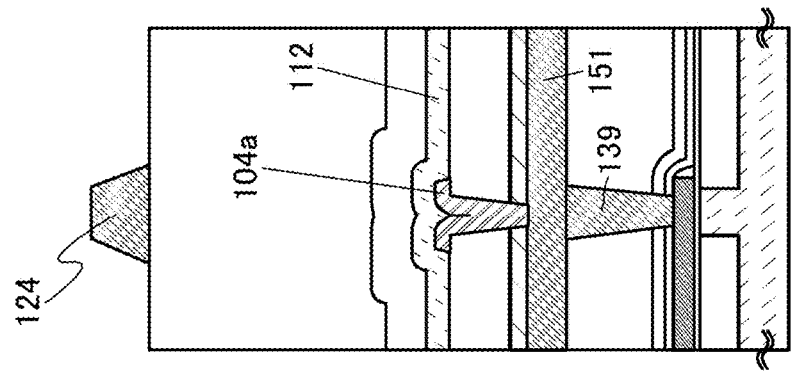
FIGS. 38A to 38C illustrate an example of a semiconductor device of one embodiment of the present invention.
Figure 38B:
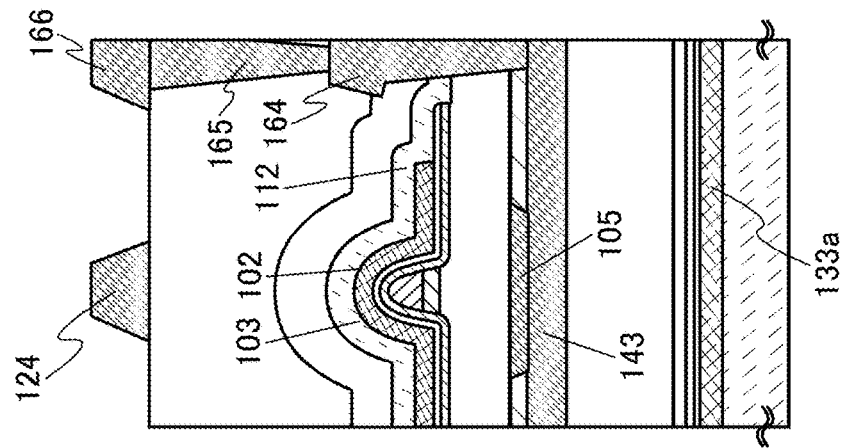
Figure 38A:
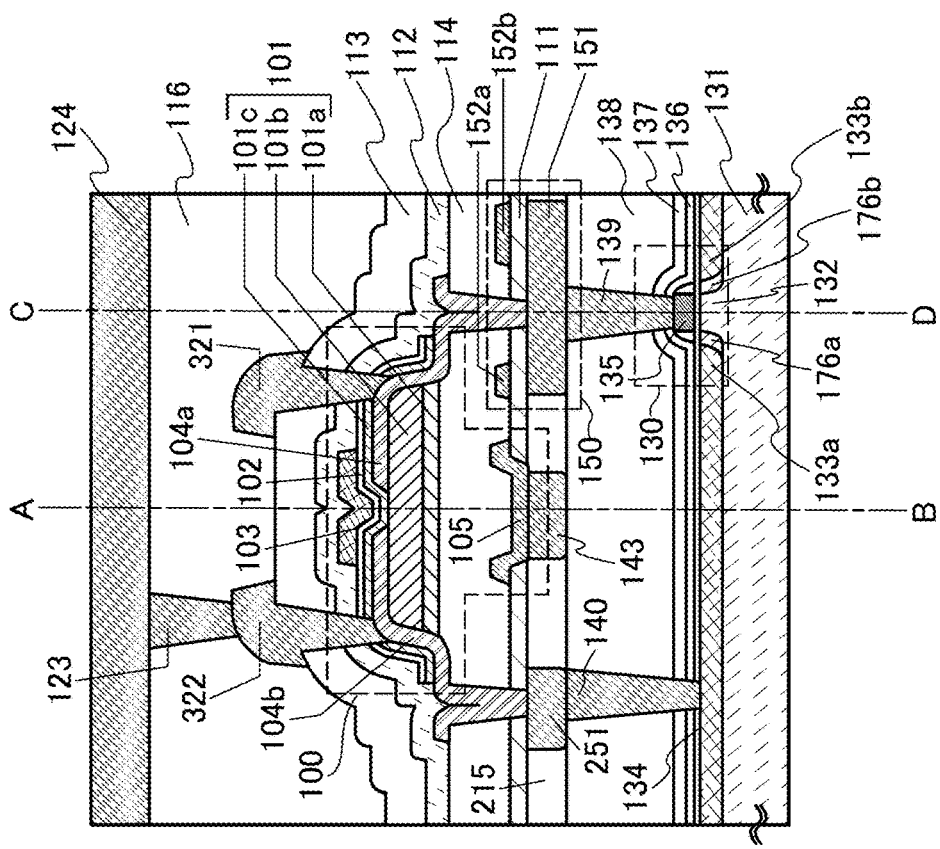

FIGS. 38A to 38C illustrate an example of a cross-sectional structure of a semiconductor device in which the circuit shown in FIG. 37A can be obtained. Note that, FIGS. 38A to 38C show an example in which WBL and RBL are electrically connected to each other in order to reduce the number of wirings. Note that FIG. 38B illustrates a cross section taken along dashed dotted line A-B in FIG. 38A, which is perpendicular to the cross section in FIG. 38A. Note that FIG. 38C illustrates a cross section taken along dashed dotted line C-D in FIG. 38A, which is perpendicular to the cross section in FIG. 38A.

The transistor 100 is preferably provided above the transistor 130. Stacking the transistor 100 and the transistor 130 makes it possible to reduce the circuit area. As the transistor 100, for example, the transistor in Embodiment 3 can be used. FIGS. 38A to 38C show an example in which the transistor 100 in FIGS. 12A to 12C is used.

The transistor 130 includes a first semiconductor material. The transistor 100 includes a second semiconductor material. Examples of semiconductors that can be used as the first semiconductor material or the second semiconductor material are semiconductor materials such as silicon, germanium, gallium, and arsenic; compound semiconductor materials containing silicon, germanium, gallium, arsenic, or aluminum; organic semiconductor materials; and oxide semiconductor materials.

The first semiconductor material and the second semiconductor material may be the same material but they are preferably different semiconductor materials. Here, the case where single crystal silicon is used as the first semiconductor material and an oxide semiconductor is used as the second semiconductor material is described.

[First Transistor]

The transistor 130 is provided using a semiconductor substrate 131 and includes a semiconductor layer 132 which is part of the semiconductor substrate 131, a gate insulating film 134, a gate electrode 135, and low-resistance layers 133a and 133b functioning as source and drain regions.

The transistor 130 may be either a p-channel transistor or an n-channel transistor, and an appropriate transistor may be used depending on the circuit configuration or the driving method.

It is preferable that a region of the semiconductor layer 132 where a channel is formed, a region in the vicinity thereof, the low-resistance layers 133a and 133b serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 130 may be a high-electron-mobility transistor (HEMT) with GaAs and GaAlAs or the like.

The transistor 130 may include regions 176a and 176b serving as lightly doped drain (LDD) regions.

The low-resistance layers 133a and 133b contain an element that imparts n-type conductivity, such as phosphorus, or an element that imparts p-type conductivity, such as boron, in addition to a semiconductor material used for the semiconductor layer 132.

The gate electrode 135 can be formed using a semiconductor material such as silicon containing the element that imparts n-type conductivity, such as phosphorus, or the element that imparts p-type conductivity, such as boron, or a conductive material such as a metal material, an alloy material, or a metal oxide material.

Figure 29B:
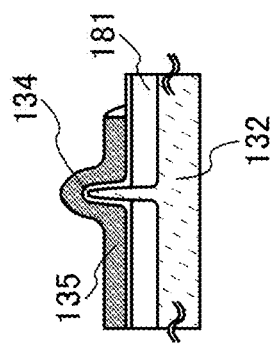
FIGS. 29A and 29B illustrate an example of a transistor.
Figure 29A:
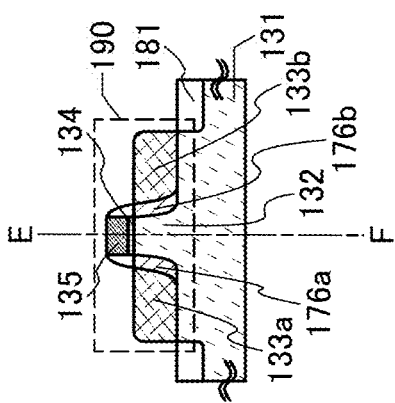

Here, a transistor 190 in FIGS. 29A and 29B may be used instead of the transistor 130. FIG. 29B illustrates a cross section taken along dashed dotted line E-F in FIG. 29A, which is perpendicular to the cross section in FIG. 29A. In the transistor 190, the semiconductor layer 132 (part of the semiconductor substrate) in which a channel is formed has a protruding portion, and the gate insulating film 134, and the gate electrode 135 are provided along top and side surfaces of the protruding portion. Furthermore, an element isolation layer 181 is provided between the transistors. The transistor 190 is also referred to as a FIN transistor because it utilizes a protruding portion of the semiconductor substrate. Note that an insulating film serving as a mask for forming the protruding portion may be provided in contact with the top of the protruding portion. Although the case where the protruding portion is formed by processing part of the semiconductor substrate is described here, a semiconductor layer having a protruding shape may be formed by processing a silicon-on-insulator (SOI) substrate.

An insulating film 136, an insulating film 137, and an insulating film 138 are stacked in this order to cover the transistor 130.

In a manufacturing process of the semiconductor device, the insulating film 136 functions as a protective film for activation of an element imparting conductivity that is added to the low-resistance layers 133a and 133b. The insulating film 136 is not necessarily provided.

In the case where a silicon-based semiconductor material is used for the semiconductor layer 132, the insulating film 137 preferably contains hydrogen. When heat treatment is performed, dangling bonds in the semiconductor layer 132 are terminated by hydrogen contained in the insulating film 137, whereby the reliability of the transistor 130 can be improved.

The insulating film 138 functions as a planarization film for eliminating a level difference caused by the transistor 130 or the like underlying the insulating film 138. The top surface of the insulating film 138 may be planarized by a chemical mechanical polishing (CMP) method or the like.

In the insulating films 136, 137, and 138, a plug 140 electrically connected to the low-resistance layer 133a, the low-resistance layer 133b, and the like, and a plug 139 electrically connected to the gate electrode 135 of the transistor 130, and the like may be embedded.

The barrier film 111 is provided between the transistor 130 and the transistor 100. The barrier film 111 has a function of inhibiting water and hydrogen of layers under the barrier film 111 from diffusing upward. The barrier film 111 preferably has low oxygen permeability. Here, "a film to which water and hydrogen are less likely to diffuse" means that the film has lower water and hydrogen permeability than silicon oxide or the like that is generally used as an insulating film, for example. Furthermore, "a film has low oxygen permeability" means that, for example, the film has lower oxygen permeability than silicon oxide or the like that is generally used as an insulating film.

As the barrier film 111, an insulating film containing a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) can be used. The barrier film 111 may be a single layer or a stacked layer. Alternatively, aluminum oxide, bismuth oxide, germanium oxide, niobium oxide, silicon oxide, titanium oxide, tungsten oxide, yttrium oxide, zirconium oxide, or gallium oxide may be added to the insulating film, for example. Alternatively, the insulating film may be subjected to nitriding treatment to be an oxynitride film. A layer of silicon oxide, silicon oxynitride, or silicon nitride may be stacked over the insulating film. Aluminum oxide is particularly preferable because of its excellent barrier property against water or hydrogen.

The materials given above have excellent barrier properties against oxygen as well as hydrogen and water. The use of any of the materials can inhibit diffusion of oxygen released when the insulating film 114 is heated to the layers under the barrier film 111. Consequently, the amount of oxygen that is released from the insulating film 114 and is likely to be supplied to the semiconductor layer of the transistor 100 can be increased.

Here, it is preferable that hydrogen, water, and the like in the layers under the barrier film 111 be reduced as much as possible by heat treatment, for example. The heat treatment may be performed at 170° C. or higher under an inert gas atmosphere or a reduced pressure atmosphere.

In the case where single crystal silicon is used for a semiconductor layer in the transistor 130, the heat treatment can also serve as treatment for terminating dangling bonds of silicon with hydrogen (the treatment is also referred to as hydrogenation treatment).

A conductive layer 151, a conductive layer 152a, and a conductive layer 152b are provided so that the barrier film 111 is positioned therebetween to form the capacitor 150. The conductive layer 151 is electrically connected to the conductive layer 104a of the transistor 100.

The insulating film 114 is provided to cover the barrier film 111, the conductive layers 152a and 152b, the conductive layer 105, and the like. For the insulating film 114, the description of the insulating film 114 in FIGS. 12A to 12C is referred to, for example.

[Second Transistor]

The transistor 100 is provided over the insulating film 114. In an example shown in FIGS. 38A to 38C, the transistor 100 illustrated in FIGS. 12A to 12C is used.

The transistor 100 in FIGS. 38A to 38C includes the conductive layer 105 functioning as a second gate electrode. The conductive layer 105 may be formed at the same time as the conductive layers 152a and 152b that are part of the capacitor 150. By forming these conductive layers at the same time, for example, the process can be simplified.

The transistor 100 is covered with the insulating film 112, the insulating film 113, and the insulating film 116.

For the insulating film 112, as in the case of the barrier film 111, a material to which water and hydrogen do not easily diffuse is preferably used. In particular, a material relatively impermeable to oxygen is preferably used.

Note that the insulating film 112 may have a stacked-layer structure of two or more layers. In this case, for example, the insulating film 112 may be formed to have a two-layer structure in which the top layer is preferably formed using a material to which water and hydrogen do not easily diffuse. The bottom layer is formed using, for example, silicon oxide, silicon oxynitride, silicon nitride oxide, silicon nitride, aluminum oxide, aluminum oxynitride, aluminum nitride oxide, aluminum nitride, or the like. The bottom insulating layer may be an insulating film from which oxygen is released by heating in a manner similar to that of the insulating film 114, so that oxygen may be supplied also from above the semiconductor layer 101 through the gate insulating film 102.

By covering the semiconductor layer 101 with the insulating film 112, oxygen can be prevented from being released from the semiconductor layer 101 to a portion over the insulating film 112. Furthermore, oxygen released from the insulating film 114 and the like can be confined below the insulating film 112, resulting in an increase in the amount of oxygen to be supplied to the semiconductor layer 101.

By providing the insulating film 112, entry of water and hydrogen to the oxide semiconductor from the outside can be suppressed. Consequently, a highly reliable transistor in which a change in electrical characteristics is suppressed can be obtained.

The insulating film 113 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like.

The insulating film 116 covering the transistor 100 functions as a planarization layer which covers an uneven surface shape of an underlying layer. The insulating film 113 may function as a protective layer when the insulating film 116 is formed. The insulating film 113 is not necessarily provided. The insulating film 116 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like.

A plug 321, a plug 322, and a plug 123 that are electrically connected to the conductive layer 104b are embedded in the insulating film 112, the insulating film 113, and the insulating film 116.

A wiring 124 and the like that are electrically connected to the plug 322 are provided over the insulating film 116.

As illustrated in FIGS. 38A to 38C, the insulating film 137 which contains the same material as the barrier film 111 may be provided over the insulating film 136 containing hydrogen. This structure can effectively prevents water or hydrogen remaining in the insulating film 136 containing hydrogen from diffusing upward.

Wirings such as the wiring 124 and a wiring 166; conductive layers such as a conductive layer 143, the conductive layer 151, the conductive layer 152a, the conductive layer 152b, and a conductive layer 251; and plugs such as the plug 123, the plug 139, the plug 140, a plug 164, and a plug 165 can be formed using any of conductive materials such as metal materials, alloy materials, and metal oxide materials. It is particularly preferable to use a high-melting-point material that has both heat resistance and conductivity, such as tungsten or molybdenum, and it is particularly preferable to use tungsten. A stack including a material such as titanium nitride or titanium and another material may be used.

[Example of Manufacturing Method]

Next, an example of a method for manufacturing the semiconductor device in FIGS. 38A to 38C is described with reference to FIGS. 39A to 39E, FIGS. 40A to 40D, FIGS. 41A to 41C, and FIGS. 42A and 42B.

First, the semiconductor substrate 131 is prepared. As the semiconductor substrate 131, for example, a single crystal silicon substrate (including a p-type semiconductor substrate or an n-type semiconductor substrate), a compound semiconductor substrate containing silicon carbide or gallium nitride, or the like can be used. An SOI substrate may be used as the semiconductor substrate 131. The case where single crystal silicon is used for the semiconductor substrate 131 is described below.

Next, an element isolation layer (not illustrated) is formed in the semiconductor substrate 131. The element isolation layer may be formed by a local oxidation of silicon (LOCOS) method, a shallow trench isolation (STI) method, mesa isolation, or the like.

In the case where a p-channel transistor and an n-channel transistor are formed on the same substrate, an n-well or a p-well may be formed in part of the semiconductor substrate 131. For example, a p-well may be formed by adding an impurity element imparting p-type conductivity, such as boron, to an n-type semiconductor substrate 131, and an n-channel transistor and a p-channel transistor may be formed on the same substrate.

Next, an insulating film to be the gate insulating film 134 is formed over the semiconductor substrate 131. For example, a surface of the semiconductor substrate 131 is oxidized, whereby a silicon oxide film is formed. Alternatively, the insulating film may be formed as a stack of a silicon oxide film and a silicon oxynitride film formed in such a manner that the silicon oxide film is formed by thermal oxidation, and then a surface of the silicon oxide film is nitrided by nitridation treatment. Further alternatively, the insulating film may be formed using silicon oxide, silicon oxynitride, a metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like.

The insulating film may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

Next, a conductive film to be the gate electrode 135 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a lithography process or the like and an unnecessary portion of the conductive film is removed. Then, the resist mask is removed. In this manner, the gate electrode 135 can be formed.

Here, a method for processing a film is described. As a processing method, a variety of fine processing techniques can be used. For example, a method may be used in which a resist mask formed by a photolithography process or the like is subjected to slimming treatment. Alternatively, a method may be used in which a dummy pattern is formed by a photolithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used.

Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

An organic resin film having a function of improving adhesion between the film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In a particularly minute process, the organic resin film is preferably formed using a material functioning as an anti-reflection film against light for exposure. Examples of such an organic resin film serving as an anti-reflection film include bottom anti-reflection coating (BARC) film. The organic resin film may be removed at the same time as the removal of the resist mask or after the resist mask is removed.

After that, for the description of the process using a resist mask, the method for processing the gate electrode 135 may be referred to, for example. Furthermore, in this specification, the description of removal of the resist after the etching of the film to be processed is omitted in some cases.

After the gate electrode 135 is formed, a sidewall covering the side surface of the gate electrode 135 may be formed. The sidewall can be formed in such a manner that an insulating film thicker than the gate electrode 135 is formed and subjected to anisotropic etching so that only a portion of the insulating film on the side surface of the gate electrode 135 remains.

FIGS. 39A to 39E illustrate an example in which etching of the gate insulating film is not performed at the time of formation of the sidewall. However, the insulating film to be the gate insulating film 134 may be performed at the same time as formation of the sidewall. In this case, the gate insulating film 134 is provided below the gate electrode 135 and the sidewall.

Figure 39A:
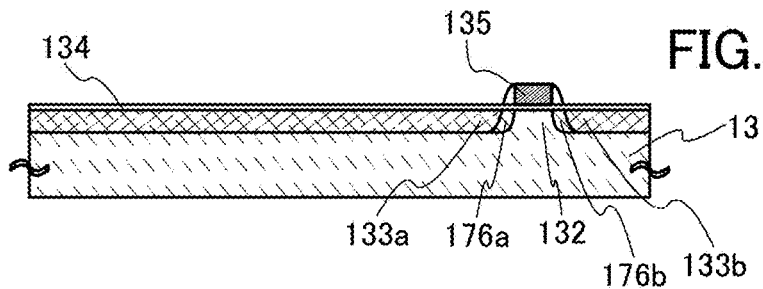
FIGS. 39A to 39E illustrate a manufacturing method of a semiconductor device of one embodiment of the present invention.

Next, an element imparting n-type conductivity, such as phosphorus, or an element imparting p-type conductivity, such as boron, is added to a region of the semiconductor substrate 131 where the gate electrode 135 (and the sidewall) is not provided. FIG. 39A illustrates a schematic cross-sectional view at this stage.

Next, the insulating film 136 is formed, and then, heat treatment is performed to activate the aforementioned element which imparts conductivity, for example. The heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

The insulating film 136 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 136 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

At this stage, the transistor 130 is formed. Furthermore, a third transistor 160 may be formed in a manner similar to that for forming the transistor 130.

Next, the insulating film 137 and the insulating film 138 are formed.

The insulating film 137 may be formed using any of the materials that can be used for the insulating film 136, and may be formed using silicon nitride containing oxygen and hydrogen (SiNOH). Alternatively, the insulating film 138 can be formed using any of the materials that can be used for the insulating film 136, and is preferably formed using silicon oxide with high step coverage that is formed by reacting tetraethyl orthosilicate (TEOS), silane, or the like with oxygen, nitrous oxide, or the like.

The insulating films 137 and 138 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, the top surface of the insulating film 138 is planarized by a CMP method or the like. As the insulating film 138, a planarization film may be used. At this time, a CMP method or the like is not necessarily used for planarization. The planarization film can be formed by, for example, an atmospheric pressure CVD method, a coating method, or the like. An example of a film which can be formed by an atmospheric pressure CVD method is a film of boron phosphorus silicate glass (BPSG). Furthermore, an example of a film which can be formed by a coating method is a film of hydrogen silsesquioxane (HSQ). After that, heat treatment may be performed so that dangling bonds in the semiconductor layer 132 are terminated by hydrogen released from the insulating film 137.

Figure 39B:
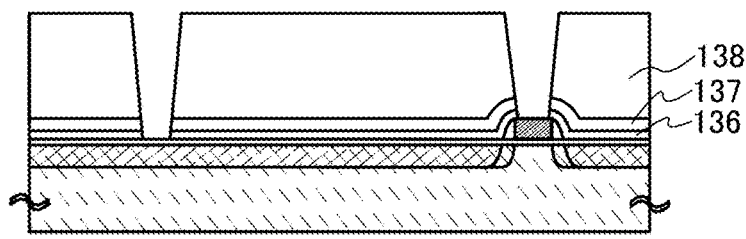
Figure 39C:
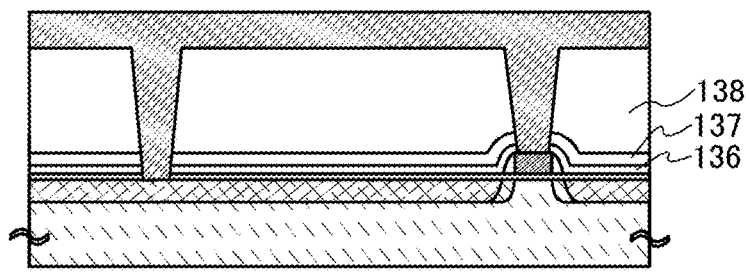
Figure 39D:
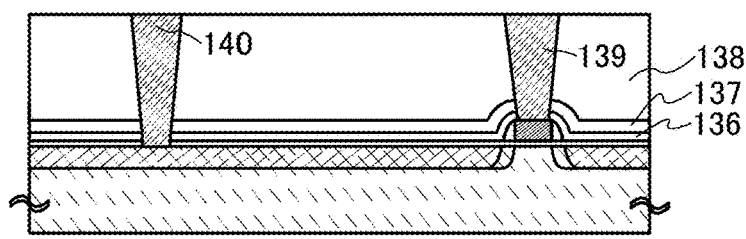
Figure 39E:
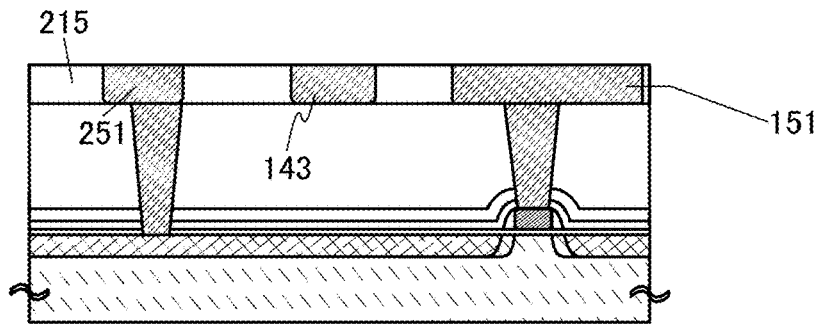

Next, openings reaching the low-resistance layers 133*a* and 133*b*, the gate electrode 135, and the like are formed in the insulating film 136, the insulating film 137, and the insulating film 138 (see FIG. 39B). After that, a conductive film is formed to fill the openings (see FIG. 39C). Then, planarization treatment is performed on the conductive film so that the top surface of the insulating film 138 is exposed, whereby the plug 139, the plug 140, and the like are formed (see FIG. 39D). The conductive film can be formed by a sputtering method, a CVD method (including a thermal CVD method, an MOCVD method, a PECVD method, and the like), an MBE method, an ALD method, a PLD method, or the like.

Next, an insulating film 215 is deposited over the insulating film 138. The insulating film 215 can be formed using a material and a method similar to those of the insulating film 136 and the like. After the insulating film 215 is formed, heat treatment may be performed.

The third heat treatment can be performed under the conditions given as an example in the above description of the stacked-layer structure. For example, the conditions described for the first heat treatment or the like can be used.

Then, openings are formed in the insulating film 215. After that, a conductive film is formed to fill the openings and subjected to planarization treatment so that the top surface of the insulating film 215 is exposed, whereby the conductive layer 251, the conductive layer 143, the conductive layer 151, and the like are formed (see FIG. 39E). In the case where the conductive film is formed in the opening, for example, a material such as titanium nitride or titanium may be provided in the opening, and then another conductive material may be stacked thereover. For example, use of titanium nitride or titanium in the lower layer of the stacked-layer film can improve adhesion with an opening.

Then, the barrier film 111 is deposited, and an opening is formed (see FIG. 40A). The barrier film 111 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, a conductive film to be the conductive layers 105, 152a, and 152b is deposited. After that, the conductive layers 105, 152a, and 152b are formed by etching or the like (see FIG. 40B).

Next, the insulating film 114 is deposited. The insulating film 114 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

To make the insulating film 114 contain excess oxygen, the insulating film 114 may be deposited in an oxygen atmosphere, for example. Alternatively, a region containing excess oxygen may be formed by introduction of oxygen into the insulating film 114 that has been deposited. Both of the methods may be combined.

For example, oxygen (at least including any of oxygen radicals, oxygen atoms, and oxygen ions) is introduced into the insulating film 114 which has been deposited, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be contained in the gas containing oxygen for the oxygen introduction treatment. Furthermore, hydrogen or the like may be contained. For example, a mixed gas of carbon dioxide, hydrogen, and argon may be used.

After the insulating film 114 is formed, the insulating film 114 may be subjected to planarization treatment using a CMP method or the like to improve the planarity the top surface thereof.

Next, a semiconductor film to be the insulating layer 101a and a semiconductor film to be the semiconductor layer 101b are deposited in this order (see FIG. 40C). The semiconductor films are preferably formed successively without contact with the air. The semiconductor film to be the insulating layer 101a and the semiconductor film to be the semiconductor layer 101b can be formed by a sputtering method, a CVD method, an MBE method, a PLD method, an ALD method, or the like.

Note that in the case where In—Ga—Zn oxide layers formed by an MOCVD method are used as the semiconductor to be the insulating layer 101a and the semiconductor to be the semiconductor layer 101b, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Further alternatively, diethylzinc or the like may be used instead of dimethylzinc.

Here, after the insulating layer 101a is formed, oxygen may be introduced into the insulating layer 101a. For example, oxygen (at least including any of oxygen radicals, oxygen atoms, and oxygen ions) is introduced into the insulating layer 101a that has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be contained in the gas containing oxygen for the oxygen introduction treatment. Furthermore, hydrogen or the like may be contained. For example, a mixed gas of carbon dioxide, hydrogen, and argon may be used.

After the semiconductor layers 101a and 101b are formed, heat treatment may be performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. Note that the heat treatment may be performed directly after the formation of the semiconductor films or may be performed after the semiconductor films are processed into the island-shaped semiconductor layers 101a and 101b. Through the heat treatment, oxygen can be supplied to the semiconductor films from the insulating film 114 and the oxide film; thus, oxygen vacancy in the semiconductor films can be reduced.

Then, a stacked-layer structure including the island-shaped semiconductor layers 101a and 101b are formed using a resist mask (see FIG. 40D). Note that, in some cases, part of the insulating film 114 is etched in the etching of the semiconductor films to reduce the thickness of a portion of the insulating film 114 which is not covered with the insulating layer 101a and the semiconductor layer 101b. For this reason, the insulating film 114 is preferably formed to have a large thickness so as not to be removed by the etching.

Note that there is a possibility that the resist is totally removed depending on the etching conditions of the semiconductor films; therefore, what is called a hard mask formed of a material with high resistance to etching, such as an inorganic film or a metal film, may be used. Here, for example, a conductive film is used as a hard mask 281. FIG.

41A illustrates an example in which the insulating layer 101a and the semiconductor layer 101b are formed in such a manner that the semiconductor films are processed using the hard mask 281. Here, when the material which can be used as the conductive layers 104a and 104b is used for the hard mask 281, the conductive layers 104a and 104b can be formed by processing the hard mask 281. With use of such a method, the transistor 100 illustrated in FIGS. 30A and 30B can be manufactured, for example.

Figure 41A:
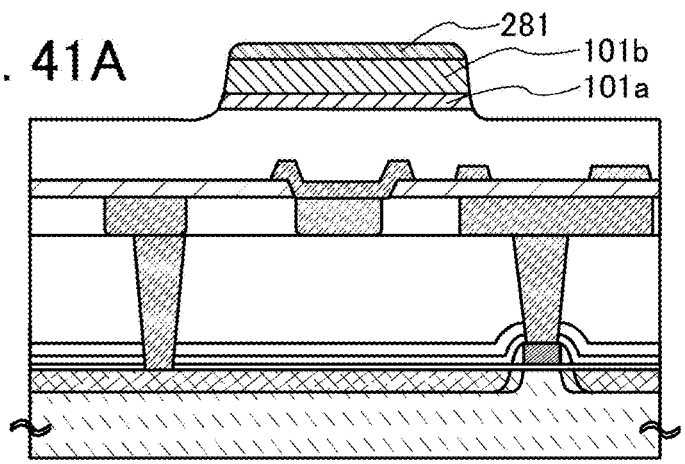
FIGS. 41A to 41C illustrate a manufacturing method of a semiconductor device of one embodiment of the present invention.
Figure 41B:
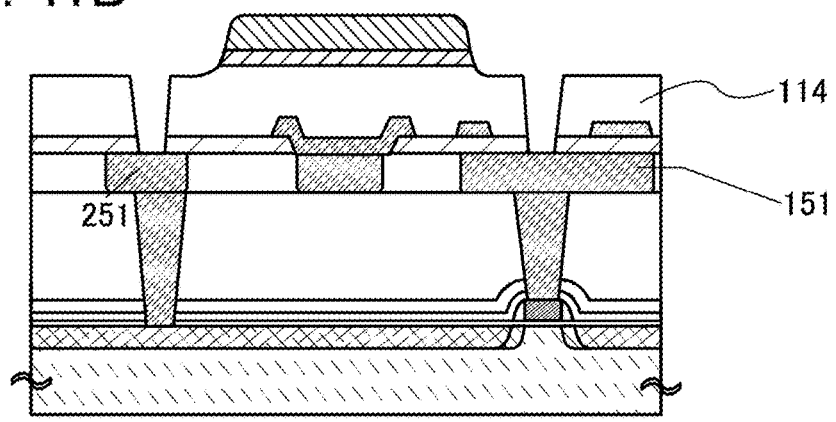

After a structure in FIG. 40D is formed, openings reaching the conductive layer 151, the conductive layer 251, and the like are formed in the insulating film 114 (see FIG. 41B). After that, a conductive film to be the conductive layer 104a, the conductive layer 104b, and the like is formed to fill the openings provided in the insulating film 114. The conductive film to be the conductive layer 104a, the conductive layer 104b, and the like can be formed by, for example, a sputtering method, a CVD method (including a thermal CVD method, an MOCVD method, a PECVD method, and the like), an MBE method, an ALD method, or a PLD method. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Figure 41C:
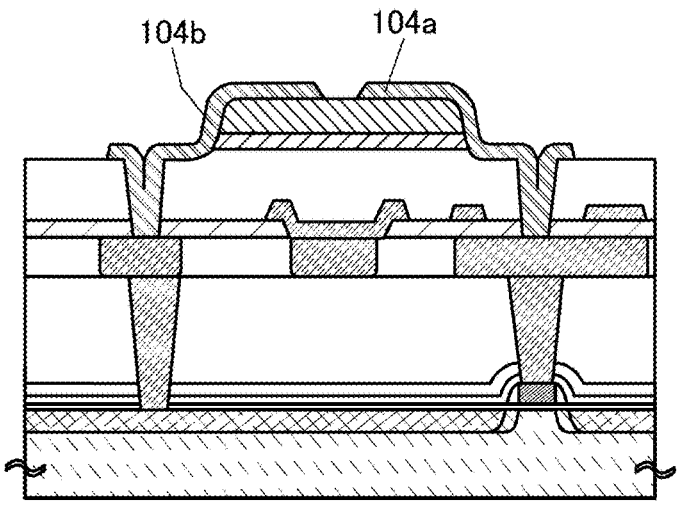
Figure 42A:
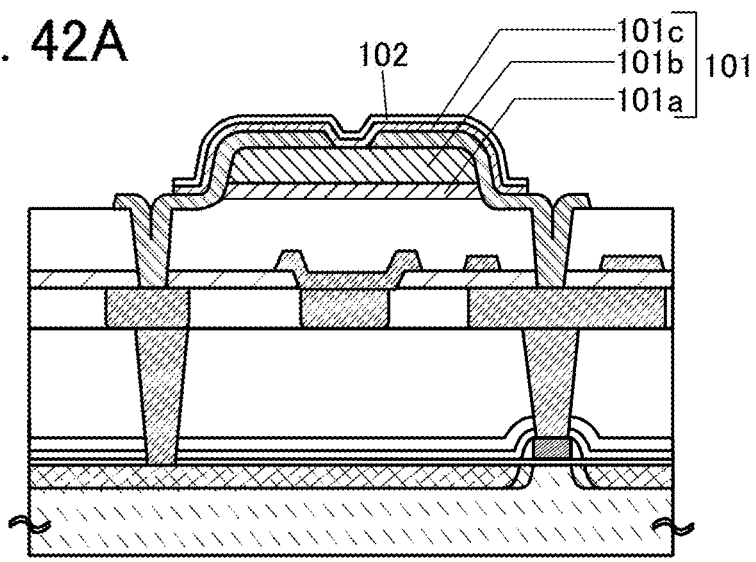
FIGS. 42A and 42B illustrate a manufacturing method of a semiconductor device of one embodiment of the present invention.
Figure 42B:
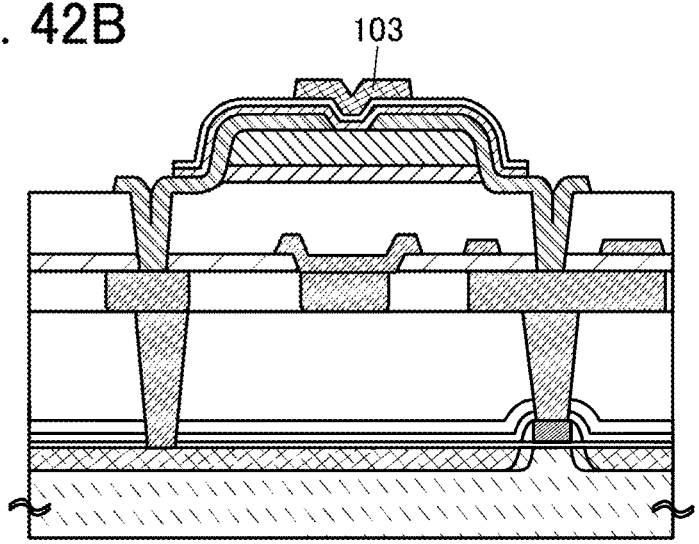

Next, with the use of a resist mask, an unnecessary portion of the conductive film to be the conductive layer 104a, the conductive layer 104b, and the like is removed by etching, so that the conductive layer 104a, the conductive layer 104b, and the like are formed (see FIG. 41C). Here, in some cases, parts of the upper portions of the semiconductor layer 101b and the insulating film 114 are etched in the etching of the conductive film to reduce the thickness of a portion where the conductive layer 104a and the conductive layer 104b do not overlap the semiconductor layer 101b. For this reason, the semiconductor film to be the semiconductor layer 101b, and the like are preferably formed to have a large thickness in advance in consideration of the etching depth.

Next, the insulating layer 101c and the gate insulating film 102 are formed. Then, etching process is performed using a resist mask (see FIG. 42A). Next, a conductive film to be the gate electrode 103 is deposited and the conductive film is processed using a resist mask, whereby the gate electrode 103 is formed (see FIG. 42B).

For the deposition method of the insulating layer 101c, the deposition method of the insulating layer 101a may be referred to, for example.

After the insulating layer 101c is formed, oxygen may be introduced into the insulating layer 101c. For example, oxygen (at least including any of oxygen radicals, oxygen atoms, and oxygen ions) is introduced into the insulating layer 101c that has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be contained in the gas containing oxygen for the oxygen introduction treatment. Furthermore, hydrogen or the like may be contained. For example, a mixed gas of carbon dioxide, hydrogen, and argon may be used.

At this stage, the transistor 100 is formed.

Next, the insulating film 112 is formed. The insulating film 112 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

After the insulating film 112 is formed, heat treatment may be performed. Through the heat treatment, oxygen can be supplied from the insulating film 114 and the like to the semiconductor layer 101 to reduce oxygen vacancy in the semiconductor layer 101.

Furthermore, the insulating film 112 may have a stacked-layer structure of two or more layers.

Next, the insulating film 113 is formed. The insulating film 113 can be formed by a sputtering method, a CVD method (including a thermal CVD method, an MOCVD method, a PECVD method, and the like), an MBE method, an ALD method, a PLD method, or the like, for example. In particular, it is preferable that the insulating film 113 be formed by a CVD method, more preferably a plasma CVD method because coverage can be favorable. It is preferable to use a thermal CVD method, an MOCVD method, or an ALD method in order to reduce plasma damage.

Next, openings reaching the conductive layer 104a and the like are provided in the insulating film 113, the insulating film 112, the gate insulating film 102, and the insulating layer 101c. Next, a conductive film is formed to fill the openings and an unnecessary portion is removed using a resist mask, whereby the plug 321 and the plug 322 are formed.

Next, the insulating film 116 is formed. The insulating film 116 can be formed by a sputtering method, a CVD method (including a thermal CVD method, an MOCVD method, a PECVD method, and the like), an MBE method, an ALD method, a PLD method, or the like, for example. In the case where the insulating film 116 is formed using an organic insulating material such as an organic resin, a coating method such as a spin coating method may be used. After the insulating film 116 is formed, the top surface thereof is preferably subjected to planarization treatment. The material and formation method for the insulating film 138 may be used for the insulating film 116.

Subsequently, the plug 123 reaching the plug 322, and the like are formed in the insulating film 116 by a method similar to that described above.

A conductive film is formed over the insulating film 116. Then, unnecessary portions of the conductive film are removed by etching using a resist mask in a manner similar to that described above, whereby the wiring 124 and the like can be formed.

Through the above steps, the semiconductor device in one embodiment of the present invention can be manufactured.

At least part of this embodiment can be implemented in combination with any of the other embodiments described in this specification as appropriate.

(Embodiment 7)

In this embodiment, an example of a circuit including the transistor of one embodiment of the present invention is described with reference to drawings.

[Circuit Configuration Example]

When a connection between transistors, wirings, or electrodes is changed from that of the semiconductor device in which Embodiment 1 is used, a variety of circuits can be formed. Examples of circuit configurations that can be achieved by using a semiconductor device of one embodiment of the present invention are shown below.

[CMOS Circuit]

Figure 37C:
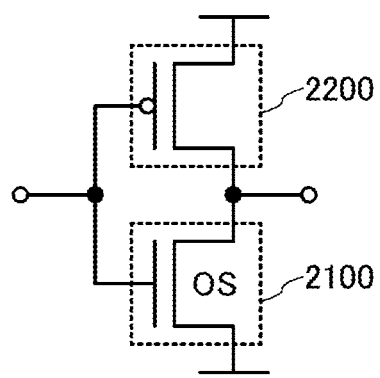

A circuit diagram in FIG. 37C shows a configuration of a so-called CMOS circuit in which a p-channel transistor 2200 and an n-channel transistor 2100 are connected to each other in series and in which gates of them are connected to each other. Note that transistors including a second semiconductor material are denoted by "OS" in drawings. Here, the CMOS circuit described in this embodiment can be used as a basic element of a logic circuit such as a NAND circuit, a NOR circuit, an encoder, a decoder, a multiple amplifier (MUX), or a demultiplexer (DEMUR).

[Analog Switch]

Figure 37D:
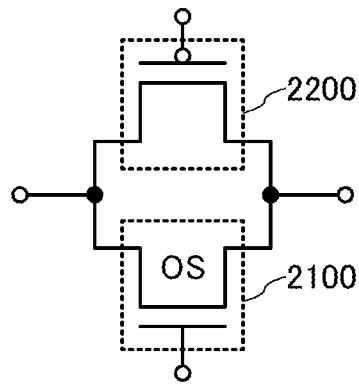

A circuit diagram in FIG. 37D shows a configuration in which sources of the transistors 2100 and 2200 are connected to each other and drains of the transistors 2100 and 2200 are connected to each other. With such a configuration, the transistors can function as a so-called analog switch.

At least part of this embodiment can be implemented in combination with any of the other embodiments described in this specification as appropriate.

(Embodiment 8)

In this embodiment, a display module that includes a semiconductor device of one embodiment of the present invention is described with reference to FIG. 27.

Figure 27:
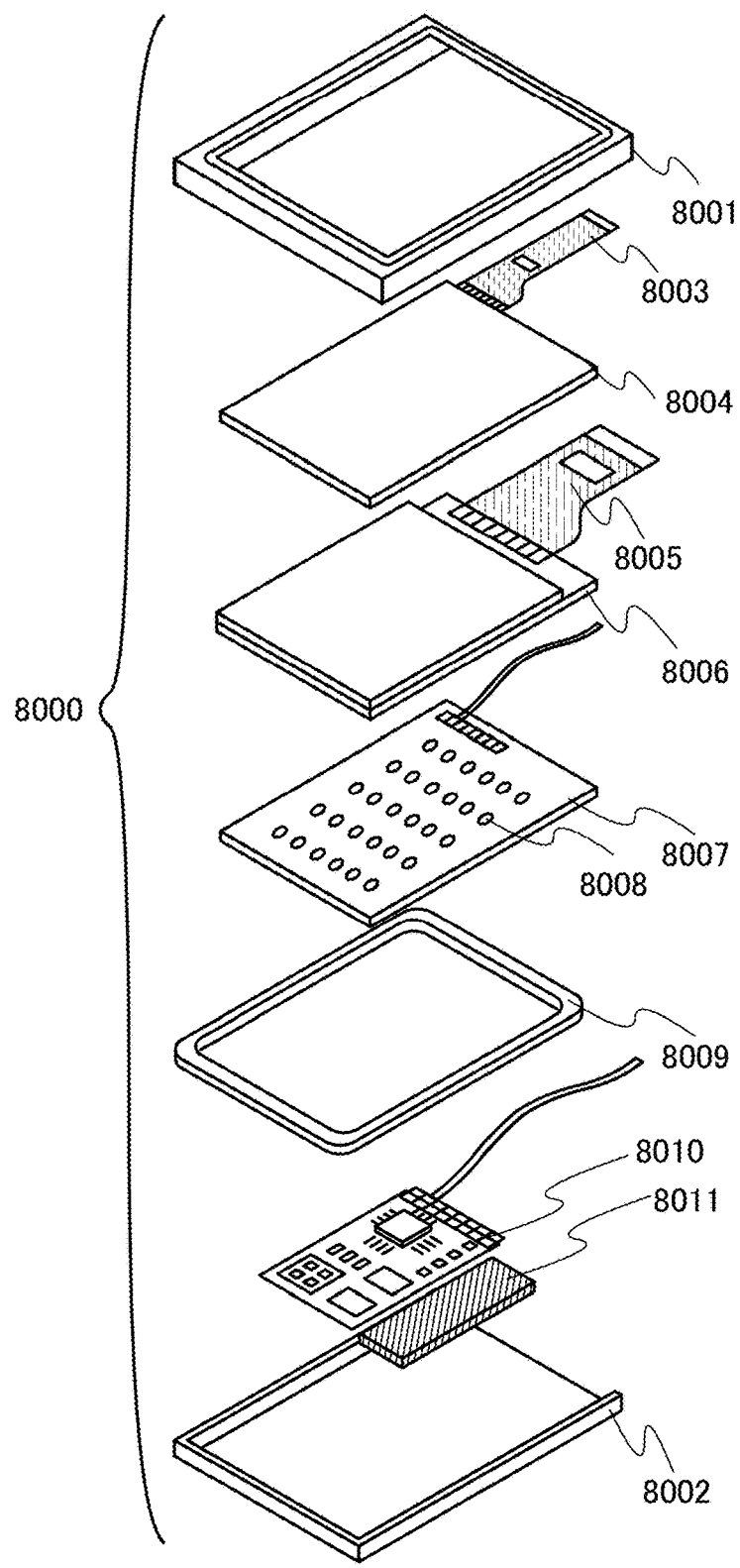
FIG. 27 illustrates a display module of an embodiment.

In a display module 8000 illustrated in FIG. 27, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 27, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

The display module 8000 described in this embodiment may have flexibility. Thus, the display module 8000 can be attached to a curved surface or an irregular shape, whereby a variety of applications are achieved.

The structure described in this embodiment can be used in appropriate combination with any of the structures described in the other embodiments.

(Embodiment 9)

In this embodiment, an RF tag that includes the transistor described in the above embodiment or the memory device described in the above embodiment is described with reference to FIG. 28.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF device is required to have extremely high reliability in order to be used for this purpose.

A configuration of the RF tag is described with reference to FIG. 28. FIG. 28 is a block diagram illustrating a configuration example of an RF tag.

Figure 28:
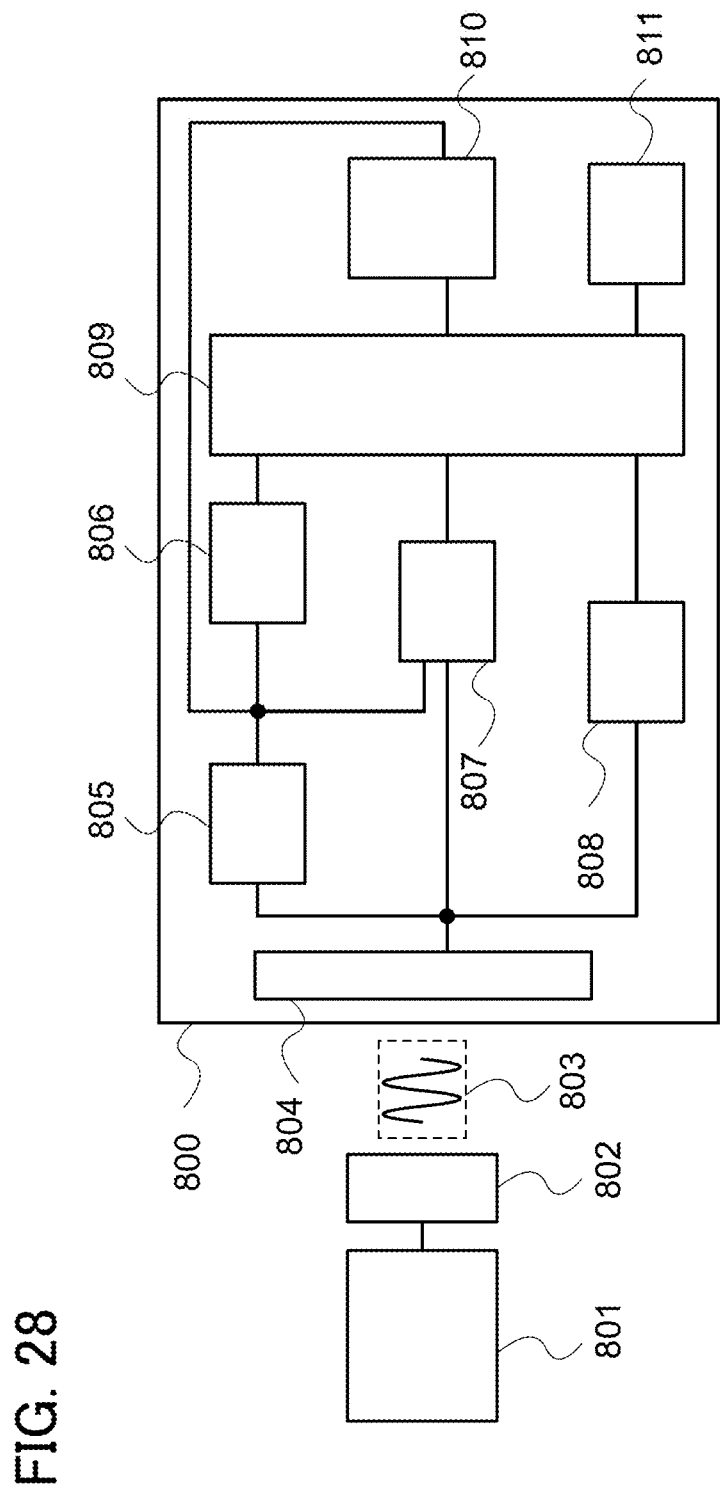
FIG. 28 illustrates a structure example of an RF tag of an embodiment.

As shown in FIG. 28, an RF tag 800 includes an antenna 804 that receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a configuration of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers only to good products to be shipped. Thus, the identification numbers of the shipped products are in series and customer management corresponding to the shipped products is easily performed.

At least part of this embodiment can be implemented in combination with any of the other embodiments described in this specification as appropriate.

(Embodiment 10)

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images. Other examples of electronic appliances that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 57A to 57F illustrate specific examples of these electronic appliances.

Figure 57A:
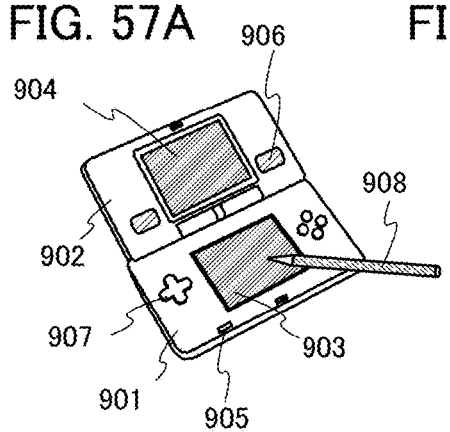
FIGS. 57A to 57F illustrate electronic devices of an embodiment.

FIG. 57A illustrates a portable game machine, which includes a housing 901, a housing 902, a display portion 903, a display portion 904, a microphone 905, a speaker 906, an operation key 907, a stylus 908, and the like. Although the portable game machine in FIG. 57A has the two display portions 903 and 904, the number of display portions included in a portable game machine is not limited to this.

Figure 57B:
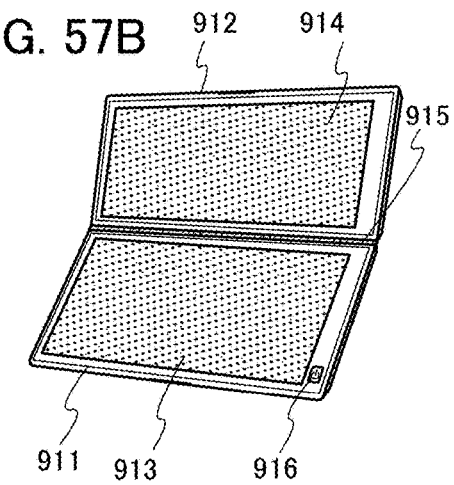

FIG. 57B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 57C:
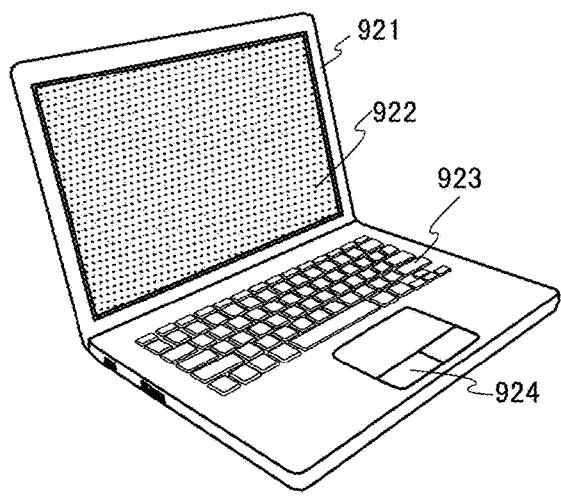

FIG. 57C illustrates a laptop personal computer, which includes a housing 921, a display portion 922, a keyboard 923, a pointing device 924, and the like.

Figure 57D:
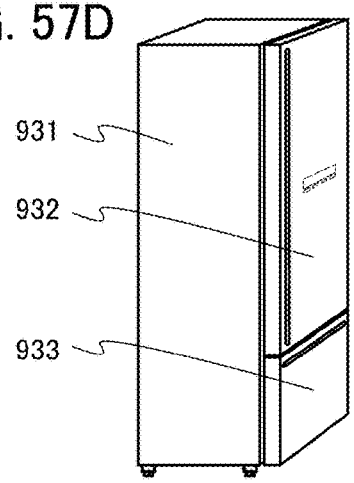

FIG. 57D illustrates an electric refrigerator-freezer, which includes a housing 931, a refrigerator door 932, a freezer door 933, and the like.

Figure 57E:
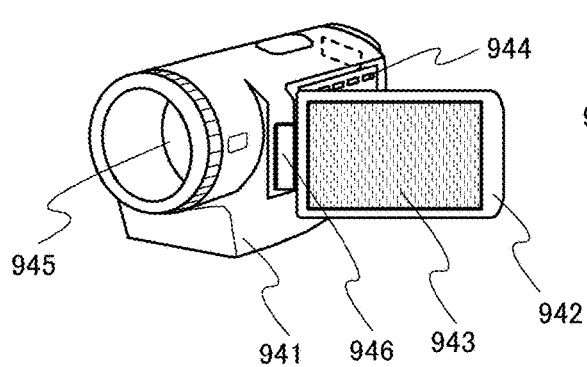

FIG. 57E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 57F:
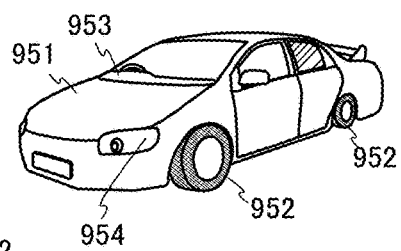

FIG. 57F illustrates a passenger car, which includes a car body 951, wheels 952, a dashboard 953, lights 954, and the like.

At least part of this embodiment can be implemented in combination with any of the other embodiments described in this specification as appropriate.

(Embodiment 11)

In this embodiment, application examples of an RF tag of one embodiment of the present invention are described with reference to FIGS. 56A to 56F. The RF tag is widely used and can be provided for, for example, products such as bills, coins, securities, bearer bonds, documents (e.g., driver's licenses or residence cards, see FIG. 56A), packaging containers (e.g., wrapping paper or bottles, see FIG. 56C), recording media (e.g., DVDs or video tapes, see FIG. 56B), vehicles (e.g., bicycles, see FIG. 56D), personal belongings (e.g., bags or glasses), foods, plants, animals, human bodies, clothing, household goods, medical supplies such as medicine and chemicals, and electronic appliances (e.g., liquid crystal display devices, EL display devices, television sets, or cellular phones), or tags on products (see FIGS. 56E and 56F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic appliances, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF tag can be preferably used for application in which data is not frequently written or read.

At least part of this embodiment can be implemented in combination with any of the other embodiments described in this specification as appropriate.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constructed. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

EXAMPLE 1

In this example, evaluation results of oxide semiconductor films of one embodiment of the present invention are described.

[Formation Method]

Thermal oxidation was performed on a silicon wafer, so that a 100-nm-thick silicon oxide film was formed. Then, as an oxide semiconductor film, a 100-nm-thick In—Ga—Zn oxide film was formed by a sputtering method. The sputtering method was performed under the following conditions. The target was polycrystalline In—Ga—Zn oxide at an atomic ratio of In:Ga:Zn=1:1:1. The power supply was 0.5 kW(DC). The distance between the substrate and the target was 60 mm. Argon and oxygen were used as deposition gases at the flow rates of 30 sccm and 15 sccm, respectively. The pressure was 0.4 Pa. The substrate temperature was 170° C. in Sample E1-1 and 300° C. in Sample F1-1.

Next, heat treatment was performed. As for the heat treatment conditions, heat treatment was performed at 450° C. in a nitrogen atmosphere for an hour and heat treatment was subsequently performed at 450° C. in an oxygen atmosphere for an hour in the same treatment chamber.

[XRD Evaluation]

Figure 43A:
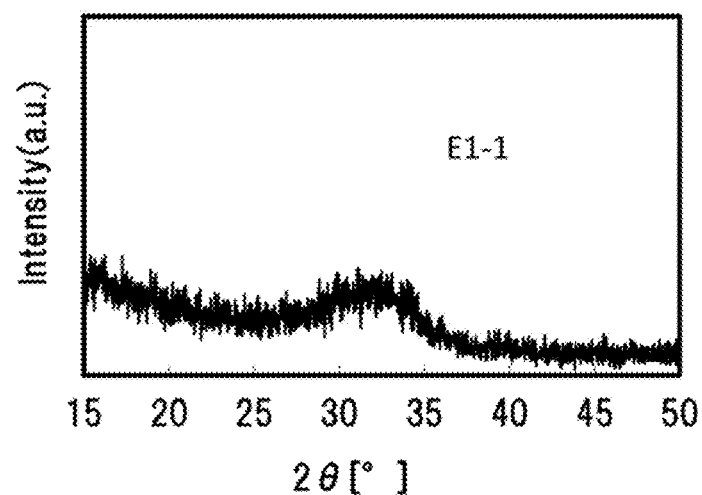
FIGS. 43A and 43B show XRD evaluation results of oxide semiconductor films of one embodiment of the present invention.
Figure 43B:
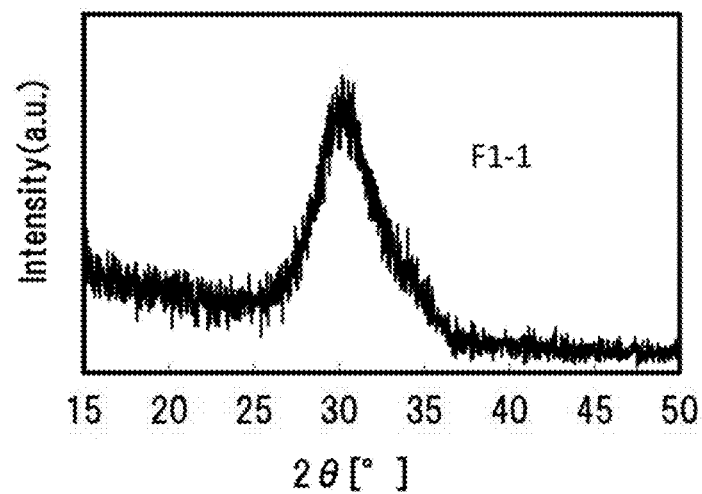
Figure 44:
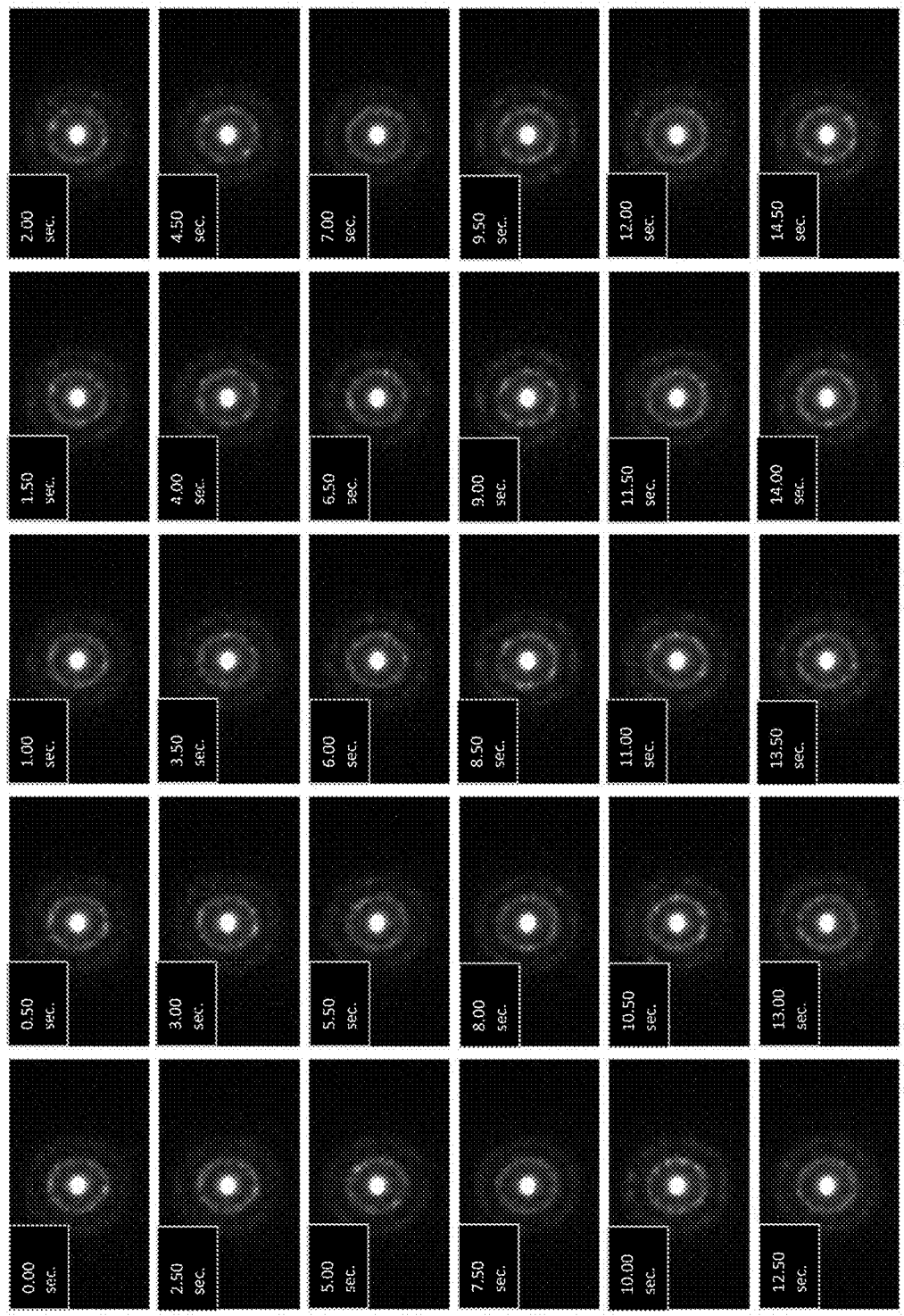
FIG. 44 shows electron diffraction patterns of an oxide semiconductor film.
Figure 45:
FIG. 45 shows electron diffraction patterns of an oxide semiconductor film.
Figure 46:
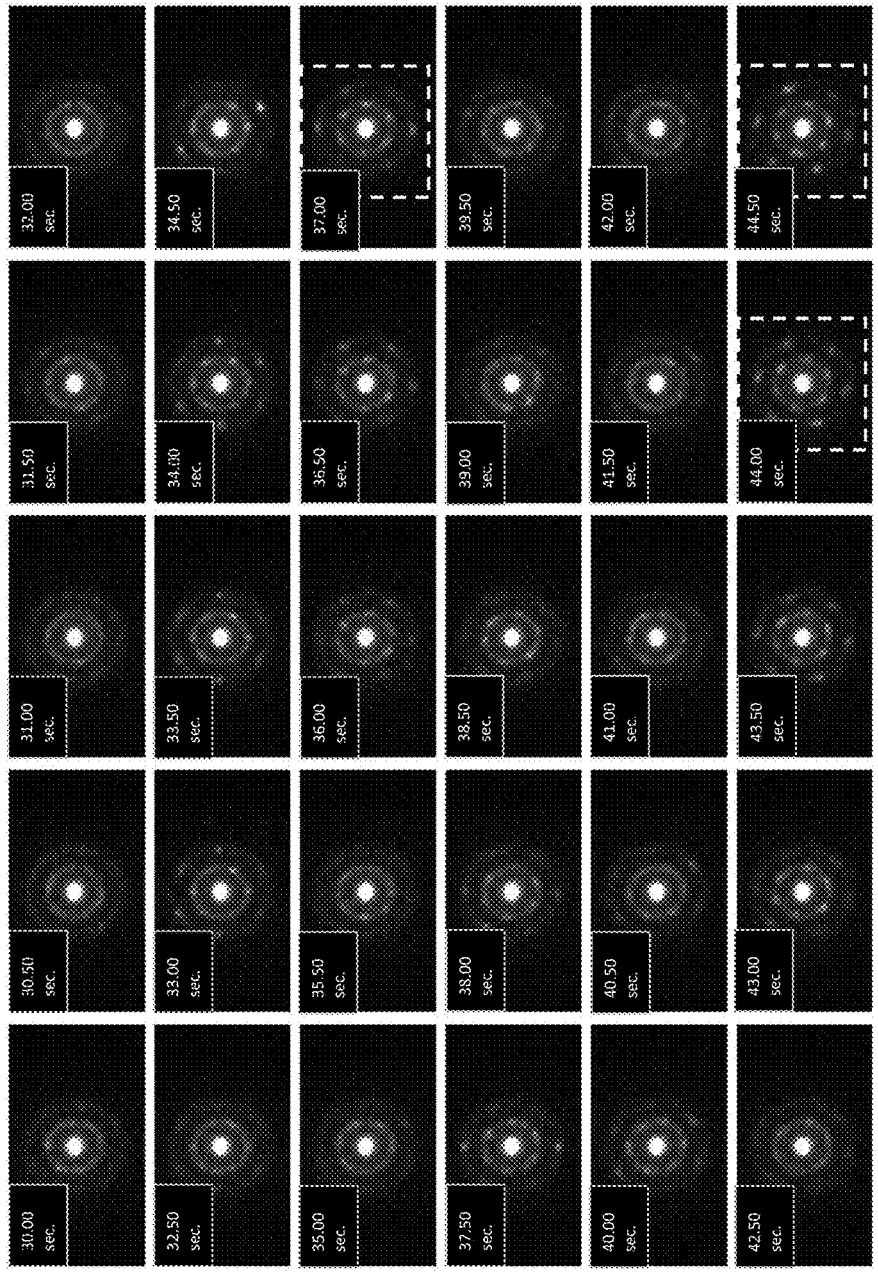
FIG. 46 shows electron diffraction patterns of an oxide semiconductor film.
Figure 47:
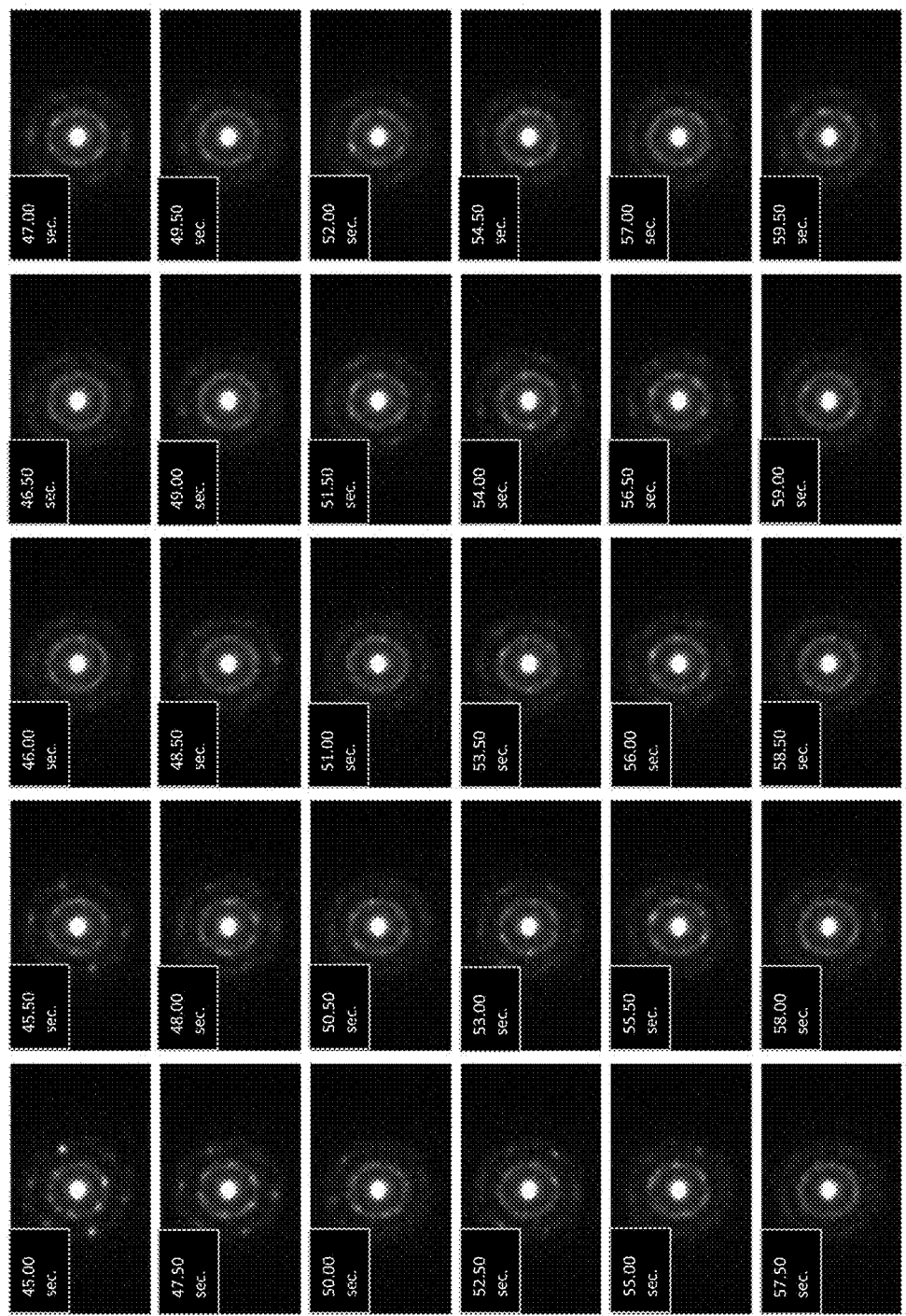
FIG. 47 shows electron diffraction patterns of an oxide semiconductor film.
Figure 48:
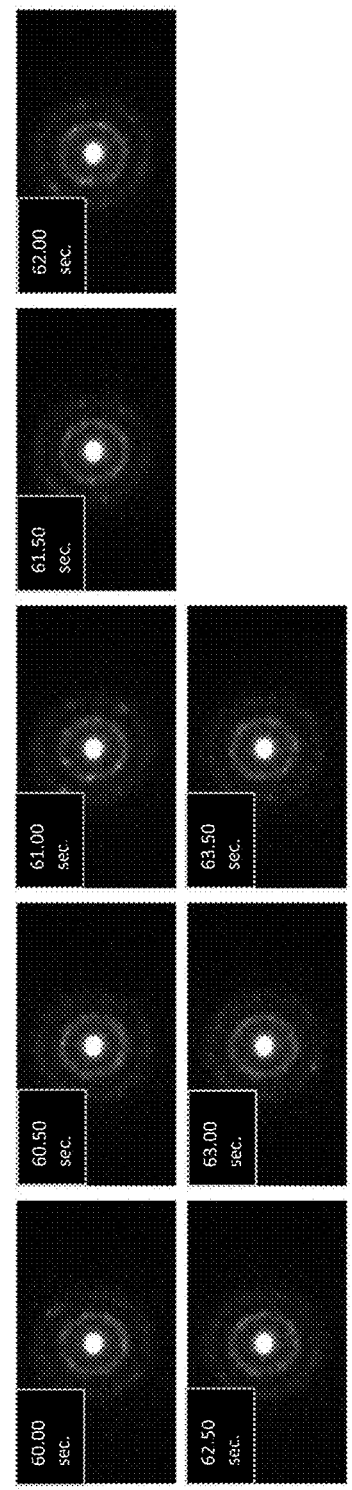
FIG. 48 shows electron diffraction patterns of an oxide semiconductor film.
Figure 49:
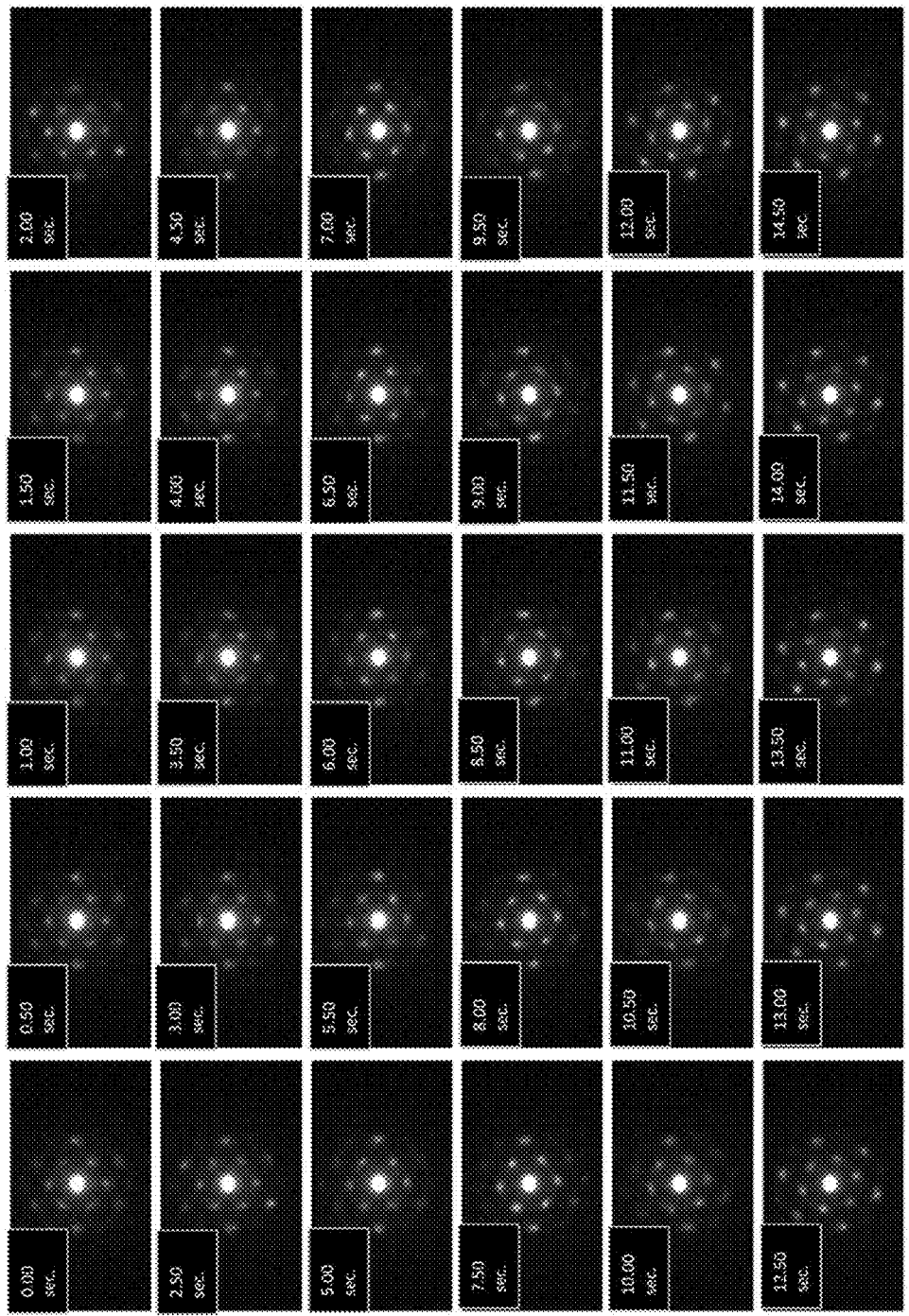
FIG. 49 shows electron diffraction patterns of an oxide semiconductor film.
Figure 50:
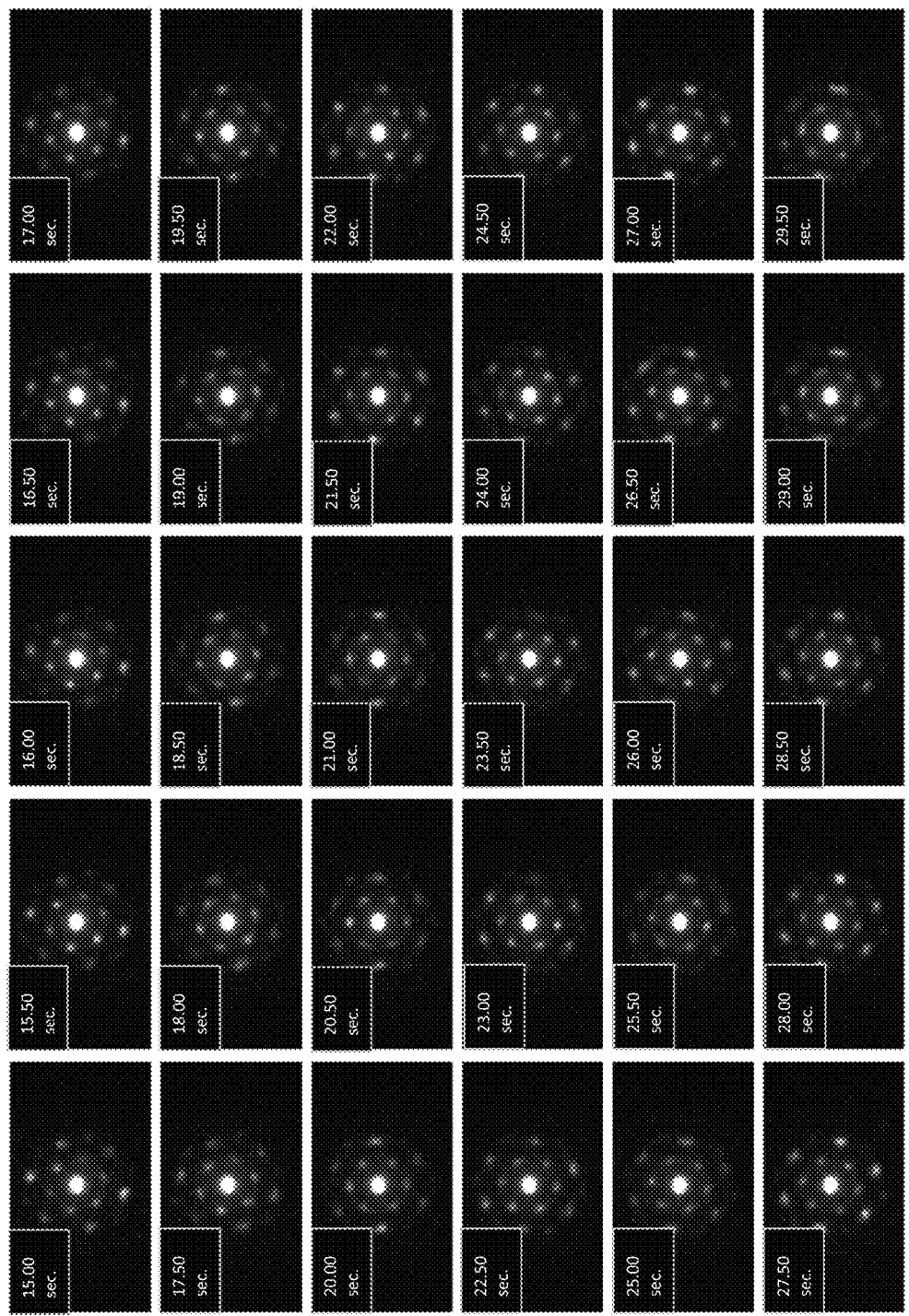
FIG. 50 shows electron diffraction patterns of an oxide semiconductor film.
Figure 51:
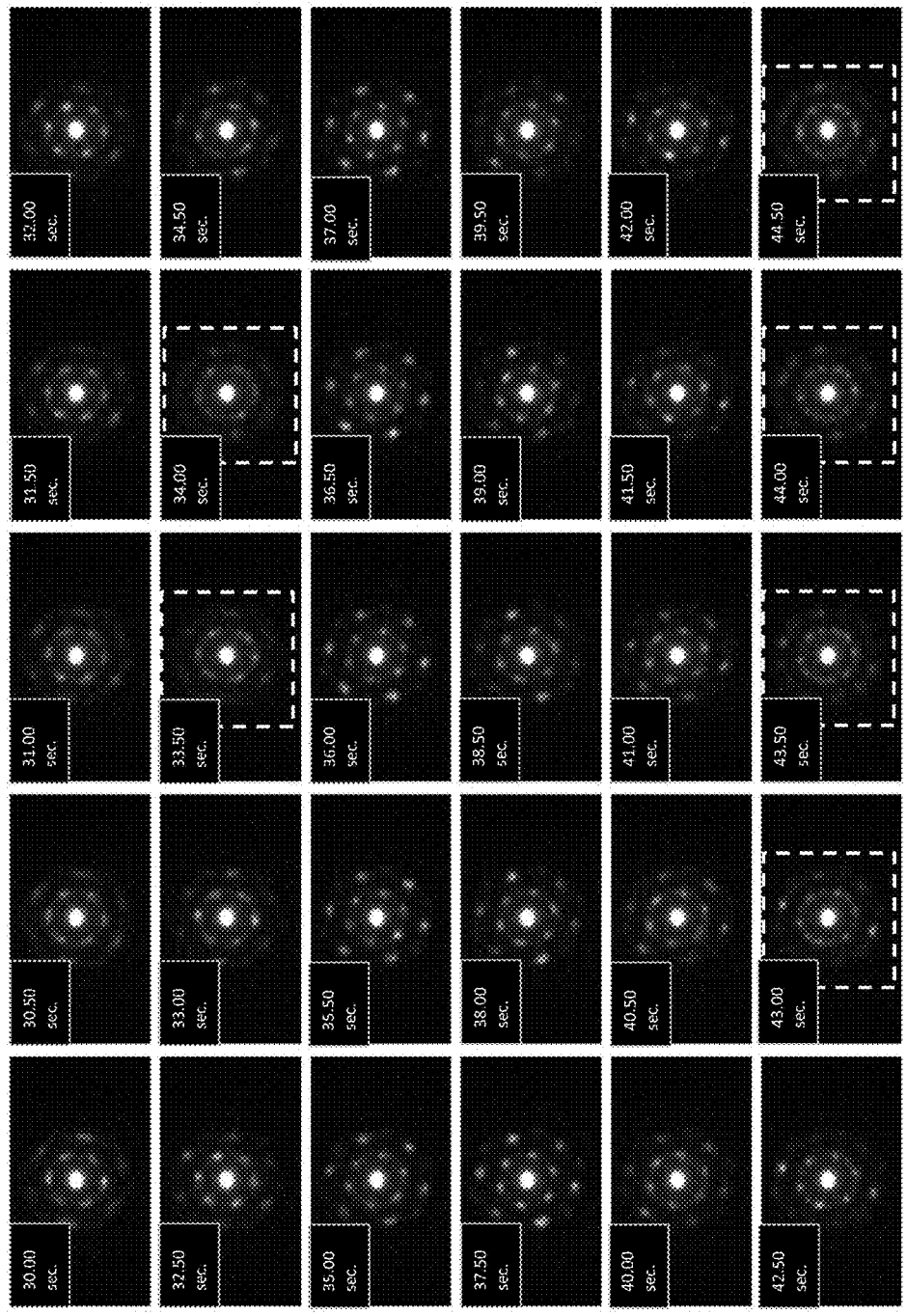
FIG. 51 shows electron diffraction patterns of an oxide semiconductor film.
Figure 52:
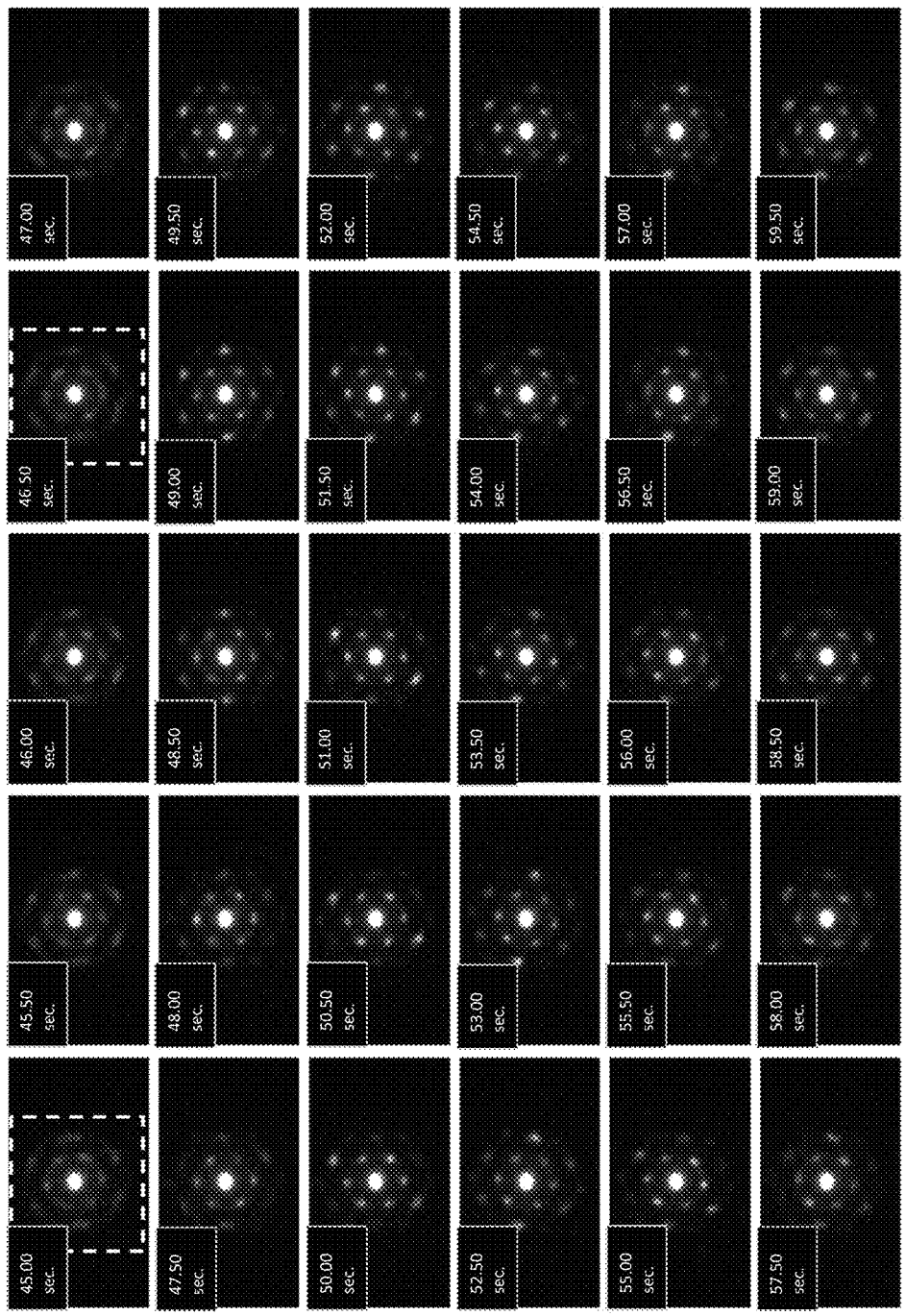
FIG. 52 shows electron diffraction patterns of an oxide semiconductor film.
Figure 53:
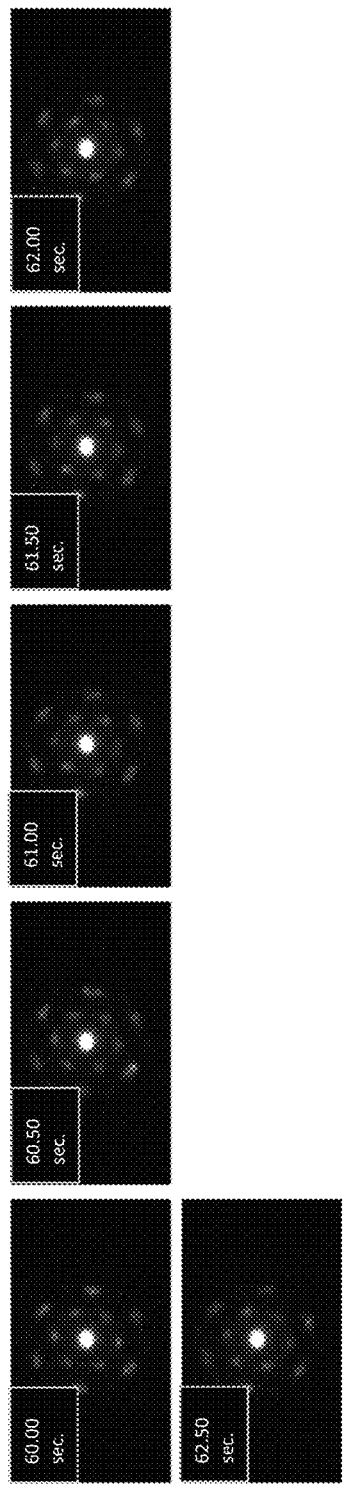
FIG. 53 shows electron diffraction patterns of an oxide semiconductor film.

Next, evaluation results with an XRD apparatus are shown. Each sample was evaluated with a multifunction thin film material evaluation X-ray diffractometer, D8 DISCOVER Hybrid manufactured by Bruker AXS. FIGS. 43A and 43B show results of analysis by an out-of-plane method. FIGS. 43A and 43B show the results of Sample E1-1 and Sample F1-1, respectively. A peak was observed at around 2θ=31° in all the samples. When the deposition was performed at 170° C., the peak tended to be broad, and when the deposition was performed at 300° C., the peak tended to be sharper. This peak was derived from the (009) plane of an InGaZnO$_4$ crystal, which indicated that as the deposition temperature was higher, the number of crystals of the oxide semiconductor film having c-axis alignment was increased.

[Evaluation of Film Density]

Next, film densities were measured. The film densities were measured by X-ray reflectometry (XRR). The film density of Sample E1-1 was 6.18 [g/cm$^3$], and the film density of Sample F1-1 was 6.36 [g/cm$^3$]. A dense and favorable film was obtained in both of the conditions.

[Nanobeam Electron Diffraction]

Next, analysis by nanobeam electron diffraction was performed on Sample E1-1 and Sample F1-1. The electron diffraction was obtained with HF-2000 manufactured by Hitachi High-Technologies Corporation. The accelerating voltage was 200 kV.

Scan was performed on the top surface of each sample including the oxide semiconductor film while a sample stage was gradually moved; thus, transmission electron diffraction patterns were obtained. As an electron beam, a nanobeam with a probe diameter of 1 nm was used. Three areas of each sample were measured in the above manner. That is, scan was performed three times (Scan1 to Scan3) in each sample.

Diffraction patterns were observed with scan at a rate of 5 nm/sec to obtain a moving image. Next, the moving image of the diffraction pattern was converted into still images every 0.5 seconds. The obtained still images were analyzed and classified into three kinds of patterns, i.e., patterns of an nc-OS film, a CAAC-OS film, and a spinel crystal structure. The number of images of scan1 to scan3 of Sample E1-1 and Sample F1-1 classified into these patterns are shown in Table 3. Results of scan1 of the electron diffraction patterns of Sample E1-1 are shown in FIG. 44, FIG. 45, FIG. 46, FIG. 47, and FIG. 48, and results of scan1 of the electron diffraction patterns of Sample F1-1 are shown in FIG. 49, FIG. 50, FIG. 51, FIG. 52, and FIG. 53. In addition, in the results of the electron diffraction patterns in FIG. 44, FIG. 45, FIG. 46, FIG. 47, and FIG. 48, the patterns that are regarded as patterns of a CAAC-OS film are surrounded by a dashed line. Furthermore, in the results of the electron diffraction patterns in FIG. 49, FIG. 50, FIG. 51, FIG. 52, and FIG. 53, the patterns that are regarded as patterns of an nc-OS film are surrounded by a dashed line.

TABLE 3

| | | The number of images | | | | nc proportion [%] | CAAC proportion [%] |
|---|---|---|---|---|---|---|---|
| | | The number of analyses | CAAC | nc | Spinel | | |
| Sample E1-1 | scan1 | 128 | 3 | 125 | 0 | 97.7 | 2.3 |
| | scan2 | 127 | 7 | 120 | 0 | 94.5 | 5.5 |
| | scan3 | 196 | 5 | 191 | 0 | 97.4 | 2.6 |
| Sample F1-1 | scan1 | 126 | 118 | 8 | 0 | 6.3 | 93.7 |
| | scan2 | 132 | 119 | 13 | 0 | 9.8 | 90.2 |
| | scan3 | 190 | 170 | 20 | 0 | 10.5 | 89.5 |

In Sample E1-1, the nc proportion had a high value, which was 90% or higher. It is found that as the deposition temperature is lower, the nc proportion becomes higher. Furthermore, in both Sample E1-1 and Sample F1-1, the sum of the nc proportion and the CAAC proportion was 100%.

EXAMPLE 2

In this example, evaluation results of film density and results of thermal desorption spectroscopy (TDS) analysis of In—Ga—Zn oxide are shown.

An In—Ga—Zn oxide film was deposited over a quartz substrate cleaned in advance by a sputtering method. The target was polycrystalline In—Ga—Zn oxide at an atomic ratio of In:Ga:Zn=1:1:1. The deposition conditions are as follows. The power supply was 100 W. Argon and oxygen were used as deposition gases, and the flow rates were adjusted so that the flow rate of oxygen gas was 2% of the total flow rate of argon gas and oxygen gas. The pressure was 0.4 Pa or 1.0 Pa. The substrate temperature was room temperature. The deposition conditions and the film densities are shown in Table 4. In Sample B and Sample D, an In—Ga—Zn oxide film was deposited by a sputtering method and then heat treatment was performed at 450° C.

The film densities were evaluated by XRR. As shown in Table 4, in Sample C, the density had a high value, which was 6 [g/cm$^3$] or higher.

TABLE 4

|  | RF power [W] | Pressure [Pa] | O$_2$ gas ratio [%] | Deposition temperature [° C.] | Film density [g/cm$^3$] | 450° C. heat treatment |
|---|---|---|---|---|---|---|
| Sample A | 100 | 1.0 | 2 | Room Temp. | 5.78 | x |
| Sample B | 100 | 1.0 | 2 | Room Temp. | 5.79 | ○ |
| Sample C | 100 | 0.4 | 2 | Room Temp. | 6.06 | x |
| Sample D | 100 | 0.4 | 2 | Room Temp. | 6.06 | ○ |

Figure 54A:
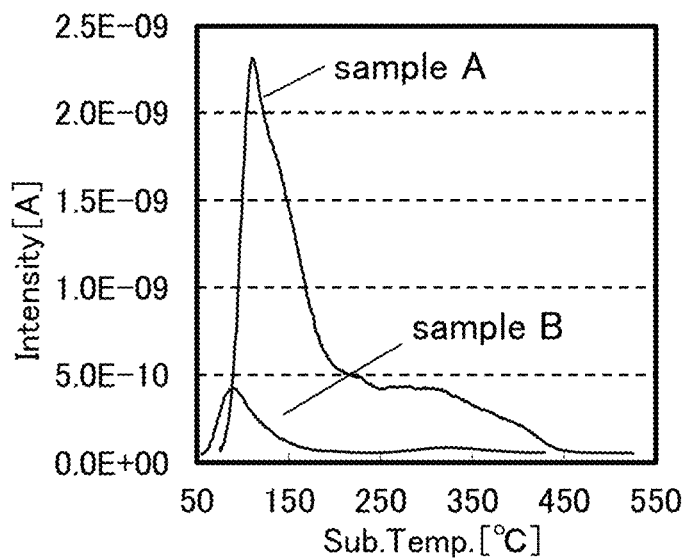
FIGS. 54A and 54B show TDS analysis results of oxide semiconductor films.
Figure 54B:
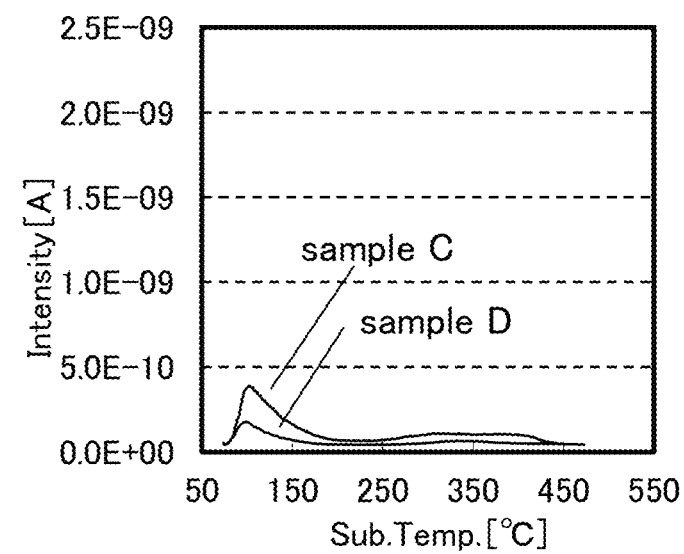

Next, Sample A to Sample D were subjected to TDS analysis. FIGS. 54A and 54B show the amount of released gas having the molecular weight of 18. The released gas having the molecular weight of 18 is probably derived from H$_2$O. In Sample A, the amount of released gas was large, and in Sample B on which heat treatment was performed, the amount of released gas was reduced. In Sample C whose film density was high, the amount of released gas was small without performing heat treatment, and the amount of moisture contained in the film is probably small.

Figure 55A:
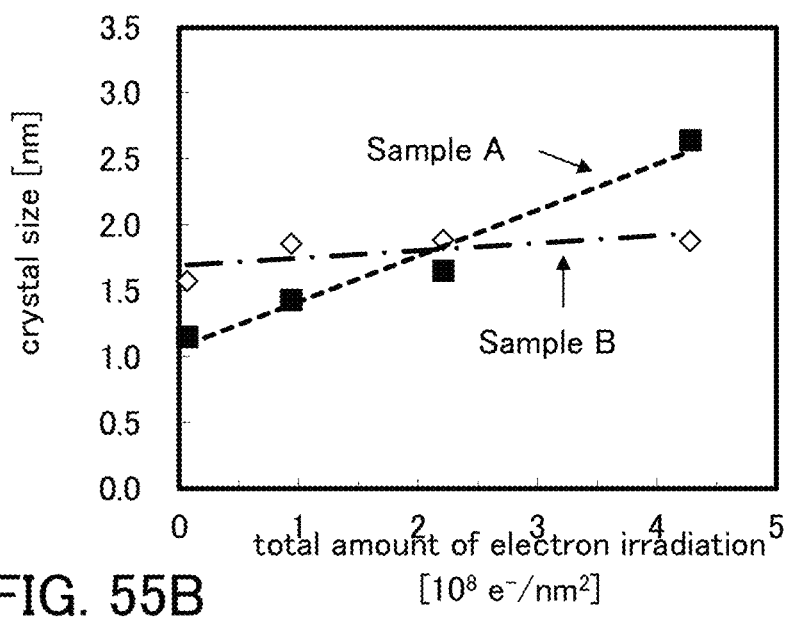
FIGS. 55A and 55B show changes in crystal parts by electron beam irradiation.
Figure 55B:
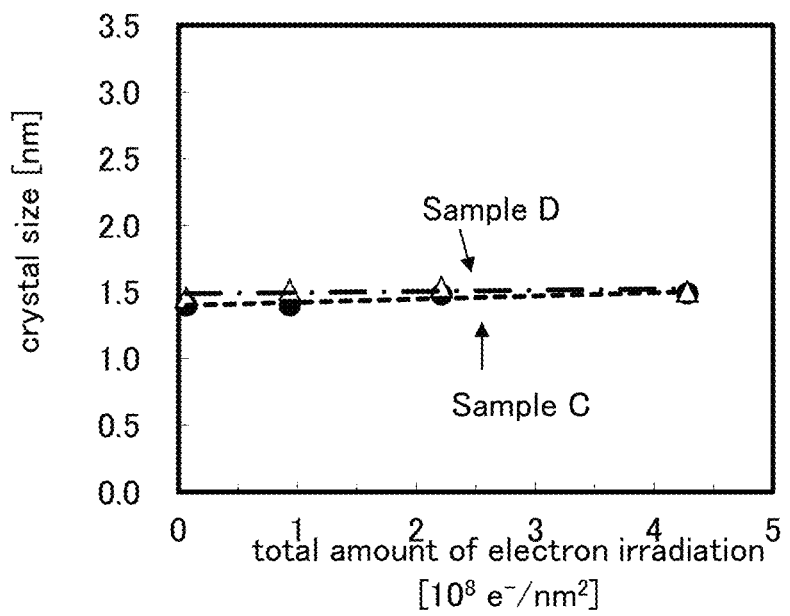
Figure 56A:
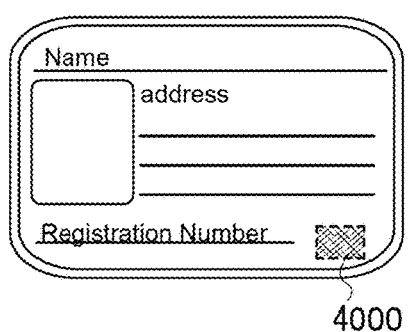
FIGS. 56A to 56F each illustrate an application example of an RF tag of an embodiment.
Figure 56B:
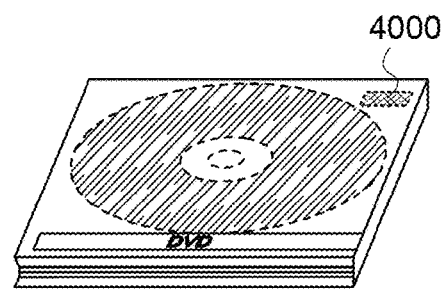
Figure 56C:
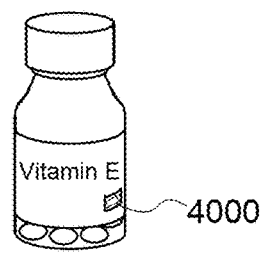
Figure 56D:
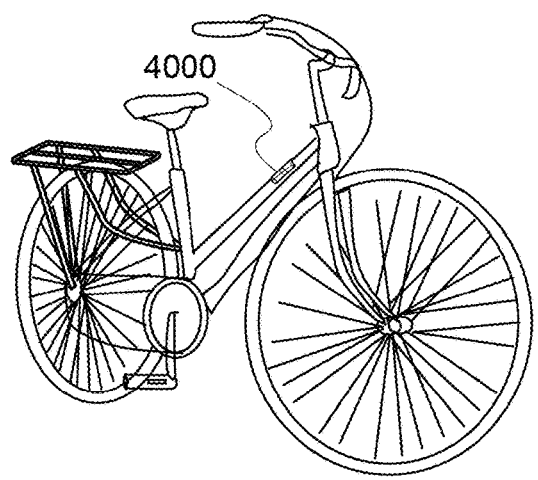
Figure 56E:
Figure 56F:
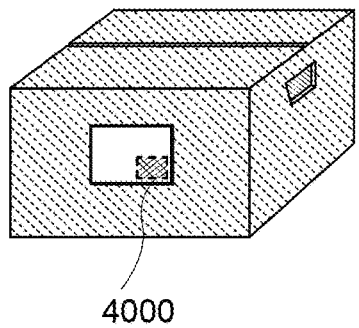

Next, in Sample A to Sample D, changes in size of crystals by electron beam irradiation were evaluated. The crystal sizes were calculated by observing cross sections with TEM. FIGS. 55A and 55B show results of evaluating the relation between the total amount of electron irradiation and the crystal size using electron beam irradiation with TEM. In Sample A, crystal sizes tended to increase every time the electron irradiation was performed. Here, the crystal sizes before the electron irradiation was performed might be sizes when the total amount of electron irradiation was 0 [e$^-$/nm$^2$] on the approximate lines shown in FIGS. 55A and 55B. In Sample B on which heat treatment was performed, a change in crystal size was small. Furthermore, in Sample C and Sample D, whose film densities were high, the crystal sizes were not changed considerably in a range where the total amount of electron irradiation was smaller than or equal to 4.2×10$^8$ [e$^-$/nm$^2$].

EXAMPLE 3

In this example, stability of an oxide semiconductor film was evaluated. Formation methods of Sample 1, Sample 2, and Sample 3 are described below.

A 100-nm-thick In—Ga—Zn oxide film was first deposited over a quartz substrate by an RF sputtering method. The target was polycrystalline In—Ga—Zn oxide at an atomic ratio of In:Ga:Zn=1:1:1. Deposition gases were an oxygen gas at the flow rate of 2 sccm and an argon gas at the flow rate of 98 sccm. The power supply was 100 W. The substrate temperature in deposition was room temperature. The deposition pressure of Sample 1 was 0.4 Pa, and the deposition pressure of Sample 2 was 1.0 Pa.

In Sample 3, a 100-nm-thick In—Ga—Zn oxide film was deposited over a quartz substrate by a DC sputtering method. The target was In—Ga—Zn oxide at an atomic ratio of In:Ga:Zn=1:1:1. Deposition gases were an oxygen gas at the flow rate of 10 sccm and an argon gas at the flow rate of 20 sccm. The power supply was 200 W. The substrate temperature in deposition was 300° C. The deposition pressure was 0.4 Pa.

Figure 58A:
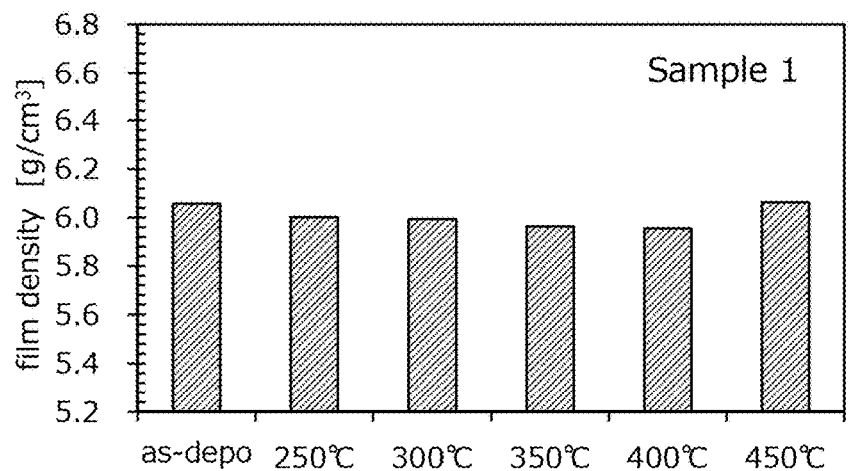
FIGS. 58A to 58C show film densities of oxide semiconductor films.
Figure 58B:
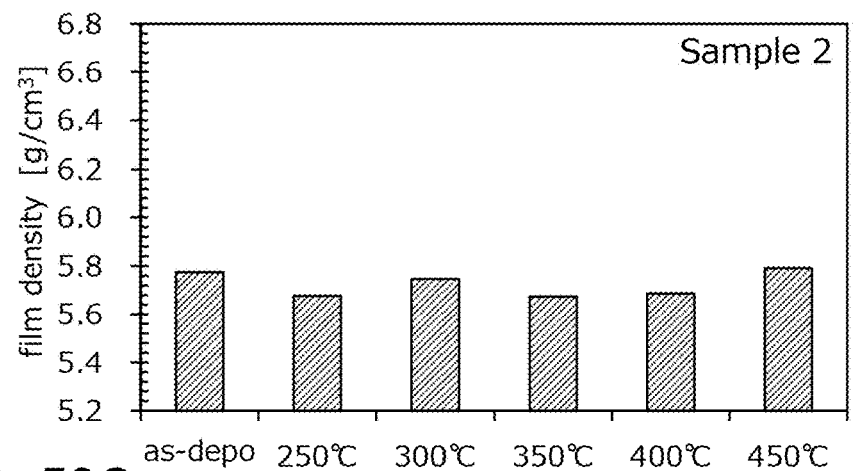
Figure 58C:
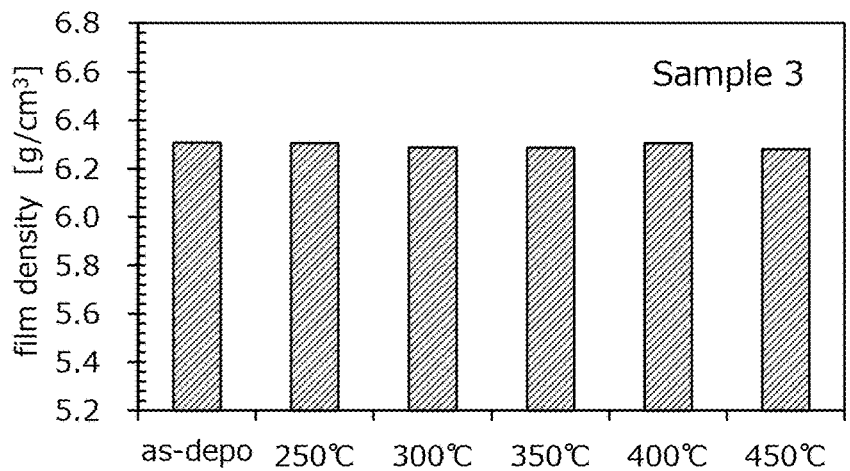

Next, Sample 1, Sample 2, and Sample 3 were subjected to heat treatment under a mixed atmosphere of oxygen and nitrogen for one hour. The heat treatment temperatures were set using five conditions, 250° C., 300° C., 350° C., 400° C., and 450° C. Then, film densities of Sample 1, Sample 2, and Sample 3 including Samples on which the heat treatment was not performed were measured. For the film density measurement, XRR with an X-ray diffractometer, D8 ADVANCE manufactured by Bruker AXS was employed. FIGS. 58A, 58B, and 58C show the measurement results of Sample 1, Sample 2, and Sample 3, respectively. The horizontal axis indicates temperature of the heat treatment. The film density of Sample 1 is in a range from 5.9 g/cm$^3$ to 6.1 g/cm$^3$. The film density of Sample 2 is in a range from 5.6 g/cm$^3$ to 5.8 g/cm$^3$. The film density of Sample 3 is in a range from 6.2 g/cm$^3$ to 6.4 g/cm$^3$.

Figure 59A:
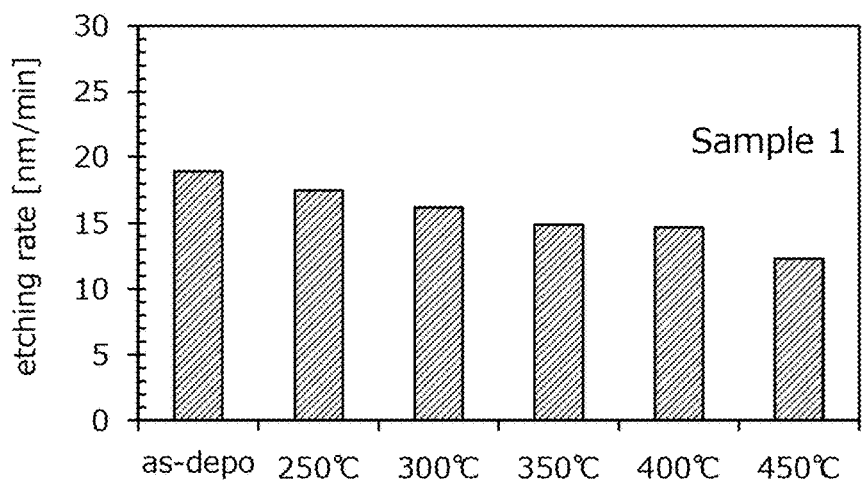
FIGS. 59A to 59C show etching rates of oxide semiconductor films.
Figure 59B:
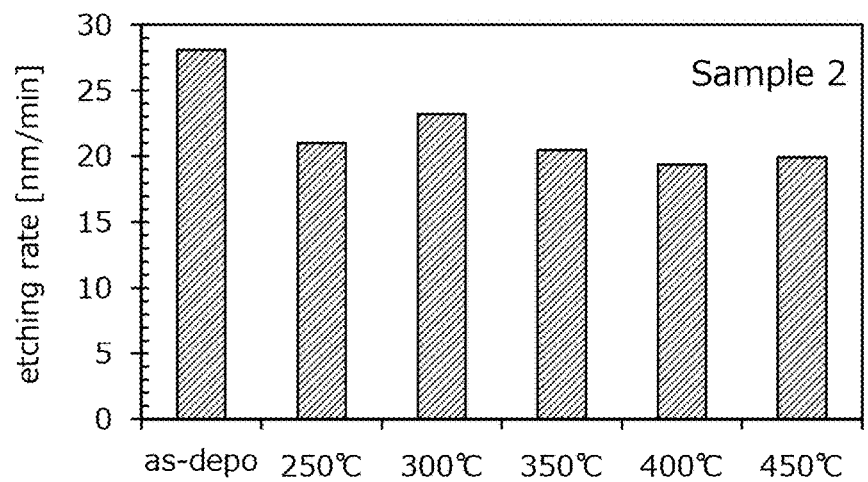
Figure 59C:
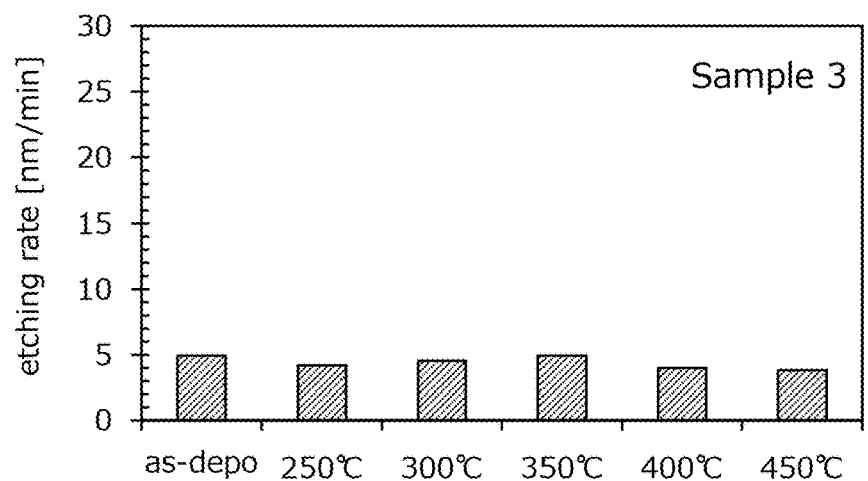

Next, Sample 1, Sample 2, and Sample 3 were etched using a solution in which phosphoric acid was diluted with pure water by 100 times. Then, thicknesses before and after the etching were measured, whereby etching rates were measured. FIGS. 59A, 59B, and 59C show the measurement results of Sample 1, Sample 2, and Sample 3, respectively. In Sample 1 and Sample 2, as the temperature of the heat treatment is higher, the etching rate is lower. In Sample 3, differences of the etching rates between the temperatures of the heat treatment are small. In addition, the etching rate of Sample 1 on which the heat treatment was not performed is lower than that of Sample 2 on which the heat treatment was performed. Moreover, the etching rate of Sample 3 on which the heat treatment was not performed is lower than that of Sample 1 on which the heat treatment was performed.

Figure 60A:
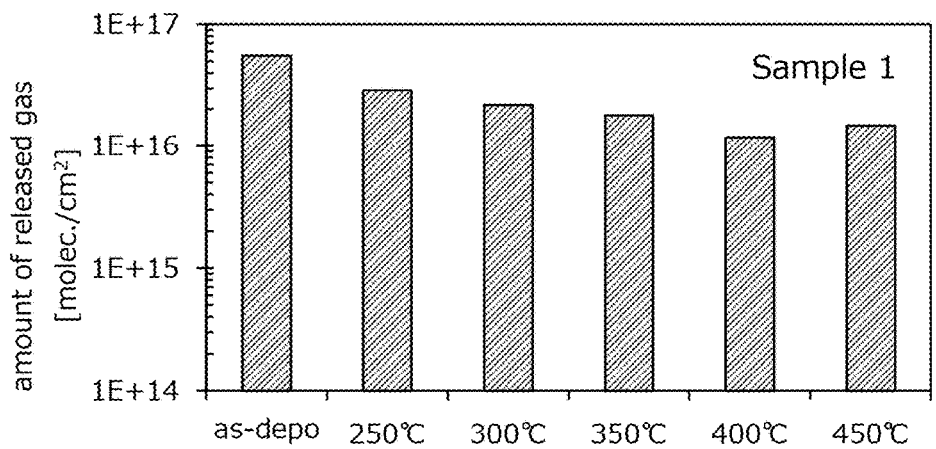
FIGS. 60A to 60C show the amount of released gas of oxide semiconductor films.
Figure 60B:
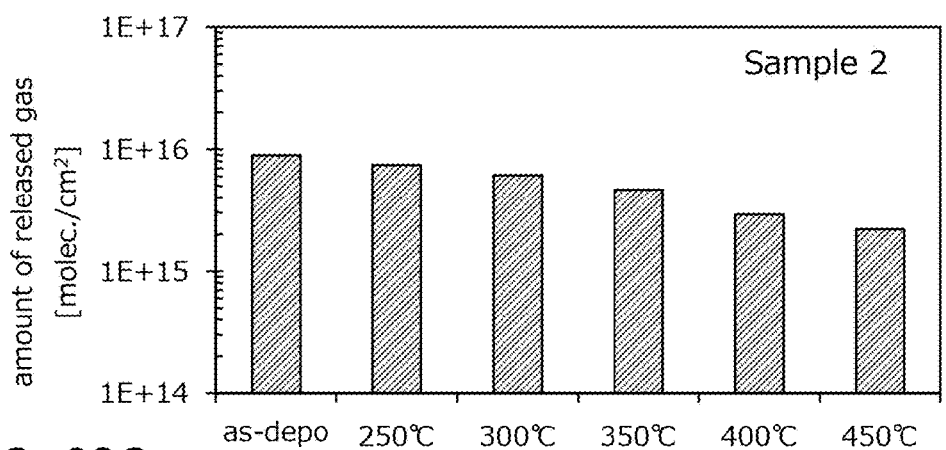
Figure 60C:
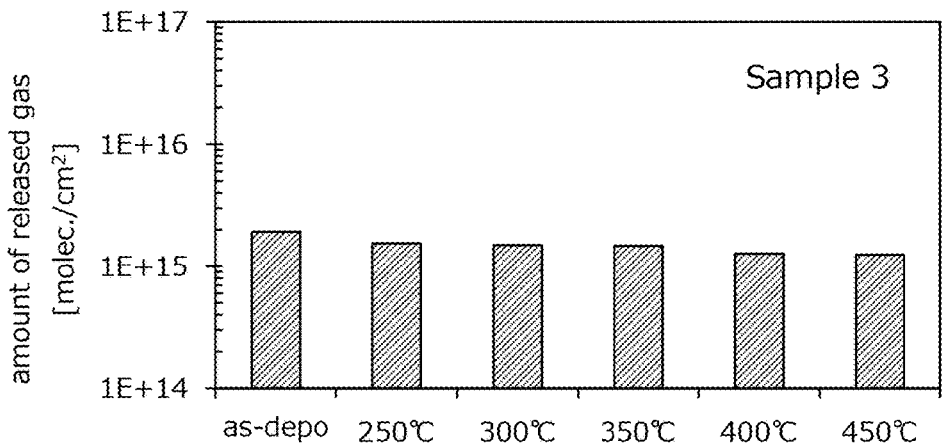

Next, Sample 1, Sample 2, and Sample 3 were subjected to TDS analysis, and the amount of released gas (water) having a mass-to-charge ratio of 18 was measured. For the TDS analysis, TDS-1200, a thermal desorption spectrometer manufactured by ESCO, Ltd., was used. FIGS. 60A, 60B, and 60C show the measurement results of Sample 1, Sample 2, and Sample 3, respectively. In Sample 1, Sample 2, and Sample 3, as the temperature of the heat treatment is higher, the amount of released gas having a mass-to-charge ratio of 18 is reduced. In addition, the amount of released gas having a mass-to-charge ratio of 18 of Sample 1 on which the heat treatment was not performed is smaller than that of Sample 2 on which the heat treatment was performed. Moreover, the amount of released gas having a mass-to-charge ratio of 18 of Sample 3 on which the heat treatment was not performed is smaller than that of Sample 1 on which the heat treatment was performed.

Figure 61A:
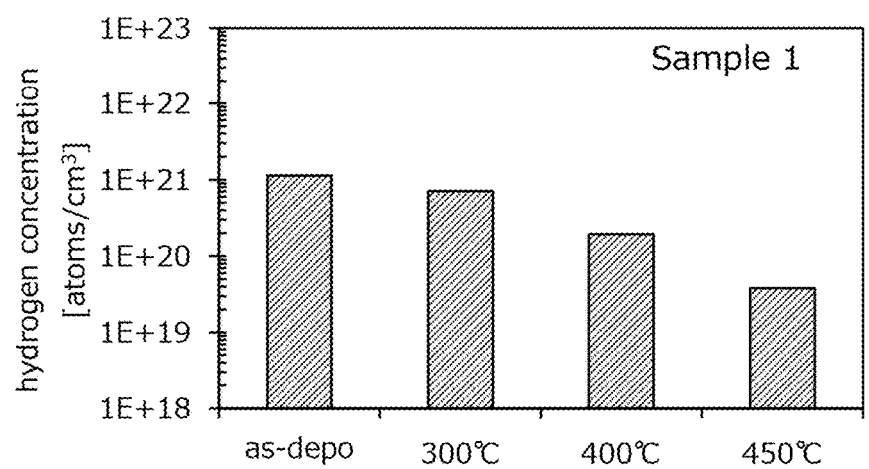
FIGS. 61A and 61B show hydrogen concentrations of oxide semiconductor films.
Figure 61B:
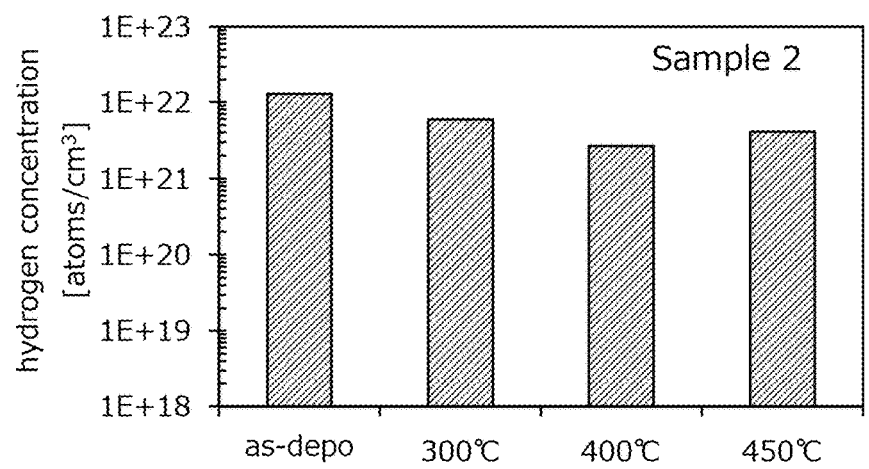
Figure 68A:
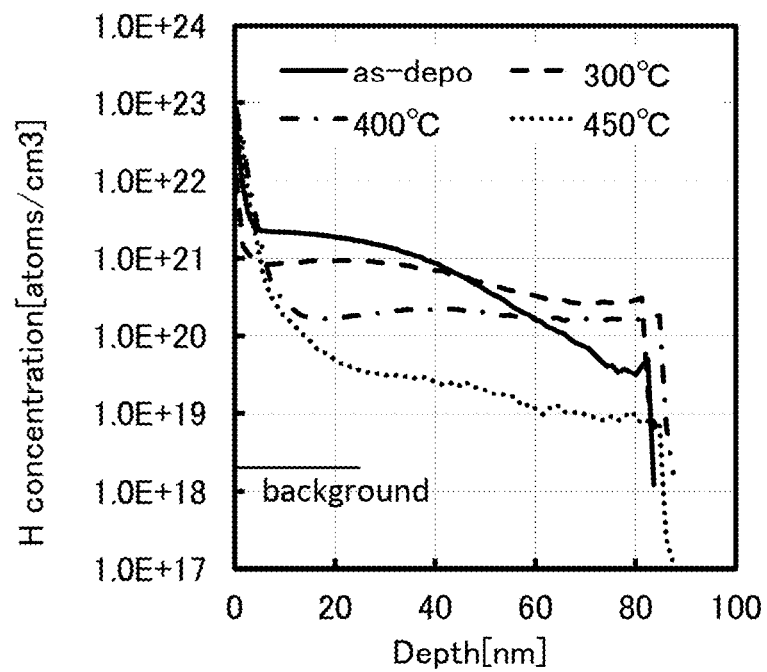
FIGS. 68A and 68B show hydrogen concentrations of oxide semiconductor films.
Figure 68B:
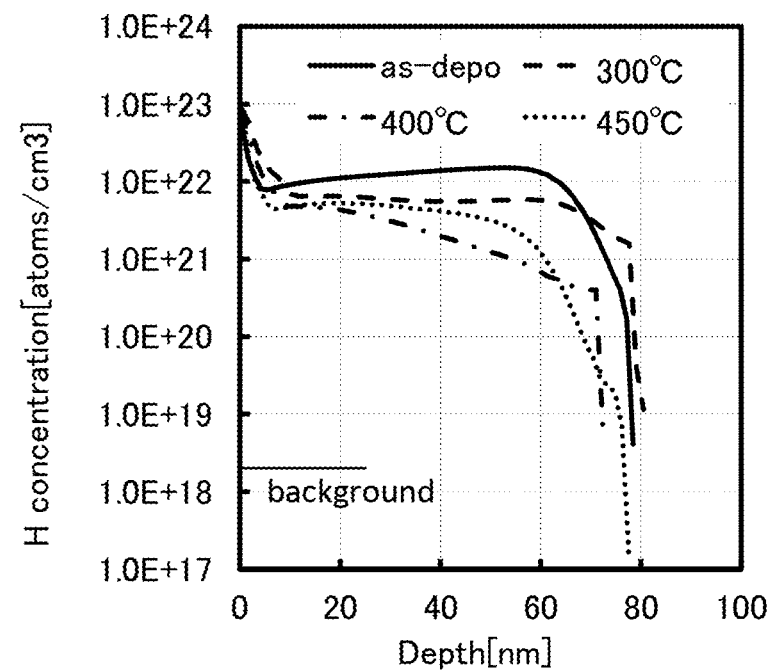

Next, hydrogen concentrations of Sample 1 and Sample 2 were measured. The hydrogen concentrations were measured by SIMS. For SIMS, IMS 7fR manufactured by CAMECA, Societe par Actions Simplifiée (SAS), was used. FIGS. 61A and 68A and FIGS. 61B and 68B show the measurement results of Sample 1 and Sample 2, respectively. Here, in FIGS. 68A and 68B, the horizontal axis indicates the depth from a surface and the vertical axis indicates the hydrogen concentration. FIGS. 61A and 61B show the average value of the hydrogen concentrations from a depth of 10 nm to a depth of 60 nm. In FIGS. 68A and 68B, after a region in which the hydrogen concentration is drastically changed at around a depth of 80 nm, there is a possibility that a quartz substrate on which the In—Ga—Zn oxide film does not remain is measured. Within a region in which the depth is smaller than 10 nm, there is a possibility that the region is influenced by surface conditions. Therefore, it is preferable to show the hydrogen concentration of the In—Ga—Zn oxide film with the average value of the hydrogen concentrations from the depth of 10 nm to the depth of 60 nm. In Sample 1 and Sample 2, as the temperature of the heat treatment is higher, the hydrogen concentration is reduced. In addition, the hydrogen concentration of Sample 1 on which the heat treatment was not performed is lower than that of Sample 2 on which the heat treatment was performed.

Figure 62A:
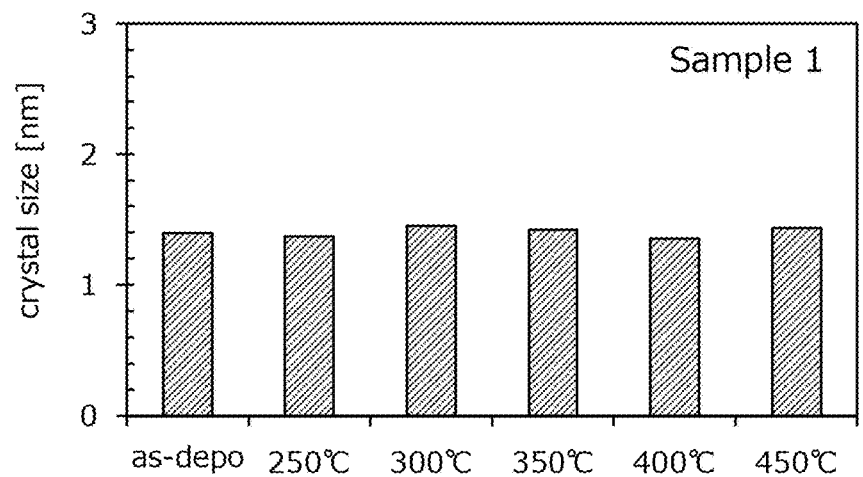
FIGS. 62A to 62C show crystal sizes of oxide semiconductor films.
Figure 62B:
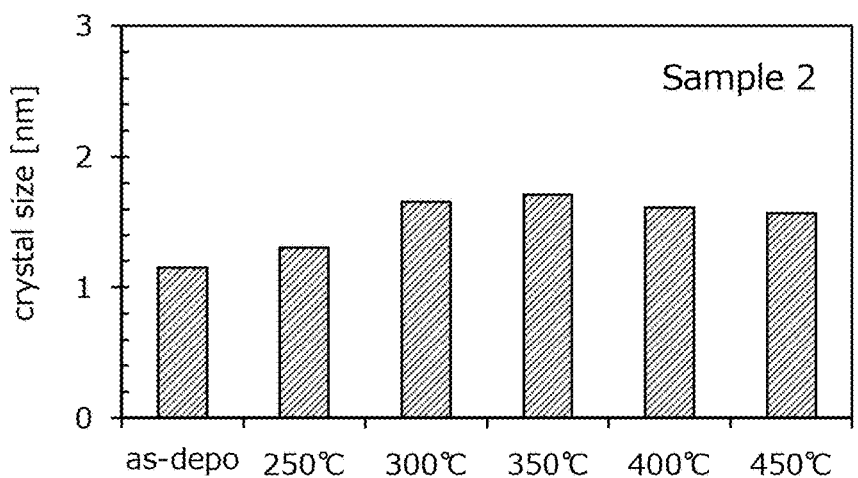
Figure 62C:
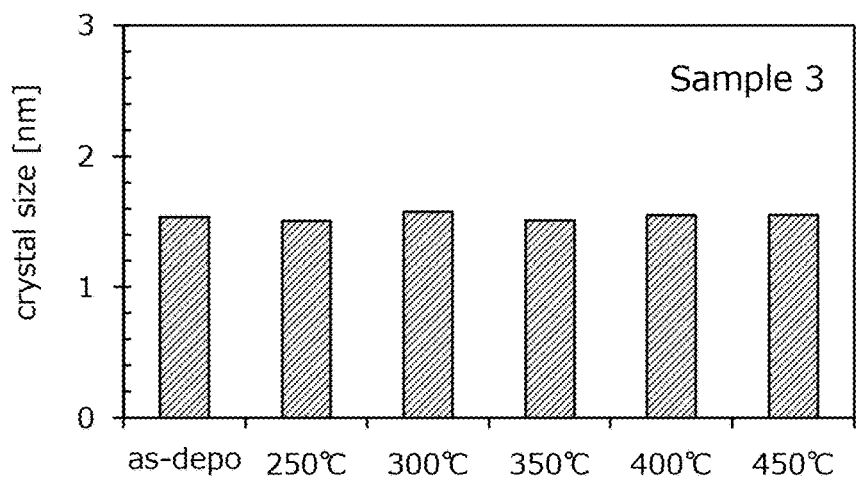
Figure 67:
FIG. 67 shows a Cs-corrected high-resolution cross-sectional TEM image of an a like-OS.

Next, changes in crystal sizes of Sample 1, Sample 2, and Sample 3 due to the heat treatment were measured by TEM. Note that the crystal size is the average value among 20 to 45 crystal sizes. For TEM, a Hitachi H-9000NAR transmission electron microscope was used. FIGS. 62A, 62B, and 62C show the measurement results of Sample 1, Sample 2, and Sample 3, respectively. In Sample 1, the crystal size is about 1.4 nm regardless of the temperature of the heat treatment. In Sample 2, the crystal size is about 1.2 nm before the heat treatment (see FIG. 67); however, by the heat treatment at 250° C., the crystal size is increased to about 1.3 nm, and by the heat treatment at 300° C., the crystal size is increased to about 1.6 nm. Furthermore, in the range from 300° C. to 450° C., the crystal size does not change significantly. In Sample 3, the crystal size is 1.5 nm to 1.6 nm regardless of the temperature of the heat treatment.

Figure 63A:
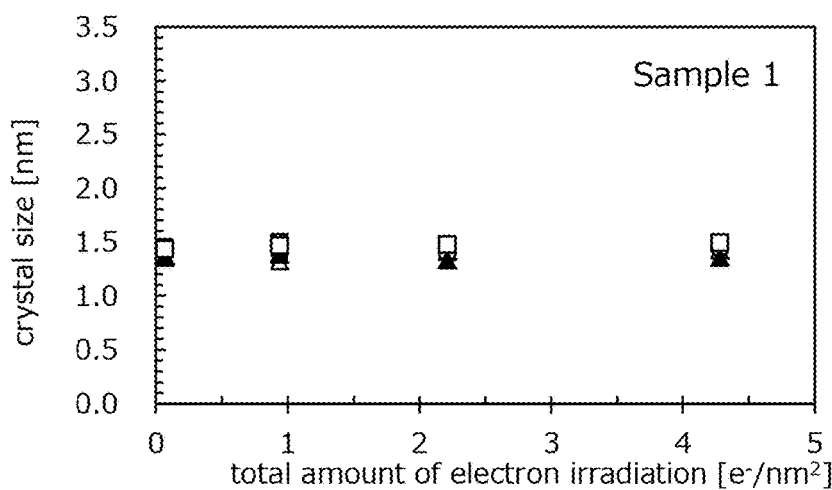
FIGS. 63A to 63C show crystal sizes of oxide semiconductor films.
Figure 63B:
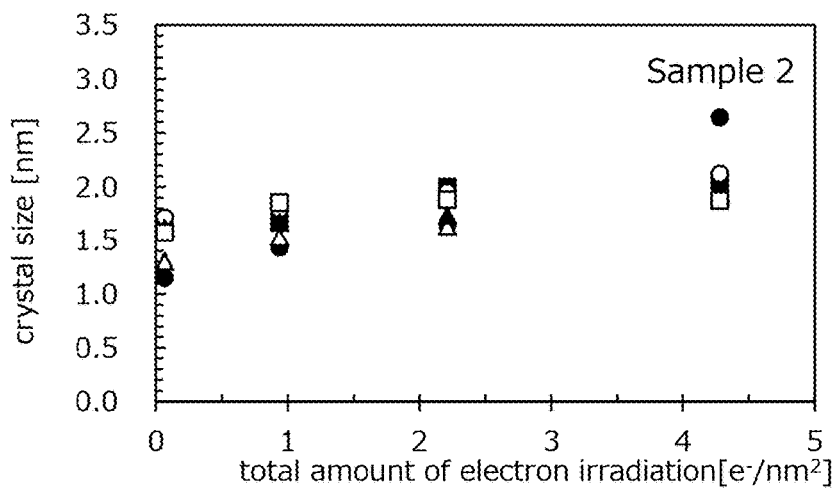
Figure 63C:
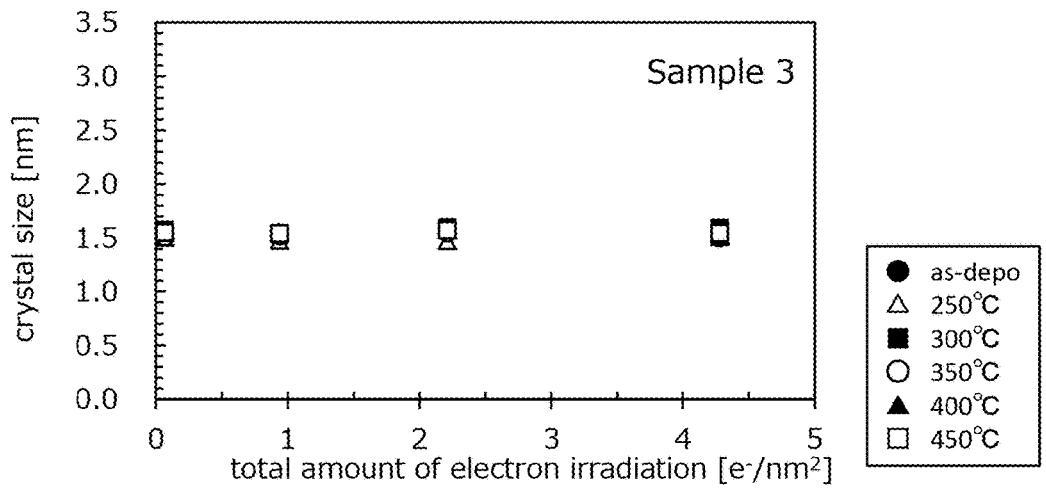

Next, changes in crystal sizes of Sample 1, Sample 2, and Sample 3 due to electron beam irradiation were measured by TEM. FIGS. 63A, 63B, and 63C show the measurement results of Sample 1, Sample 2, and Sample 3, respectively. In Sample 1 and Sample 3, the crystal sizes do not change significantly regardless of the temperature of the heat treatment and electron beam irradiation. In Sample 2, the crystal size is increased due to electron beam irradiation. This tendency is remarkable as the temperature of the heat treatment is lower.

From the changes in crystal sizes due to the heat treatment and the electron beam irradiation, it is found that Sample 1 and Sample 3 have higher stability than Sample 2. According to the above structures, Sample 1, Sample 2, and Sample 3 are classified as an nc-OS film, an a-like OS film, and a CAAC-OS film, respectively.

As described above, an nc-OS film has a higher film density, a lower etching rate, a smaller amount of released gas from water, and a lower hydrogen concentration than an a-like OS film. Furthermore, the differences cannot be compensated by heat treatment after the deposition. That is, for the transistor, it is important to use an nc-OS film as an oxide semiconductor film at the time of the deposition.

EXAMPLE 4

In this example, localized level of an nc-OS film was estimated. Localized level was estimated by CPM measurement.

For the CPM measurement, a sample in which a gate electrode (tungsten) over a glass substrate, an nc-OS film over the gate electrode, a gate insulator (silicon oxynitride) between the gate electrode and the nc-OS film, a pair of electrodes (a stack in which tungsten, aluminum, and titanium were stacked in this order) in contact with the nc-OS film, and an insulator (a stack in which silicon oxynitride and silicon nitride were stacked in this order) over the nc-OS film and the pair of electrodes were included was prepared. Note that the nc-OS film was deposited to a thickness of 35 nm by an AC sputtering method. The target was In—Ga—Zn oxide at an atomic ratio of In:Ga:Zn=1:1:1.2. Deposition gases were an oxygen gas at 10 vol. % and an argon gas at 90 vol. %. The power supply was 2.5 kW. The substrate temperature in deposition was room temperature. The deposition pressure was 0.6 Pa.

Next, the formed sample was subjected to heat treatment. Heat treatment was performed for one hour in a nitrogen atmosphere and heat treatment was subsequently performed for one hour in a mixed atmosphere of oxygen and nitrogen.

In the CPM measurement, the amount of light with which a surface of the sample between terminals is irradiated is adjusted so that a photocurrent value is kept constant in the state where voltage is applied between a pair of electrodes provided in contact with the nc-OS film, and then an absorption coefficient is derived from the amount of the irradiation light at each wavelength. In the CPM measurement, the absorption coefficient of energy which corresponds to the density of localized level (calculated from a wavelength) is increased. The increase in the absorption coefficient is multiplied by a constant, whereby the density of localized level of the sample can be obtained.

Moreover, the light absorption (urbach tail) due to the band tail is removed from the curve of the light absorption spectrum, whereby an absorption coefficient α due to the localized level can be calculated from the following formula.

$$\alpha = \int [(\alpha(E) - \alpha_u)/E] dE$$

Here, E represents energy, α(E) represents the absorption coefficient at each energy level, and $\alpha_u$ represents the absorption coefficient due to the urbach tail.

Note that the slope of the urbach tail is called urbach energy. As the urbach energy gets smaller, such a semiconductor film is a well-ordered semiconductor film which has fewer defects and whose tail slope of a level at a band edge in the valence band becomes steeper.

Figure 64A:
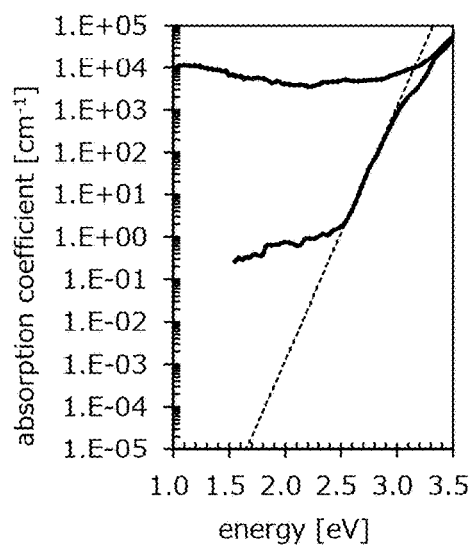
FIGS. 64A to 64C show CPM measurement results of an oxide semiconductor film.
Figure 64B:
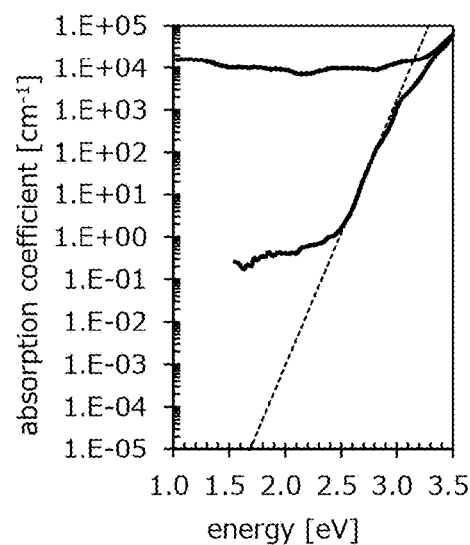
Figure 64C:
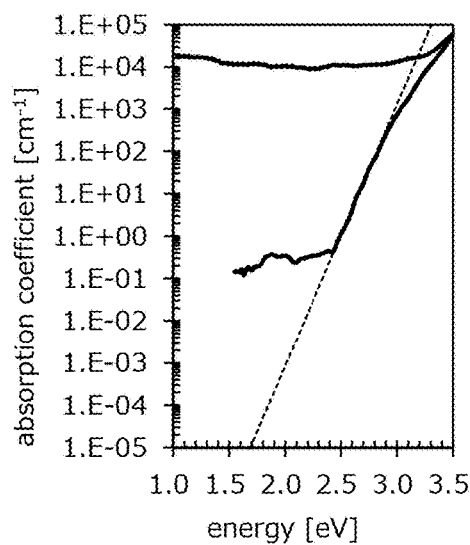

FIGS. 64A to 64C each show results of fitting the absorption coefficient (dotted line) measured using a spectrophotometer and the absorption coefficient (solid line) measured by CPM in the range of energy higher than or equal to the energy gap of the oxide semiconductor film. FIGS. 64A to 64C show the results of the sample on which heat treatment was performed at 300° C. after the deposition, the sample on which heat treatment was performed at 400° C. after the deposition, and the sample on which heat treatment was performed at 450° C. after the deposition, respectively. An urbach energy obtained by the absorption coefficient measured by CPM is 72.65 meV, 69.45 meV, and 70.32 meV, respectively.

Figure 65:
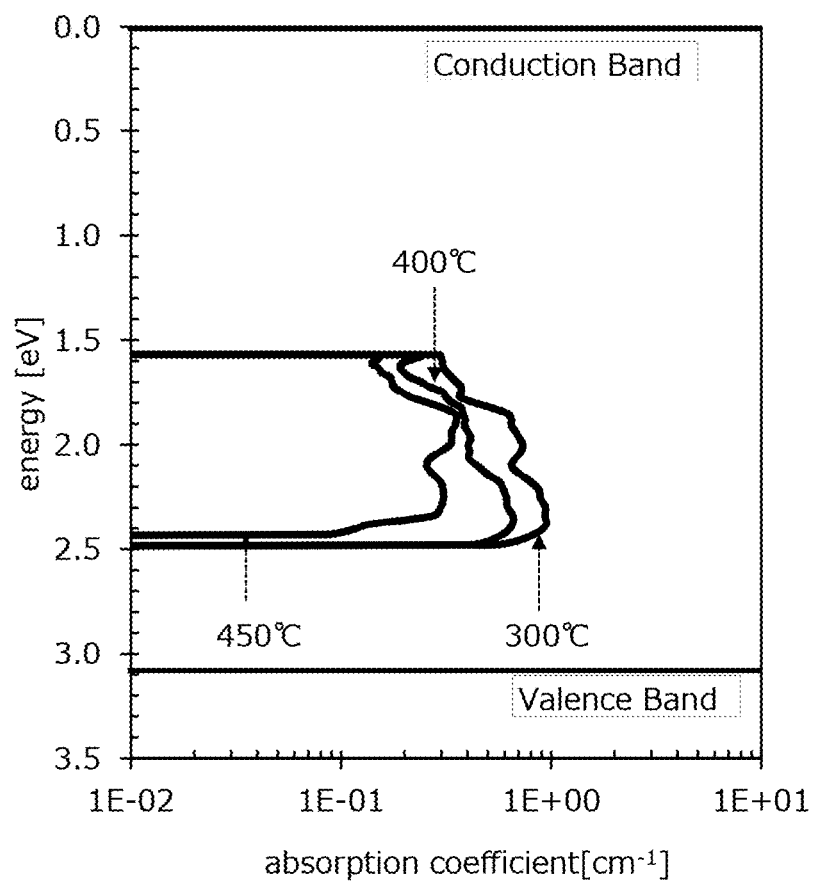
FIG. 65 shows CPM measurement results of an oxide semiconductor film.
Figure 66:
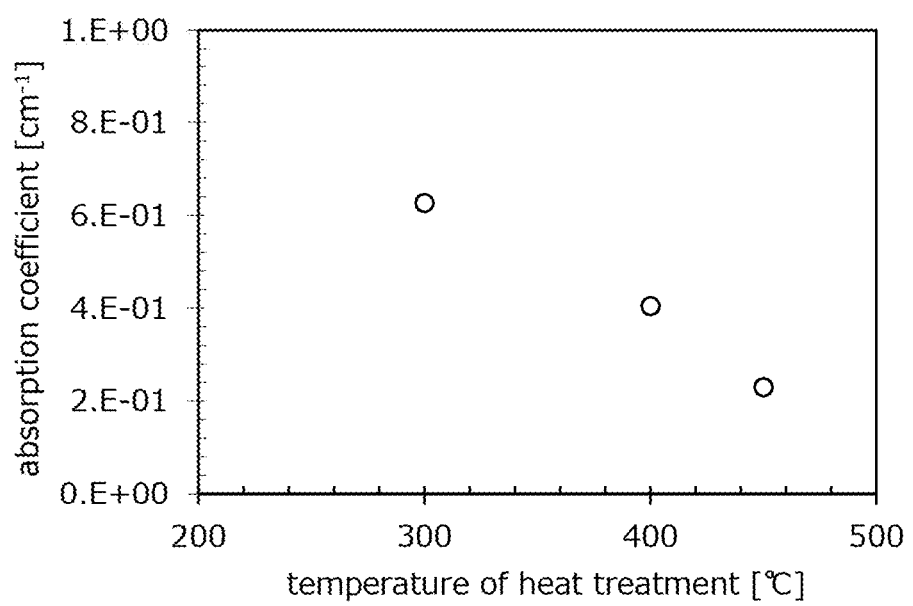
FIG. 66 shows CPM measurement results of an oxide semiconductor film.

A background (thin dotted line) was subtracted from the absorption coefficient calculated by CPM measurement in FIGS. 64A to 64C, and the integral value of the absorption coefficient was calculated. FIG. 65 shows the results. In the above sample, the absorption coefficients due to localized level were $6.27 \times 10^{-1}$ cm$^{-1}$, $4.19 \times 10^{-1}$ cm$^{-1}$, and $2.29 \times 10^{-1}$ cm$^{-1}$, respectively. FIG. 66 shows the relationship between the temperature of the heat treatment and the absorption coefficient. From FIG. 66, it is found that as the temperature of the heat treatment is higher, the absorption coefficient becomes lower; thus, the density of the localized level is reduced.

This application is based on Japanese Patent Application serial no. 2014-093494 filed with Japan Patent Office on Apr. 30, 2014, Japanese Patent Application serial no. 2014-183288 filed with Japan Patent Office on Sep. 9, 2014, Japanese Patent Application serial no. 2014-206218 filed with Japan Patent Office on Oct. 7, 2014, and Japanese Patent Application serial no. 2015-033086 filed with Japan Patent Office on Feb. 23, 2015, the entire contents of which are hereby incorporated by reference.

What is claimed is:

1. An oxide semiconductor film comprising:
   indium, an element M, and zinc,
   wherein the element M is at least one of aluminum, gallium, yttrium, and tin, wherein an atomic ratio of the indium to the element M and the zinc satisfies In:M:Zn=x:y:z, wherein, in an equilibrium diagram with vertices of the indium, the element M, and the zinc, the atomic ratio is within a range of an area surrounded by line segments that connect first coordinates (x:y:z=8:14:7), second coordinates (x:y:z=2:4:3), third coordinates (x:y:z=2:5:7), fourth coordinates (x:y:z=51:149:300), fifth coordinates (x:y:z=46:288:833), sixth coordinates (x:y:z=0:2:11), seventh coordinates (x:y:z=0:0:1), eighth coordinates (x:y:z=1:0:0), and the first coordinates in this order, wherein the range includes the first coordinates to the sixth coordinates and does not include the seventh coordinates and the eighth coordinates, wherein a plurality of electron diffraction patterns are observed in such a manner that a surface over which the oxide semiconductor film is formed is irradiated with an electron beam having a probe diameter whose half-width is 1 nm while a position of the oxide semiconductor film and a position of the electron beam are relatively moved, wherein the plurality of electron diffraction patterns include 50 or more electron diffraction patterns observed in different areas, wherein a sum of a percentage of first electron diffraction patterns and a percentage of second electron diffraction patterns accounts for 100% of the 50 or more electron diffraction patterns, wherein the first electron diffraction patterns account for 50% or more of the 50 or more electron diffraction patterns, wherein the first electron diffraction pattern includes observation points that are not symmetry or a plurality of observation points disposed in a circular pattern, and wherein the second electron diffraction pattern includes observation points corresponding to vertices of a hexagon.

2. The oxide semiconductor film according to claim 1, wherein a density of the oxide semiconductor film is 90% or higher of a density of a single crystal oxide semiconductor film having the same atomic ratio as the oxide semiconductor film.

3. The oxide semiconductor film according to claim 1,
wherein the oxide semiconductor film is formed by a sputtering method,
wherein a target used in the sputtering method includes indium, an element M, and zinc,
wherein the element M is at least one of aluminum, gallium, yttrium, and tin,
wherein an atomic ratio of the indium to the element M and the zinc included in the target satisfies In:M:Zn=a:b:c,
wherein, in an equilibrium diagram with vertices of the indium, the element M, and the zinc of the target, the atomic ratio is within a range of an area surrounded by line segments that connect first coordinates (a:b:c=8:14:7), second coordinates (a:b:c=2:4:3), third coordinates (a:b:c=1:2:5.1), fourth coordinates (a:b:c=1:0:1.7), fifth coordinates (a:b:c=8:0:1), sixth coordinates (a:b:c=6:2:1), and the first coordinates in this order, and
wherein the range includes the first coordinates to the sixth coordinates.

4. A semiconductor device comprising the oxide semiconductor film according to claim 1, comprising:
an oxide film in contact with a top surface of the oxide semiconductor film,
wherein electron affinity of an oxide included in the oxide semiconductor film is larger than electron affinity of an oxide included in the oxide film.

5. The semiconductor device according to claim 4, comprising:
the oxide film in contact with the oxide semiconductor film,
wherein the oxide film includes indium, an element M, and zinc,
wherein the element M is at least one of aluminum, gallium, yttrium, and tin,
wherein an atomic ratio of the indium to the element M and the zinc of the oxide film satisfies In:M:Zn=$x_2$:$y_2$:$z_2$,
wherein, in an equilibrium diagram with vertices of the indium, the element M, and the zinc of the oxide film, the atomic ratio is within a range of an area surrounded by line segments that connect first coordinates ($x_2$:$y_2$:$z_2$=8:14:7), second coordinates ($x_2$:$y_2$:$z_2$=2:4:3), third coordinates ($x_2$:$y_2$:$z_2$=2:5:7), fourth coordinates ($x_2$:$y_2$:$z_2$=51:149:300), fifth coordinates ($x_2$:$y_2$:$z_2$=1:4:10), sixth coordinates ($x_2$:$y_2$:$z_2$=1:1:4), seventh coordinates ($x_2$:$y_2$:$z_2$=2:2:1), and the first coordinates in this order, and
wherein the range includes the first coordinates to the seventh coordinates.

6. A display device comprising:
the semiconductor device according to claim 4; and
a display element.

7. An oxide semiconductor film,
wherein the oxide semiconductor film has a plurality of electron diffraction patterns, which are observed in such a manner that a surface over which the oxide semiconductor film is formed is irradiated with an electron beam having a probe diameter whose half-width is 1 nm while a position of the oxide semiconductor film and a position of the electron beam are relatively moved,
wherein the plurality of electron diffraction patterns include 50 or more electron diffraction patterns observed in different areas,
wherein a sum of a percentage of first electron diffraction patterns and a percentage of second electron diffraction diffractions accounts for 100% of the 50 or more electron diffraction patterns,
wherein the first electron diffraction patterns account for 50% or more of the 50 or more electron diffraction patterns,
wherein the first electron diffraction pattern includes observation points that are not symmetry or a plurality of observation points disposed in a circular pattern, and
wherein the second electron diffraction pattern includes observation points corresponding to vertices of a hexagon.

8. The oxide semiconductor film according to claim 7, comprising:
indium, an element M, and zinc,
wherein the element M is at least one of aluminum, gallium, yttrium, and tin,
wherein an atomic ratio of the indium to the element M and the zinc satisfies InM:Zn=x:y:z,
wherein, in an equilibrium diagram with vertices of the indium, the element M, and the zinc, the atomic ratio is within a range of an area surrounded by line segments that connect first coordinates (x:y:z=8:14:7), second coordinates (x:y:z=2:4:3), third coordinates (x:y:z=2:5:7), fourth coordinates (x:y:z=51:149:300), fifth coordinates (x:y:z=46:288:833), sixth coordinates (x:y:z=0:2:11), seventh coordinates (x:y:z=0:0:1), eighth coordinates (x:y:z=1:0:0), and the first coordinates in this order, and wherein the range includes the first coordinates to the sixth coordinates and does not include the seventh coordinates and the eighth coordinates.

9. The oxide semiconductor film according to claim 7, wherein a density of the oxide semiconductor film is 90% or higher of a density of a single crystal oxide semiconductor film having the same atomic ratio as the oxide semiconductor film.

10. A semiconductor device comprising the oxide semiconductor film according to claim 7, comprising:
an oxide film in contact with a top surface of the oxide semiconductor film,
wherein electron affinity of an oxide included in the oxide semiconductor film is larger than electron affinity of an oxide included in the oxide film.

11. A display device comprising:
the semiconductor device according to claim 10; and
a display element.

12. An oxide semiconductor film comprising:
indium, an element M, and zinc,
wherein the element M is at least one of aluminum, gallium, yttrium, and tin,
wherein an atomic ratio of the indium to the element M and the zinc satisfies InM:Zn=x:y:z,
wherein a density of the oxide semiconductor film is 90% or higher of a density of a single crystal oxide semiconductor film having the same atomic ratio,
wherein the oxide semiconductor film has a plurality of electron diffraction patterns, which are observed in such a manner that a surface over which the oxide semiconductor film is formed is irradiated with an electron beam having a probe diameter whose half-width is 1 nm while a position of the oxide semiconductor film and a position of the electron beam are relatively moved,
wherein the plurality of electron diffraction patterns include 50 or more electron diffraction patterns observed in different areas,
wherein a sum of a percentage of first electron diffraction patterns and a percentage of second electron diffraction diffractions accounts for 100% of the 50 or more electron diffraction patterns,
wherein the first electron diffraction patterns account for 50% or more of the 50 or more electron diffraction patterns,
wherein the first electron diffraction pattern includes observation points that are not symmetry or a plurality of observation points disposed in a circular pattern, and
wherein the second electron diffraction pattern includes observation points corresponding to vertices of a hexagon.

13. The oxide semiconductor film according to claim 12,
wherein the oxide semiconductor film is formed by a sputtering method,
wherein a target used in the sputtering method includes indium, an element M, and zinc,
wherein the element M is at least one of aluminum, gallium, yttrium, and tin,
wherein an atomic ratio of the indium to the element M and the zinc included in the target satisfies In:M:Zn=a:b:c,
wherein, in an equilibrium diagram with vertices of the indium, the element M, and the zinc of the target, the atomic ratio is within a range of an area surrounded by line segments that connect first coordinates (a:b:c=8:14:7), second coordinates (a:b:c=2:4:3), third coordinates (a:b:c=1:2:5.1), fourth coordinates (a:b:c=1:0:1.7), fifth coordinates (a:b:c=8:0:1), sixth coordinates (a:b:c=6:2:1), and the first coordinates in this order, and
wherein the range includes the first coordinates to the sixth coordinates.

14. A semiconductor device comprising the oxide semiconductor film according to claim 12, comprising:
an oxide film in contact with a top surface of the oxide semiconductor film,
wherein electron affinity of an oxide included in the oxide semiconductor film is larger than electron affinity of an oxide included in the oxide film.

15. The semiconductor device according to claim 14, comprising:
the oxide film in contact with the oxide semiconductor film,
wherein the oxide film includes indium, an element M, and zinc,
wherein the element M is at least one of aluminum, gallium, yttrium, and tin,
wherein an atomic ratio of the indium to the element M and the zinc of the oxide film satisfies In:M:Zn=$x_2$:$y_2$:$z_2$,
wherein, in an equilibrium diagram with vertices of the indium, the element M, and the zinc of the oxide film, the atomic ratio is within a range of an area surrounded by line segments that connect first coordinates ($x_2$:$y_2$:$z_2$=8:14:7), second coordinates ($x_2$:$y_2$:$z_2$=2:4:3), third coordinates ($x_2$:$y_2$:$z_2$=2:5:7), fourth coordinates ($x_2$:$y_2$:$z_2$=51:149:300), fifth coordinates ($x_2$:$y_2$:$z_2$=1:4:10), sixth coordinates ($x_2$:$y_2$:$z_2$=1:1:4), seventh coordinates ($x_2$:$y_2$:$z_2$=2:2:1), and the first coordinates in this order, and
wherein the range includes the first coordinates to the seventh coordinates.

16. A display device comprising:
the semiconductor device according to claim 14; and
a display element.

* * * * *